United States Patent
Kishimoto et al.

(10) Patent No.: US 7,492,801 B2
(45) Date of Patent: Feb. 17, 2009

(54) SEMICONDUCTOR LASER ELEMENT, MANUFACTURING METHOD THEREOF, OPTICAL DISK APPARATUS AND OPTICAL TRANSMISSION SYSTEM

(75) Inventors: Katsuhiko Kishimoto, Nara (JP); Hidenori Kawanishi, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 373 days.

(21) Appl. No.: 10/983,761

(22) Filed: Nov. 9, 2004

(65) Prior Publication Data

US 2005/0152419 A1 Jul. 14, 2005

(30) Foreign Application Priority Data

| Nov. 11, 2003 | (JP) | ............................. P2003-380688 |
| Nov. 27, 2003 | (JP) | ............................. P2003-397080 |
| Sep. 1, 2004 | (JP) | ............................. P2004-254549 |
| Sep. 1, 2004 | (JP) | ............................. P2004-254556 |

(51) Int. Cl.
*H01S 3/04* (2006.01)

(52) U.S. Cl. ................................................. 372/43.01

(58) Field of Classification Search ............... 372/43.01
See application file for complete search history.

(56) References Cited

U.S. PATENT DOCUMENTS

| 4,615,032 | A |   | 9/1986 | Holbrook et al. |
| 4,792,958 | A | * | 12/1988 | Ohba et al. ............... 372/45.01 |
| 5,233,187 | A | * | 8/1993 | Sakata et al. ........... 250/227.24 |
| 5,783,844 | A | * | 7/1998 | Kobayashi et al. .......... 257/103 |
| 5,889,805 | A | * | 3/1999 | Botez et al. .............. 372/45.01 |
| 5,963,358 | A | * | 10/1999 | Shields ....................... 359/248 |
| 6,067,309 | A | * | 5/2000 | Onomura et al. ......... 372/46.01 |

FOREIGN PATENT DOCUMENTS

| JP | 4-111375 A | 4/1992 |
| JP | 6-69111 B2 | 8/1994 |
| JP | 2001-15851 A | 1/2001 |

OTHER PUBLICATIONS

New Stripe-Geometry Laser With Simplified Fabrication Process, Electronics Letters, Jul. 5, 1979, vol. 15, No. 14, pp. 441-442.
Experimental Verification of Transition From Gain-To Index-Guiding in a Rib-Waveguide AlGaAs Laser, Electronics Letters, Nov. 20, 1986, vol. 22, No. 24, pp. 1290-1291.

* cited by examiner

*Primary Examiner*—Minsun Harvey
*Assistant Examiner*—Patrick Stafford
(74) *Attorney, Agent, or Firm*—Birch, Stewart, Kolasch & Birch, LLP

(57) ABSTRACT

A semiconductor laser element has a lower cladding layer of first conductivity type, an active layer, a first upper cladding layer of second conductivity type, and a second upper cladding layer of second conductivity type, which are stacked in this order on a semiconductor substrate of first conductivity type. The laser element further has a third upper cladding layer of second conductivity type and a contact layer of second conductivity type, which constitute a stripe-shaped ridge structure. A second-conductivity-type doping concentration of the second upper cladding layer is lower than those of the first and third upper cladding layers and is not higher than $1 \times 10^{17}$ cm$^{-3}$. A sum total of layer thicknesses of the first and second upper cladding layers is 0.3-1.5 µm, inclusive. An electrode layer forms an ohmic junction with the contact layer, and a Schottky junction with the second upper cladding layer.

47 Claims, 41 Drawing Sheets

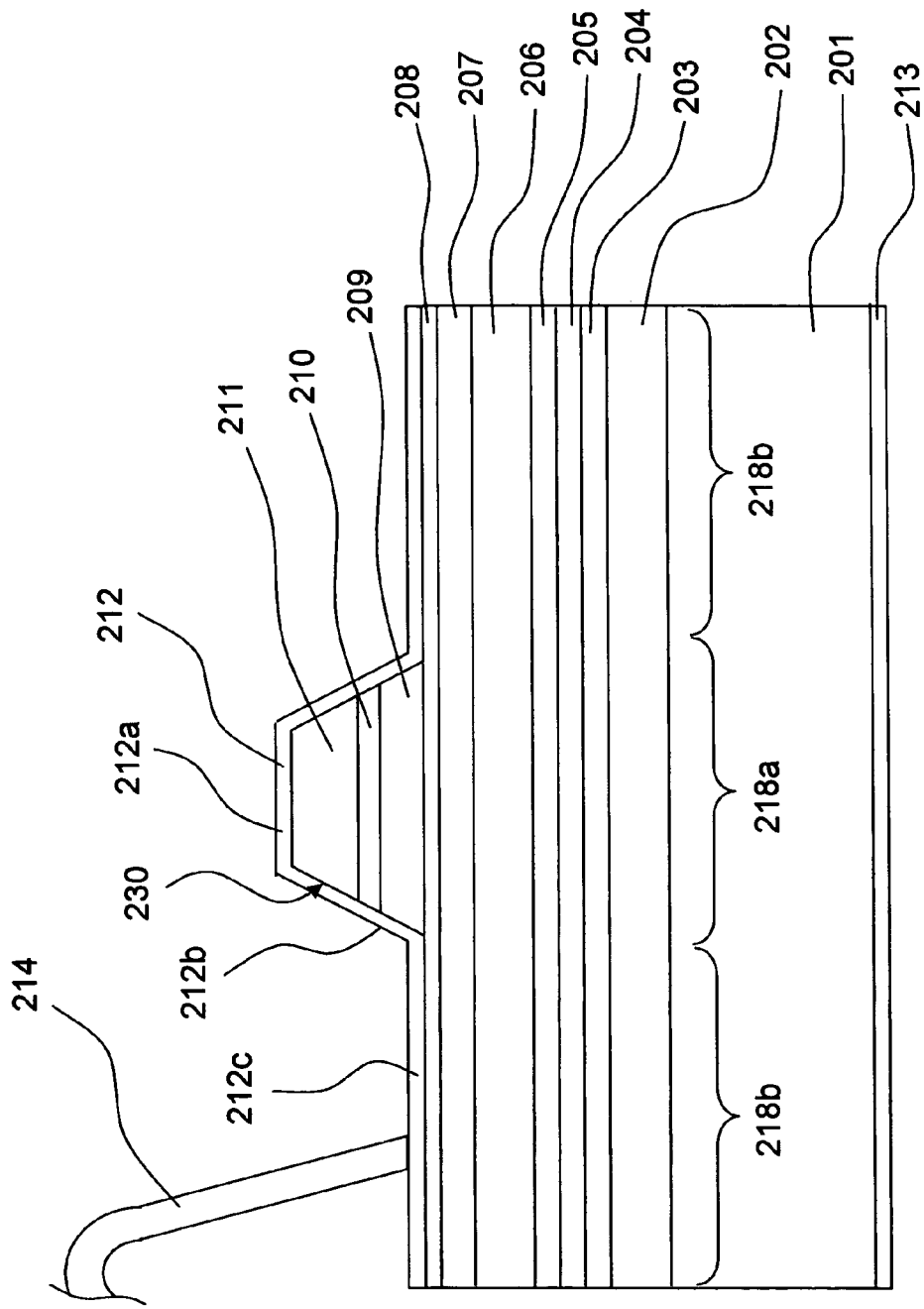

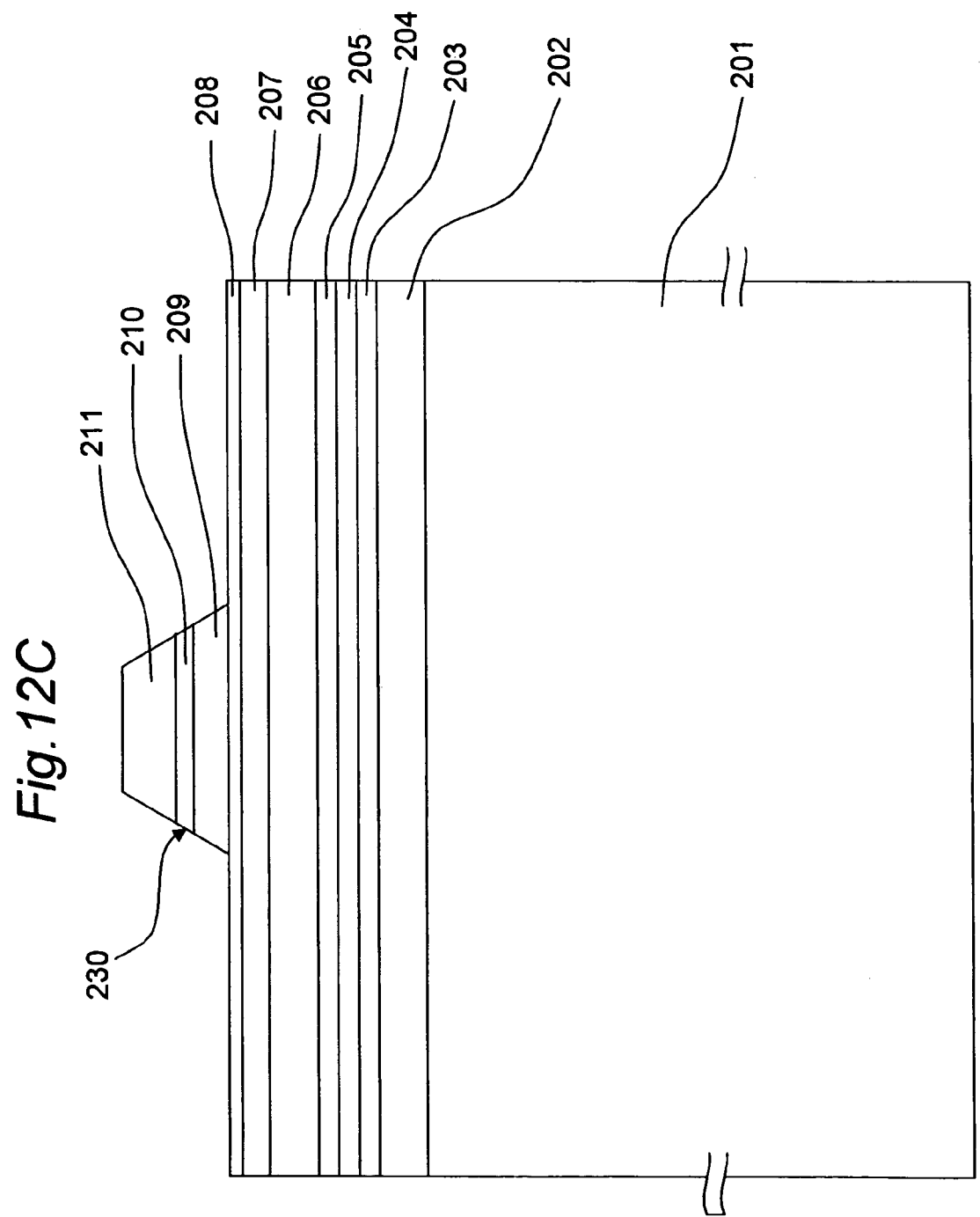

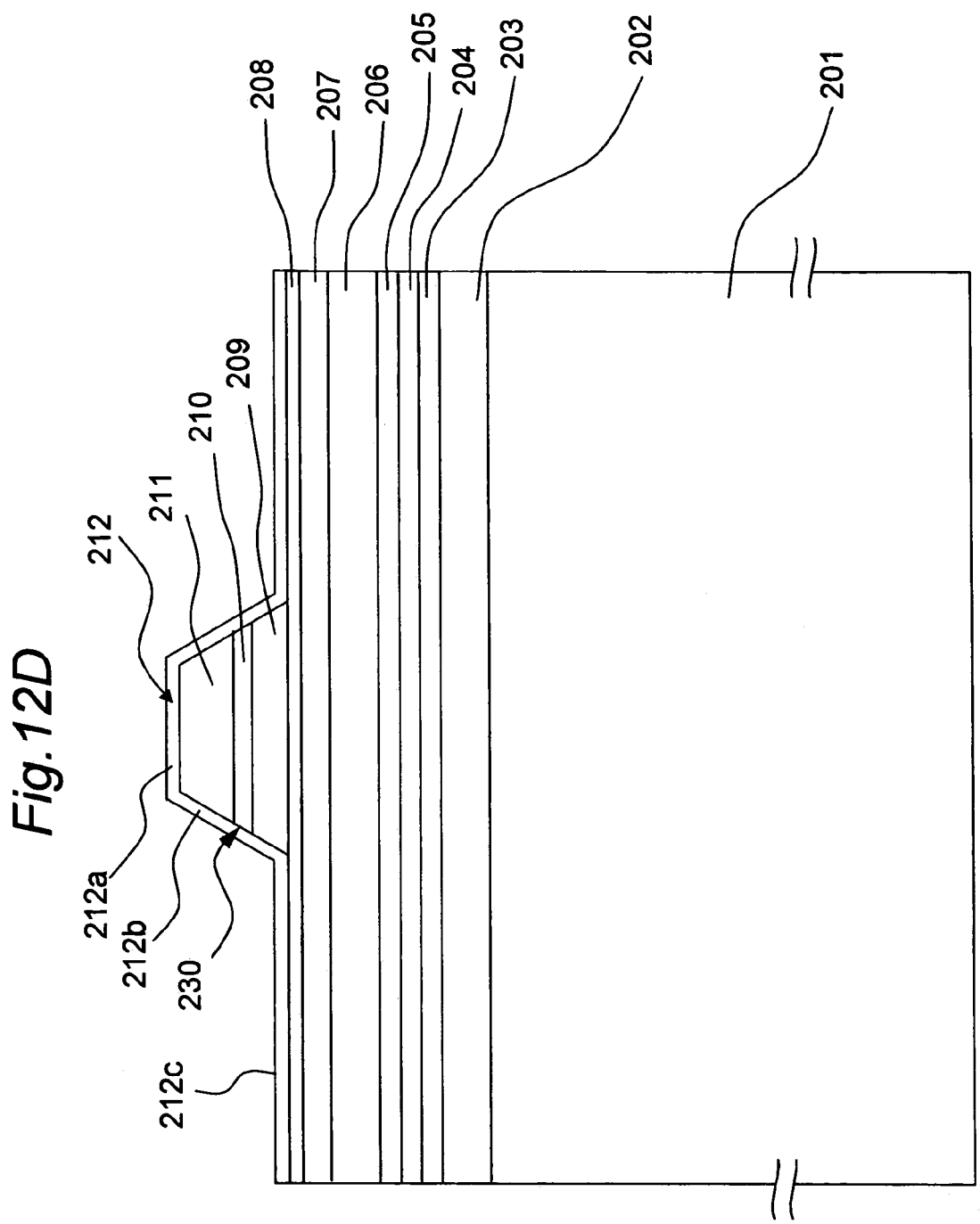

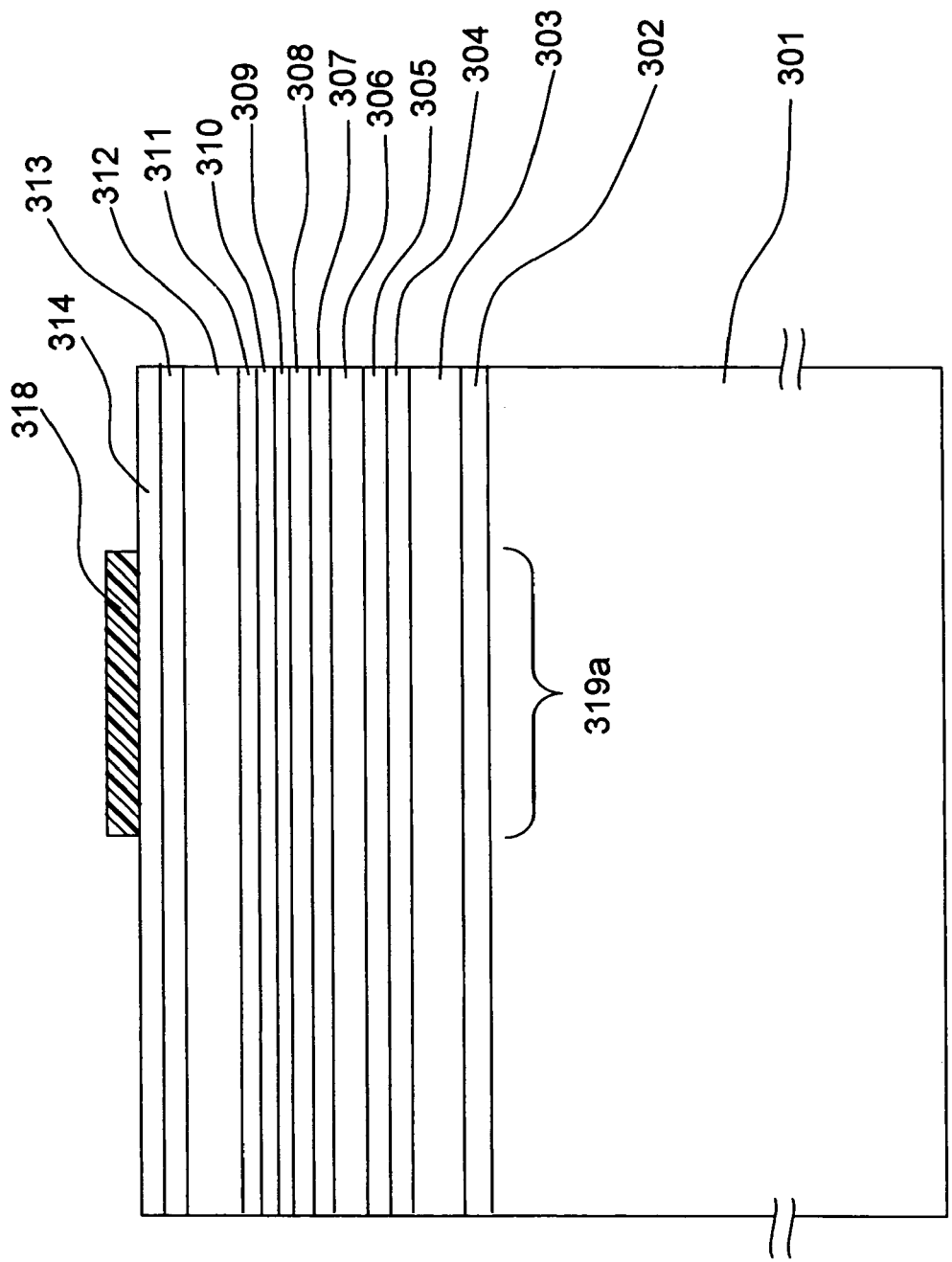

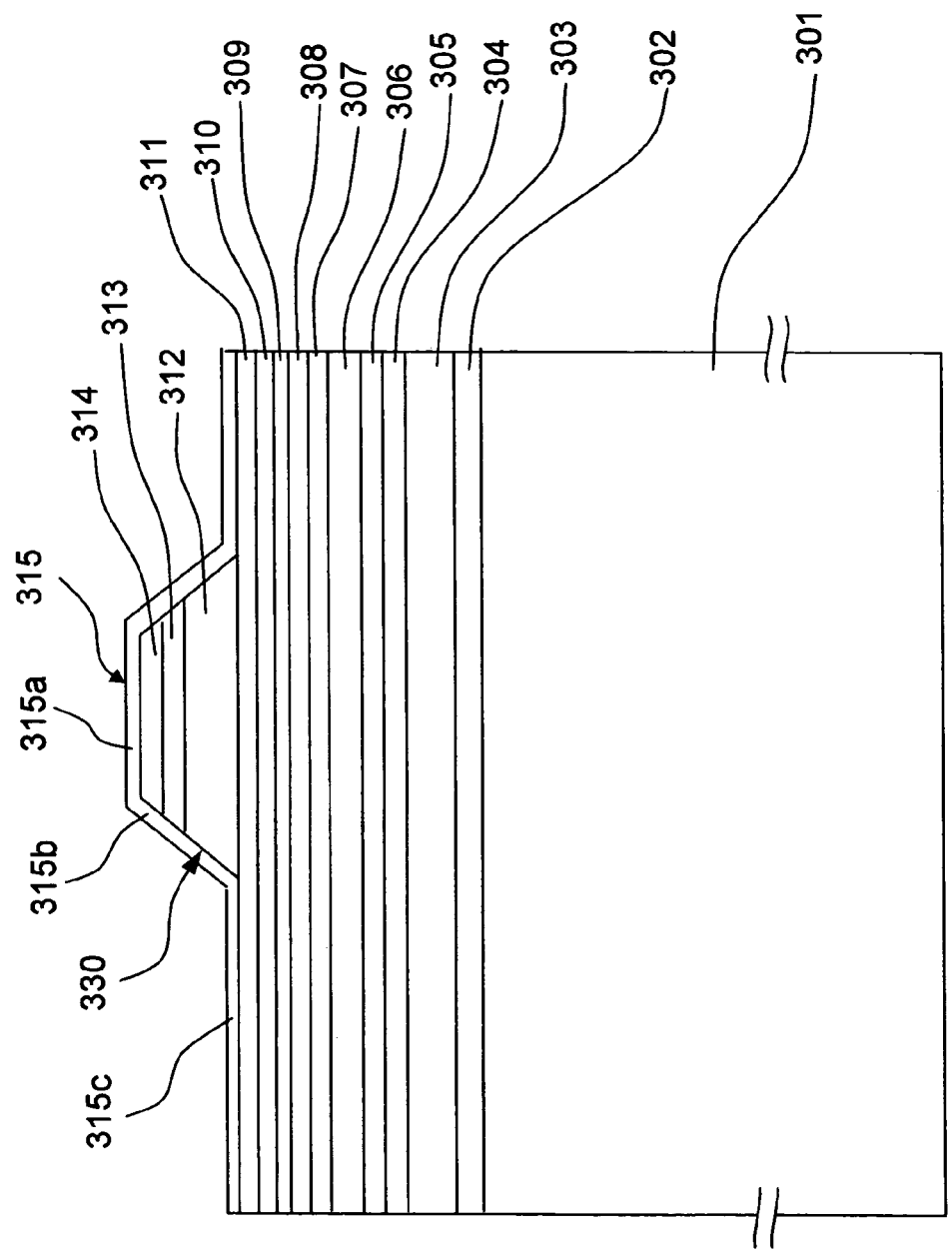

SEMICONDUCTOR LASER ELEMENT, MANUFACTURING METHOD THEREOF, OPTICAL DISK APPARATUS AND OPTICAL TRANSMISSION SYSTEM

This nonprovisional application claims priority under 35 U.S.C. §119(a) on Patent Application Nos. 2003-380688 and 2003-397080 filed in Japan on 11 Nov. 2003 and 27 Nov. 2003, respectively, the entire contents of which are hereby incorporated by reference.

BACKGROUND OF THE INVENTION

1. Field of the Invention

The present invention generally relates to semiconductor laser elements and typically to a semiconductor laser element of a high output power and low power consumption for use in an optical disk apparatus, an optical transmission system or the like, and a manufacturing method thereof.

The present invention also relates to an optical disk apparatus and an optical transmission system having such a semiconductor laser element.

2. Description of the Related Art

Among various semiconductor laser elements, a semiconductor laser element of buried ridge structure is able to reduce the parasitic current that does not contribute to laser oscillation and to separate a crystal regrowth interface from the active layer in the element manufacturing stage because of its own structure and is therefore known as having a structure capable of achieving high temperature operation and transverse mode stability while establishing compatibility between high reliability and low power consumption (low threshold current).

The buried ridge structure, of which the portion to be exposed to the atmosphere during the manufacturing process is located apart from the active region at the time of laser oscillation, is therefore able to restrain excess photoabsorption to a low level and secure reliability.

Moreover, providing a current block layer of a small refractive index outside the ridge portion achieves the optical confinement in the horizontal direction by only current constriction and real refractive indices. Since a so-called real refractive index guide structure does not use the photoabsorption for the optical confinement in the horizontal direction, the waveguide loss at the time of laser oscillation is small, and the power consumption can be restrained to a low level.

In fabricating the buried ridge structure semiconductor laser element, it is a general practice to subject a semiconductor substrate having stacked crystal layers including an active layer to two more crystal (re)growth processes.

However, carrying out two crystal regrowth processes is a very large cost increase factor in forming a semiconductor laser element. Accordingly, there is an idea of simplifying the manufacturing process by providing an electrode that forms a Schottky junction with a cladding layer and an ohmic junction with a contact layer (refer to, for example, JP 04-111375 A).

FIG. 34 shows a cross-sectional structure of a semiconductor laser element described in JP 04-111375 A. This semiconductor laser element is manufactured as follows. First, an n-InGaP cladding layer 702, an InGaAs/GaAs strained quantum well active layer 703, a p-InGaP cladding layer 704 and a p-InGaAs contact layer 705 are successively formed on an n-GaAs substrate 701 by the MOCVD (metal-organic chemical vapor deposition) method. Etching is performed until a middle of the p-InGaP cladding layer 704 is reached by the technique of photolithography or the like to form a ridge portion 708 of a forward mesa shape. Thereafter, Ti/Pt/Au and Au—Ge—Ni/Au are deposited as a p-side electrode 706 and an n-side electrode 707, respectively. As a result, a Schottky junction portion is formed between the p-side electrode 706 and the p-InGaP cladding layer 704, while an ohmic junction portion is formed between the p-side electrode 706 and the p-InGaAs contact layer 705. If a current is applied between the p-side electrode 706 and the n-side electrode 707 of the thus fabricated element, then a current flows through only the ohmic junction portion. In this way, current constriction is effected.

With the above-mentioned structure, the crystal growth process, which has been carried out three times in total in an ordinary buried ridge structure, is allowed to be carried out only once, and the manufacturing process steps can consequently be largely reduced.

However, the semiconductor laser element of JP 04-111375 A, in which the current constriction is effected by using the Schottky junction, has been unable to carry out operation with a low threshold current (e.g., 30 mA or less) and a high output power (e.g., output power exceeding 150 mW) as achieved in the conventional semiconductor laser elements of ordinary buried ridge structure. Moreover, it has been difficult to provide an element design matched to the optical characteristic specifications demanded for various applications. Furthermore, the Schottky junction portion has had poor reliability, and long-term reliability has not been able to be achieved.

Reasons for the failure in achieving the operation of a low threshold current and a high power may include the fact that the current constriction property at the Schottky junction portion was so insufficient that the leakage current particularly in a fine stripe-shaped structure could not be sufficiently reduced.

Moreover, a construction capable of establishing compatibility between a low device resistance and the current constriction property is not disclosed. As a result, the device resistance was increased. This has also been a factor that disturbs the high power operation.

Moreover, in order to secure the current constriction property, it is required to use, for the cladding layer, materials such as InGaP having a great energy discontinuity (barrier) $\Delta Ev$ in the valence band (so as to be lattice matched to GaAs) and AlGaAs having a high Al mole fraction, and there has been little scope for changing the refractive index of the cladding layer. Therefore, the degree of freedom in designing the optical characteristics has been limited. Furthermore, no Schottky junction structure having resistance to breakdown has been disclosed, and so far there have been only structures that lack long-term reliability.

In addition, the semiconductor laser element and the manufacturing method disclosed in JP 04-111375 A has had a problem that the optical characteristics of the laser element are largely influenced by the variation in the layer thickness of the remaining p-InGaP cladding layer after etching, occasionally causing variation in the far-field pattern (FFP) in the horizontal direction and a deterioration in the stability of the transverse mode. Furthermore, due to the variation in the InGaP layer thickness, the characteristic of the Schottky junction formed on that layer may also vary, and this may lead to an insufficient current constriction. Moreover, since the refractive index of the InGaP layer that is a lattice matching condition is uniquely determined, adjustment thereof is only achievable by changing the InGaP film thickness when making an optical design. Thus, the degree of freedom of design is small. There is a further problem that use of InGaP for the p-cladding layer tends to increase $\Delta Ev$, which may result in a limit to the injection efficiency of holes into the active layer.

SUMMARY OF THE INVENTION

Accordingly, an object of the present invention is to provide a semiconductor laser element which is able to operate with a low threshold current and a high power, which has long-term reliability and an abundant degree of freedom in the optical characteristic design, and which can establish compatibility between stable optical characteristics and cost reduction.

Another object of the present invention is to provide a manufacturing method capable of providing such the semiconductor laser element through simplified processes.

Yet another object of the present invention is to provide an optical disk apparatus and an optical transmission system which employ the semiconductor laser element.

In order to accomplish the above object, a semiconductor laser element according to a first aspect of the present invention comprises:

a semiconductor substrate of first conductivity type;

a lower cladding layer of first conductivity type, an active layer, a first upper cladding layer of second conductivity type, and a second upper cladding layer of second conductivity type, which are stacked in this order on the semiconductor substrate;

a third upper cladding layer of second conductivity type and a contact layer of second conductivity type, which are formed directly or via a semiconductor layer of second conductivity type on the second upper cladding layer and constitute a stripe-shaped ridge structure; and an electrode layer, wherein a second-conductivity-type doping concentration of the second upper cladding layer is lower than second-conductivity-type doping concentrations of the first upper cladding layer and the third upper cladding layer and is not higher than $1 \times 10^{17}$ cm$^{-3}$;

a sum total of a layer thickness of the first upper cladding layer and a layer thickness of the second upper cladding layer is 0.3 µm-1.5 µm, inclusive, and the electrode layer forms an ohmic junction with the contact layer, and the electrode layer forms a Schottky junction with at least part of the second upper cladding layer located beside the ridge structure when the electrode layer is directly formed on the second upper cladding layer, and when the electrode layer is formed on the second upper cladding layer via the semiconductor layer of second conductivity type, the electrode layer forms a Schottky junction with at least part of the semiconductor layer of second conductivity type located beside the ridge structure.

The term "first-conductivity-type" herein means one of the n-type conductivity and the p-type conductivity, and the term "second-conductivity-type" means the other of the n-type and p-type conductivities.

The semiconductor laser element of the present invention requires only one-time crystal growth process in the manufacturing stage, similarly to the semiconductor laser element disclosed in JP 04-111375 A. Therefore, the manufacturing process steps are largely reduced in comparison with common semiconductor laser elements with buried ridge structure, so that the semiconductor laser element of the present invention is able to be manufactured at low cost.

According to the present invention, if a current is flowed between the electrode layer and the substrate of the semiconductor laser element, the current is cut off at the Schottky junction beside the ridge structure, and the current flows through only the ohmic junction at the top portion of the ridge structure. As a result, current constriction is effected.

In the semiconductor laser element of the present invention, the second-conductivity-type doping concentration of the second upper cladding layer is lower than the second-conductivity-type doping concentrations of the first upper cladding layer and the third upper cladding layer and is not higher than $1 \times 10^{17}$ cm$^{-3}$. In addition, the sum total of the layer thicknesses of the first upper cladding layer and the second upper cladding layer is not smaller than 0.3 µm but not greater than 1.5 µm. This assures achievement of excellent current constriction and reliability and high power operation with a low power consumption (low threshold current) (which will be described in detail later with data shown). Moreover, since the first and second upper cladding layer portions, which are not processed into the ridge configuration, constitute a two-layer structure of different doping concentrations. Therefore, the degree of freedom in designing the optical characteristics is increased.

It is desirable to provide a further electrode layer on the other surface of the semiconductor substrate opposite from the surface on which the aforementioned layers are formed, so that the further electrode also forms an ohmic junction with the other surface. With this arrangement, electrification is easily achieved between the two electrodes through the active layer, so that laser oscillation is achieved.

In one embodiment, the semiconductor layer of second conductivity type is constructed of a material over which the third upper cladding layer and the contact layer are selectively etchable, the semiconductor layer of second conductivity type has a second-conductivity-type doping concentration lower than second-conductivity-type doping concentrations of the first upper cladding layer and the third upper cladding layer, and the electrode layer forms the Schottky junction with the semiconductor layer of second conductivity type.

In the semiconductor laser element of this embodiment, the semiconductor layer of second conductivity type serves as an etching stopper layer in the step of processing the third upper cladding layer and the contact layer into the ridge configuration in the manufacturing stages. As a result, controllability of the manufacturing process is improved. For example, the sum total of the layer thicknesses of the first upper cladding layer and the second upper cladding layer is accurately set. As a result, there is an effect that the characteristics of the semiconductor laser element is stabilized and the manufacturing yield is improved. Furthermore, because the semiconductor layer of second conductivity type has a second-conductivity-type doping concentration lower than those of the first upper cladding layer and the third upper cladding layer and forms a Schottky junction with the electrode layer, the aforementioned current constriction property will not be impaired.

In one embodiment, a crystalline material that constitutes the substrate comprises GaAs, and crystalline materials that constitute the first upper cladding layer, the second upper cladding layer and the third upper cladding layer, respectively, comprise AlGaAs.

The term "crystalline material" here means a material that constitutes an original crystal excluding the dopant.

The semiconductor laser element of this embodiment comes to have a great degree of freedom in the optical characteristic design and an excellent current constriction property.

In one embodiment, the thickness of the second upper cladding layer is 0.1 µm-0.4 µm, inclusive.

In the semiconductor laser element of this embodiment, the current constriction property can be maximized.

In one embodiment, the second-conductivity-type doping concentration of the second upper cladding layer is $1 \times 10^{16}$ cm$^{-3}$-$1 \times 10^{17}$ cm$^{-3}$, inclusive.

In the semiconductor laser element of this embodiment, the device resistance and the current constriction property are appropriately balanced with each other.

In one embodiment, the thickness of the first upper cladding layer is 0.2 μm-1.1 μm, inclusive.

In the semiconductor laser element of this embodiment, the optical leakage to the electrode layer is restrained, and a device structural design matched to the optical characteristics demanded of the semiconductor laser element becomes possible.

In one embodiment, the second-conductivity-type doping concentration of the first upper cladding layer is not lower than $1\times10^{17}$ cm$^{-3}$.

In the semiconductor laser element of this embodiment, it becomes possible to restrain the increase in the device resistance and reduce the power consumption.

In one embodiment, a crystalline material that constitutes the semiconductor layer of second conductivity type contains P.

In the semiconductor laser element of this embodiment, a satisfactory etching selectivity can be provided between the semiconductor layer of second conductivity type and the second and third upper cladding layers. With this arrangement, the controllability of the manufacturing process is improved, and the yield can be improved.

In one embodiment, a crystalline material that constitutes the semiconductor layer of second conductivity type is $In_{1-x}Ga_xAs_{1-y}P_y$, and its P mole fraction y is $0.4\leq y\leq 0.7$.

In the semiconductor laser element of this embodiment, the injection efficiency of holes is can be improved, and the threshold current can be reduced. Concurrently with this, the semiconductor layer can be used as an etching stopper layer that has an excellent etching selectivity. Furthermore, by providing such InGaAsP semiconductor layer on the lightly doped second upper cladding layer, the occurrence of a level attributed to the oxidation of Al is restrained, and the long-term reliability is improved.

In one embodiment, the crystalline material that constitutes the semiconductor layer of second conductivity type is InGaAsP, which has a thickness of not smaller than 50 Å and a second-conductivity-type doping concentration of $1\times10^{16}$ cm$^{-3}$-$1\times10^{17}$ cm$^{-3}$, inclusive.

In the semiconductor laser element of this embodiment, the semiconductor layer of second conductivity type produces a sufficient function as a surface protection layer by virtue of its thickness, and the etching selectivity to GaAs and AlGaAs is also sufficient. Moreover, because the second-conductivity-type doping concentration is not lower than $1\times10^{16}$ cm$^{-3}$ but not higher than $1\times10^{17}$ cm$^{-3}$, the current constriction can be maximized.

In one embodiment, the semiconductor laser element has stripe-shaped structures on both sides of the ridge structure. Each striped structure has a third upper cladding layer, a contact layer, and a current cutoff layer whose second-conductivity-type doping concentration is not higher than $1\times10^{17}$ cm$^{-3}$, which layers are stacked in this order on the second upper cladding layer. The electrode layer covers the stripe-shaped structure, and the electrode layer forms a Schottky junction with the current cutoff layer of the stripe-shaped structure.

In the semiconductor laser element of this embodiment, setting the doping concentration of the semiconductor layer that is located at the top portion of the stripe-shaped structure and put in contact with the electrode layer to $1\times10^{17}$ cm$^{-3}$ or less makes it possible to achieve a structure capable of cutting off the current at the interface between the electrode layer and the stripe-shaped structure by a continuous crystal growth process and without additionally providing an insulator or the like. As a result, a stripe-shaped structure that provides a satisfactory ohmic junction for the ridge structure of the semiconductor laser element and is also able to effect current constriction by the Schottky junction can be formed at low cost, the stripe-shaped structure also being effective in preventing the damage of the ridge structure during the junction down mounting process.

Furthermore, a semiconductor laser element according to a second aspect of the present invention comprises:

a substrate of first conductivity type, an active layer formed on the substrate of first conductivity type and a stack of semiconductor layers of second conductivity type formed on the active layer, wherein the stack of semiconductor layers of second conductivity type comprises at least a low-concentration semiconductor layer having a doping concentration of not higher than $1\times10^{17}$ cm$^{-3}$ and a high-concentration semiconductor layer having a doping concentration of not lower than $1\times10^{18}$ cm$^{-3}$, an electrode is formed on the stack of semiconductor layers of second conductivity type, a low concentration-side compound layer is formed at an interface between the electrode and the low-concentration semiconductor layer, said low concentration-side compound layer being comprised of at least one of constituent elements of the electrode and at least one of constituent elements of the low-concentration semiconductor layer, and a high concentration-side compound layer is formed at an interface between the electrode and the high-concentration semiconductor layer, said high concentration-side compound layer being comprised of at least one of the constituent elements of the electrode and at least one of constituent elements of the high-concentration semiconductor layer.

According to the semiconductor laser element of the aforementioned construction, a lower contact resistance can be obtained by the high concentration-side compound layer at the ohmic junction between the electrode and the high-concentration semiconductor layer that has a doping concentration of not lower than $1\times10^{18}$ cm$^{-3}$, while a sufficient current constriction property can be obtained by the low concentration-side compound layer at the Schottky junction between the electrode and the low-concentration semiconductor layer that has a doping concentration of not higher than $1\times10^{17}$ cm$^{-3}$. Thus, the ohmic junction property and the Schottky junction property are both reinforced, so that sufficient current constriction and a low contact resistance can be achieved without separately carrying out the crystal regrowth process of the filling layer (current block layer) for effecting the current constriction and the crystal regrowth process of the contact layer for obtaining a low contact resistance, and the thermal and electrical reliability is improved. Accordingly, there can be provided a semiconductor laser element which is capable of performing high power operation with a low threshold current, obtaining long-term reliability, reducing the cost through the simplification of the manufacturing process and achieving reliability and a high power characteristic equivalent or superior to those of the semiconductor laser element that has the conventional structure, with low power consumption.

In one embodiment, at least a semiconductor layer of second conductivity type that has a doping concentration of at least $1\times10^{17}$ cm$^{-3}$ is provided between the low-concentration semiconductor layer and the active layer.

According to the semiconductor laser element of the above-mentioned embodiment, by further forming at least the semiconductor layer of second conductivity type that has a doping concentration of not lower than $1\times10^{17}$ cm$^{-3}$ between the low-concentration semiconductor layer and the active layer, it is possible to freely change the layer thickness, composition and so on of the semiconductor layer of second conductivity type according to the demanded optical characteristic specifications and without limitations imposed in consideration of the Schottky junction characteristic. Therefore, the degree of freedom in the optical design is increased, and the increase in the device resistance can be restrained, so that a further reduction in the power consumption can be achieved.

In one embodiment, the high-concentration semiconductor layer is provided in an uppermost portion of a ridge structure, and the low-concentration semiconductor layer is provided at least in a region other than the uppermost portion of the ridge structure.

According to the semiconductor laser element of the embodiment, the Schottky junction portion for effecting the current constriction and the ohmic junction portion for effecting the current injection can be concurrently formed by using one electrode formed on the high-concentration semiconductor layer and the low-concentration semiconductor layer of the stack of semiconductor layers of second conductivity type. Therefore, a semiconductor laser element capable of largely reducing the manufacturing cost can be provided.

The high-concentration semiconductor layer may be made of GaAs or InGaAs.

The low-concentration semiconductor layer may be made of AlGaAs.

Alternatively, the low-concentration semiconductor layer may contain at least In and P.

For example, the low-concentration semiconductor layer may be made of any one of InGaP, InGaAsP, InGaAlP or InAlAsP.

In this case, selective etching can be used for the ridge formation process, by which the manufacturing process steps are simplified to allow the yield to be improved.

In one embodiment, the low concentration-side compound layer has a thickness of smaller than 0.2 µm.

According to the semiconductor laser element of the embodiment, it is possible to, advantageously, prevent the increase in the resistance of the element which would be caused by the increase in the thickness of the low-concentration semiconductor layer more than necessary, and to reduce the power consumption.

The electrode may consist of a multilayer metal thin film, and a lowermost layer of the multilayer metal thin film may be comprised of a platinum group element or a platinum group element compound or Ti. Note that the term "platinum group element" here is a general term for ruthenium (Ru), rhodium (Rh), palladium (Pd), osmium (Os), iridium (Ir) and platinum (Pt), and the term "platinum group element compound" herein means a compound that contains at least one of Ru, Rh, Pd, Os, Ir and Pt.

According to the semiconductor laser element of the above-mentioned embodiment, the Schottky junction stable to the low-concentration semiconductor layer can be obtained by causing an alloying reaction between the lowermost layer of the electrode and the low-concentration semiconductor layer. Therefore, a semiconductor laser element, which establishes compatibility between a sufficient current constriction property and thermal and electrical reliability, can be provided.

Any one of the semiconductor laser elements according to the first and second aspects of the present invention may have a stripe-shaped structure whose uppermost portion is higher than the uppermost portion of the ridge structure, on each of opposite sides of the ridge structure.

According to the semiconductor laser element of the embodiment, the stripe-shaped structures of which the uppermost portion is higher than the uppermost portion of the ridge structure is formed on both sides of the ridge structure, and each stripe-shaped structure operate as a protective structure to the ridge structure. Therefore, damages of the ridge structure can be prevented, and the yield can be improved. The effect of preventing the damage of the ridge structure or the like is displayed particularly in the latter half of the semiconductor laser element manufacturing process, in handling the semiconductor laser element in the chip state or carrying out a so-called "junction down" mounting in which the ridge structure-side electrode is die-bonded to a stem or a heat sink.

In one embodiment, the low-concentration semiconductor layer is provided in the uppermost portion of the stripe-shaped structure.

According to the semiconductor laser element of the above-mentioned embodiment, by virtue of the arrangement that the second-conductivity-type layer formed at the top portion of the stripe-shaped structure is the low-concentration semiconductor layer that has a doping concentration of not higher than $1\times10^{17}$ cm$^{-3}$, it becomes possible to form a structure capable of cutting off the current at the interface between the electrode and the stripe-shaped structure, through a continuous crystal growth process and without separately providing an insulator or the like.

If InGaP or InGaAsP is used as the low-concentration semiconductor layer provided at the stripe-shaped structure, it becomes possible to effect sufficient current constriction, obviating the need for separately providing an insulator or the like. Furthermore, if InGaP or InGaAsP is used, satisfactory selective etching can be effected on the high-concentration semiconductor layer formed in the uppermost portion of the ridge structure, and the manufacturing process steps are simplified. Therefore, a semiconductor laser element, of which the yield is improved, can be provided.

Moreover, in each semiconductor laser element according to any aspect of the present invention, the stripe-shaped structure may be constructed of a conductor (e.g., gold, an alloy containing gold).

According to the semiconductor laser element, due to the stripe-shaped structure constructed of the conductor, when the junction down mounting is employed, energization of the electrode, provided on the ridge structure, via the stripe-shaped structure can be achieved, and conversely heat generated at the active layer can be efficiently discharged to the outside via the stripe-shaped structure. It is a matter of course that this heat radiating effect is rather increased when the stripe-shaped structure is formed by using a conductor whose thermal conductivity is better than the semiconductor layers. Furthermore, the need for forming an insulator for effecting the current cutoff or a semiconductor layer that has a doping concentration of not higher than $1\times10^{17}$ cm$^{-3}$ on the stripe-shaped structure is obviated. Therefore, it becomes possible to provide a semiconductor laser device of which the manufacturing process steps can be further simplified, the yield is good and the manufacturing cost is low.

In any one of the semiconductor laser devices according to any aspect of the present invention, an insulator may be formed so as to cover the stripe-shaped structure, and part of the electrode may be formed on the insulator.

By virtue of the insulator inserted between the stripe-shaped structure and the electrode, no current flows from the electrode to the active layer via the stripe-shaped structure. Therefore, it becomes possible to provide a semiconductor laser element that has a low threshold current value and causes no excessive leakage current.

A semiconductor laser element manufacturing method according to a further aspect of the present invention comprises the steps of:

forming an active layer on a substrate of first conductivity type;

forming on the active layer a stack of semiconductor layers of second conductivity type that includes at least a low-concentration semiconductor layer having a doping concentration of not higher than $1 \times 10^{17}$ cm$^{-3}$ and a high-concentration semiconductor layer having a doping concentration of not lower than $1 \times 10^{18}$ cm$^{-3}$;

forming an electrode on the stack of semiconductor layers of second conductivity type; and forming a compound layer at an interface between the electrode and the stack of semiconductor layers of second conductivity type by carrying out heat treatment after formation of the electrode.

According to the semiconductor laser element manufacturing method of the present invention, it becomes possible to manufacture a semiconductor laser element that has a sufficient current constriction property and excellent element reliability and is able to perform high power operation with low power consumption through the simplified processes.

In one embodiment, when the lowermost layer of the electrode is made of a platinum group element or a platinum group element compound or Ti, the heat treatment in the step of forming the compound layer is carried out at a temperature of 350° C. to 450° C.

According to the semiconductor laser element manufacturing method of the embodiment, by carrying out heat treatment at 350° C. to 450° C. in the process of forming the compound layer, a Schottky junction excellent in reliability and an ohmic junction of a sufficiently reduced resistance can be obtained. It is to be noted that heat treatment at a temperature of not higher than 350° C. would cause an insufficient alloying reaction, while heat treatment at a temperature of not lower than 450° C. would cause the increase of the contact resistance of the ohmic junction and the deterioration of the Schottky junction.

After the step of forming the stack of semiconductor layers of second conductivity type, the semiconductor laser element manufacturing method of the present invention may further comprise forming a ridge structure that has the high-concentration semiconductor layer in its uppermost portion by processing the stack of semiconductor layers of second conductivity type; and forming on each of opposite sides of the ridge structure a stripe-shaped structure whose uppermost portion is higher than an uppermost portion of the ridge structure.

Also, after the step of forming the stack of semiconductor layers of second conductivity type, the semiconductor laser element manufacturing method of the present invention may comprise forming a second low-concentration semiconductor layer of a doping concentration of not higher than $1 \times 10^{17}$ cm$^{-3}$ on the stack of semiconductor layers of second conductivity type; exposing the high-concentration semiconductor layer by partially removing the second low-concentration semiconductor layer; forming a ridge structure by removing part of a region where the high-concentration semiconductor layer is exposed until the low-concentration semiconductor layer is exposed; and forming an electrode on a stack of semiconductor layers of second conductivity type that includes the second low-concentration semiconductor layer after forming the ridge structure.

If the second low-concentration semiconductor layer is made of InGaP or InGaAsP, wet etching may be carried out using hydrochloric acid or a mixed solution that contains hydrochloric acid in the step of exposing the high-concentration semiconductor layer by partially removing the second low-concentration semiconductor layer.

The wet etching using hydrochloric acid or a mixed solution containing hydrochloric acid would facilitate a selective removal of the second low-concentration semiconductor layer against the high-concentration semiconductor layer that will be located at the top of the ridge structure. This makes it possible to achieve simplified manufacturing process steps and reduced manufacturing variations.

A mixture of hydrochloric acid and hydrofluoric acid ($H_3PO_4$), for example, is suitable for use as a mixed solution containing hydrochloric acid.

The step of forming the stripe-shaped structure may comprise forming, at least in a region on the low-concentration semiconductor layer of the electrode, a stripe-shaped structure made of gold or an alloy containing gold by electroplating using the electrode as a feeding metal.

In this method, because the electrode provided on the ridge structure is used also as a feeding metal in the electroplating process, forming of a dedicated feeding metal and its removal are not needed. This contributes to simplification of the manufacturing process steps and hence to the low manufacturing cost.

Moreover, an optical disk apparatus of the present invention employs any one of the aforementioned semiconductor laser elements.

The optical disk apparatus of the invention will be inexpensive and excellent in reliability and able to execute a high-speed write operation as compared with the conventional optical disk apparatus.

Moreover, an optical transmission system of the present invention employs any one of the aforementioned semiconductor laser elements.

The optical transmission module of the invention can concurrently provide overwhelming inexpensiveness and excellent reliability as compared with the conventional case, and hence facilitates the price reduction.

Other objects, features and advantages of the present invention will be apparent from the following description.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein:

FIG. 11 is a schematic sectional view of a semiconductor laser element according to a fourth embodiment of the present invention, showing a section perpendicular to the stripe direction of the semiconductor laser element;

FIGS. 12A, 12B, 12C and 12D are schematic sectional views for explaining the manufacturing process steps of the semiconductor laser element of the fourth embodiment;

FIGS. 15A, 15B and 15C are schematic sectional views for explaining the manufacturing process steps of the semiconductor laser element of the sixth embodiment;

DETAILED DESCRIPTION OF THE PREFERRED EMBODIMENTS

Figure 1:
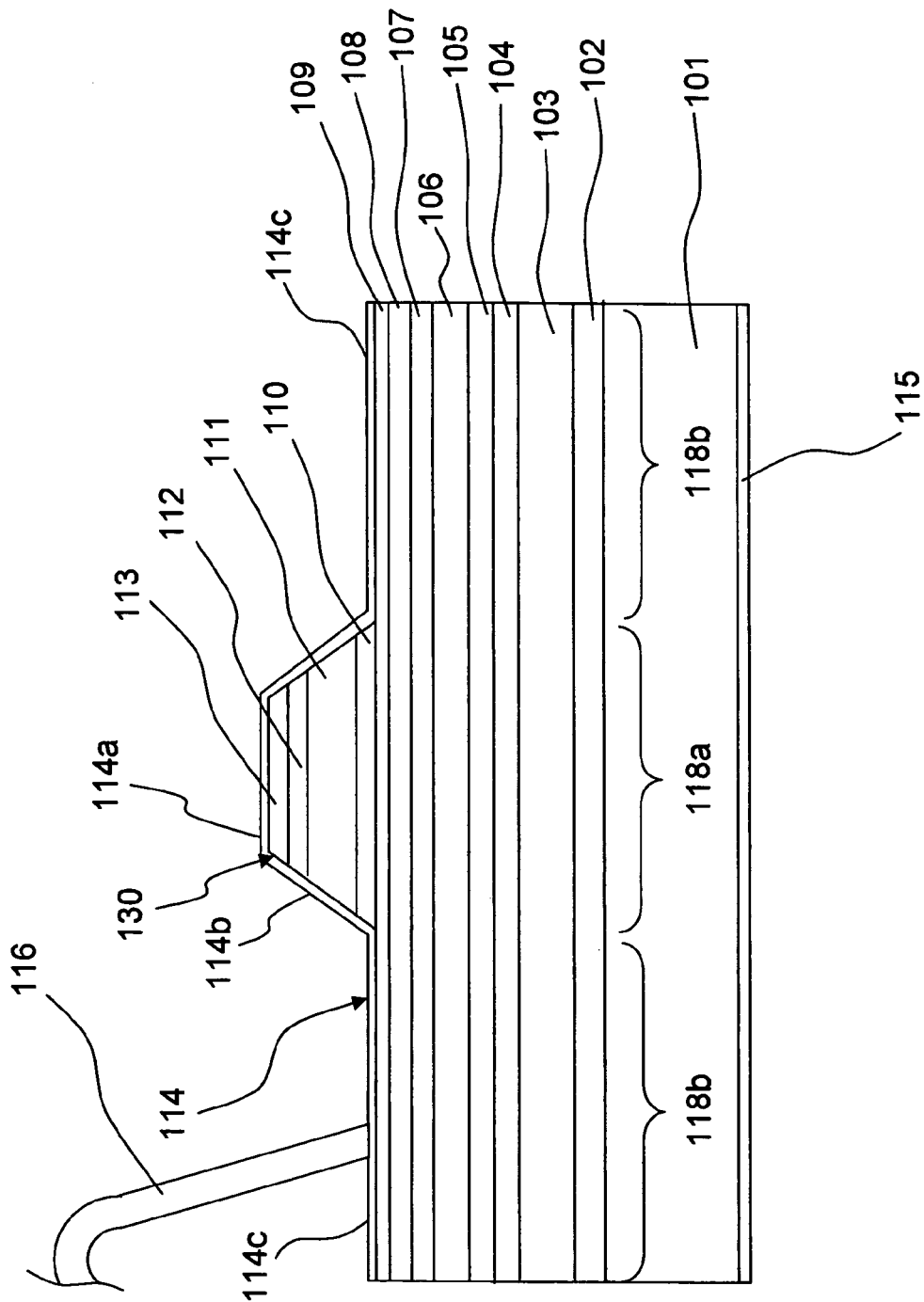
FIG. 1 is a schematic sectional view of a semiconductor laser element according to a first embodiment of the present invention, showing a section perpendicular to the stripe direction of the semiconductor laser element.

The present invention will be described in detail below on the basis of the embodiments shown in the drawings.

In the following description, "n-" represents the n-type as the first-conductivity-type, and "p-" represents the p-type as the second-conductivity-type.

First Embodiment

FIG. 1 shows the structure of a semiconductor laser element for an optical disk (emission wavelength: 780 nm) according to the first embodiment of the present invention.

In this semiconductor laser element, an n-GaAs buffer layer 102, an n-$Al_{0.453}Ga_{0.547}As$ first lower cladding layer 103, an n-$Al_{0.5}Ga_{0.5}As$ second lower cladding layer 104, an $Al_{0.4278}Ga_{0.5722}As$ lower guide layer 105, a multiple strained quantum well active layer 106, an $Al_{0.4278}Ga_{0.5722}As$ upper guide layer 107, a p-$Al_{0.4885}Ga_{0.5115}As$ first upper cladding layer 108 and a p-$Al_{0.4885}Ga_{0.5115}As$ second upper cladding layer 109 are successively stacked in this order on an n-GaAs substrate 101. A p-GaAs etching stopper layer 110, a p-$Al_{0.4885}Ga_{0.5115}As$ third upper cladding layer 111, a p-GaAs contact layer 112 and a p$^+$-GaAs contact layer 113 are provided on the second upper cladding layer 109 so as to form a ridge structure 130 of a forward mesa stripe shape. Further, a p-side electrode 114, which is constructed of a multilayer metal thin film formed by stacking Pt/Ti/Pt/Au in this order, is provided as an electrode layer in a state in which the electrode continuously covers the uppermost portion and the side surface portions of the ridge structure 130 and the upper surface of the second upper cladding layer 109. It is to be noted that reference numerals 114a, 114b and 114c denote portions (occasionally referred to as the "electrode portions") that cover the top portion and the side surface portions of the ridge structure 130 and the upper surface of the second upper cladding layer 109, respectively. The electrode portion 114a and the top portion (contact layer 113) of the ridge structure 130 form an ohmic junction, while the electrode portion 114c and the upper surface of the second upper cladding layer 109 form a Schottky junction. Moreover, an n-side electrode 115, which is constructed of a multilayer metal thin film of AuGe/Ni/Au, is formed as the other electrode layer on the back surface of the substrate 101. Further, an Au wire 116 for electrical connection to an external circuit is bonded to the portion 114c formed on the second cladding layer 109 of the p-side electrode 114.

This semiconductor laser element is fabricated as follows.

Figure 2:
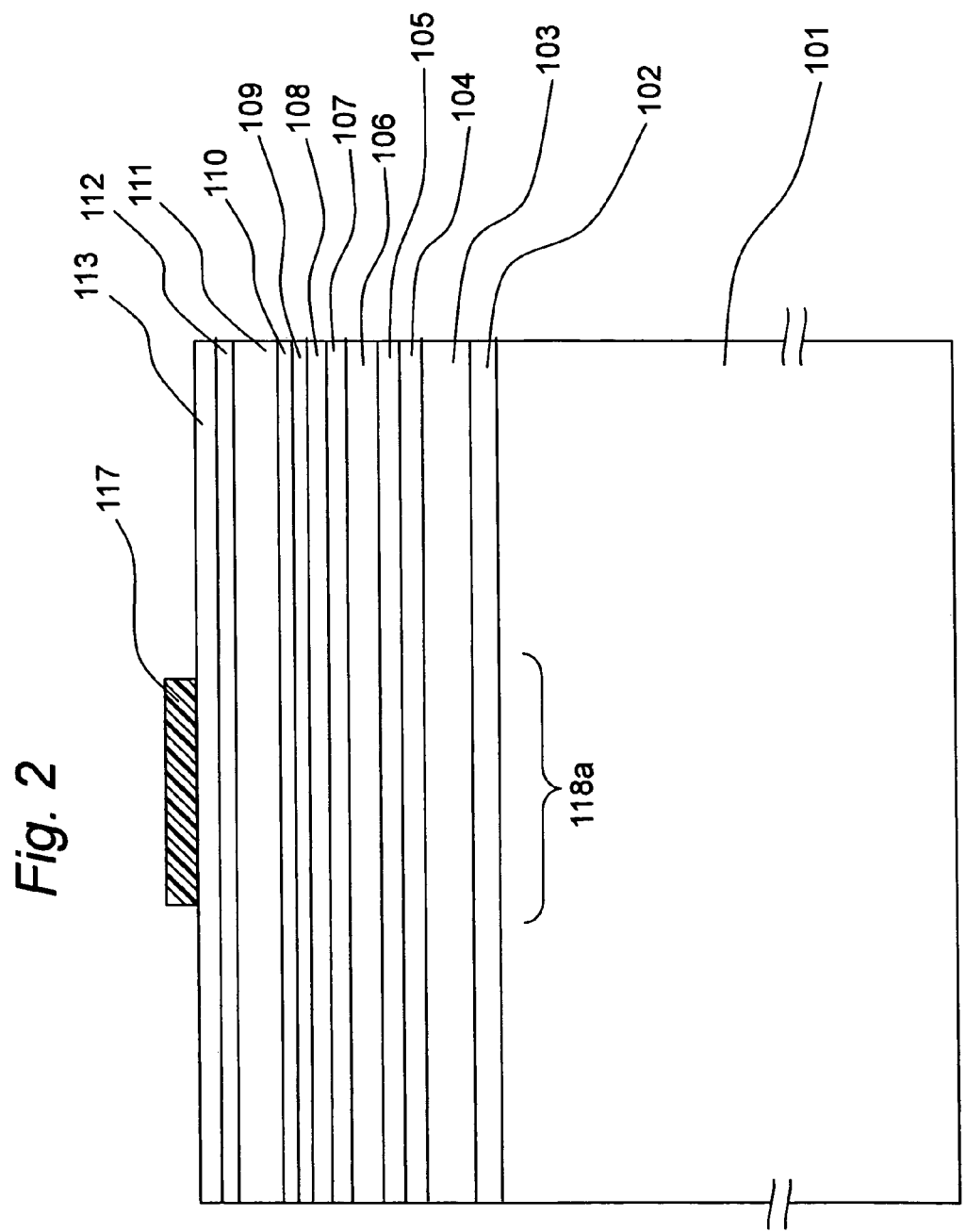
FIGS. 2, 3 and 4 are schematic sectional views for explaining the manufacturing process steps of the semiconductor laser element of the first embodiment.

First, as shown in FIG. 2, an n-GaAs buffer layer 102 (layer thickness: 0.5 µm, Si doping concentration: $8\times10^{17}$ cm$^{-3}$), an n-Al$_{0.453}$Ga$_{0.547}$As first lower cladding layer 103 (layer thickness: 3.0 µm, Si doping concentration: $5\times10^{17}$ cm$^{-3}$), an n-Al$_{0.5}$Ga$_{0.5}$As second lower cladding layer 104 (layer thickness: 0.24 µm, Si doping concentration: $5\times10^{17}$ cm$^{-3}$), an Al$_{0.4278}$Ga$_{0.5722}$As lower guide layer 105 (layer thickness: 0.1 µm), a multiple strained quantum well active layer 106, an Al$_{0.4278}$Ga$_{0.5722}$As upper guide layer 107 (layer thickness: 0.1 µm), a p-Al$_{0.4885}$Ga$_{0.5115}$As first upper cladding layer 108 (layer thickness: 0.2 µm, Zn doping concentration: $1\times10^{18}$ cm$^{-3}$), a p-Al$_{0.4885}$Ga$_{0.5115}$As second upper cladding layer 109 (layer thickness: 0.1 µm, Zn doping concentration: $1\times10^{17}$ cm$^{-3}$), a p-GaAs etching stopper layer 110 (layer thickness: 30 Å, Zn doping concentration: $2\times10^{18}$ cm$^{-3}$), a p-Al$_{0.4885}$Ga$_{0.5115}$As third upper cladding layer 111 (layer thickness: 1.28 µm, Zn doping concentration: $2.7\times10^{18}$ cm$^{3}$), a p-GaAs contact layer 112 (layer thickness: 0.2 µm, Zn doping concentration: $3.3\times10^{18}$ cm$^{-3}$), a p$^+$-GaAs contact layer 113 (layer thickness: 0.3 µm, Zn doping concentration: $1\times10^{21}$ cm$^{-3}$) are successively crystal-grown on the (100) face of an n-GaAs substrate 101 by the MOCVD method (metal-organic chemical vapor deposition method). The multiple strained quantum well active layer 106 is formed by alternately arranging In$_{0.2655}$Ga$_{0.7345}$As$_{0.5914}$P$_{0.4086}$ compressively strained quantum well layers (strain: 0.47%, layer thickness: 50 Å, two layers) and In$_{0.126}$Ga$_{0.874}$As$_{0.4071}$P$_{0.5929}$ barrier layers (strain: −1.2%, three layers of respective layer thicknesses: 90 Å, 50 Å and 90 Å from the substrate side, the layer nearest to the substrate serves as an n-side barrier layer and the layer farthest from the substrate serves as a p-side barrier layer).

Next, as shown in FIG. 2, a resist mask 117 (mask width: 3.5 µm) is produced by a photolithography process on the contact layer 113 in a region 118a (see FIG. 1) where the ridge structure 130 is to be formed. This resist mask 117 is formed so as to extend in a stripe shape in the <0-11> direction in correspondence with the direction in which the ridge structure 130 formed is extended.

Figure 3:
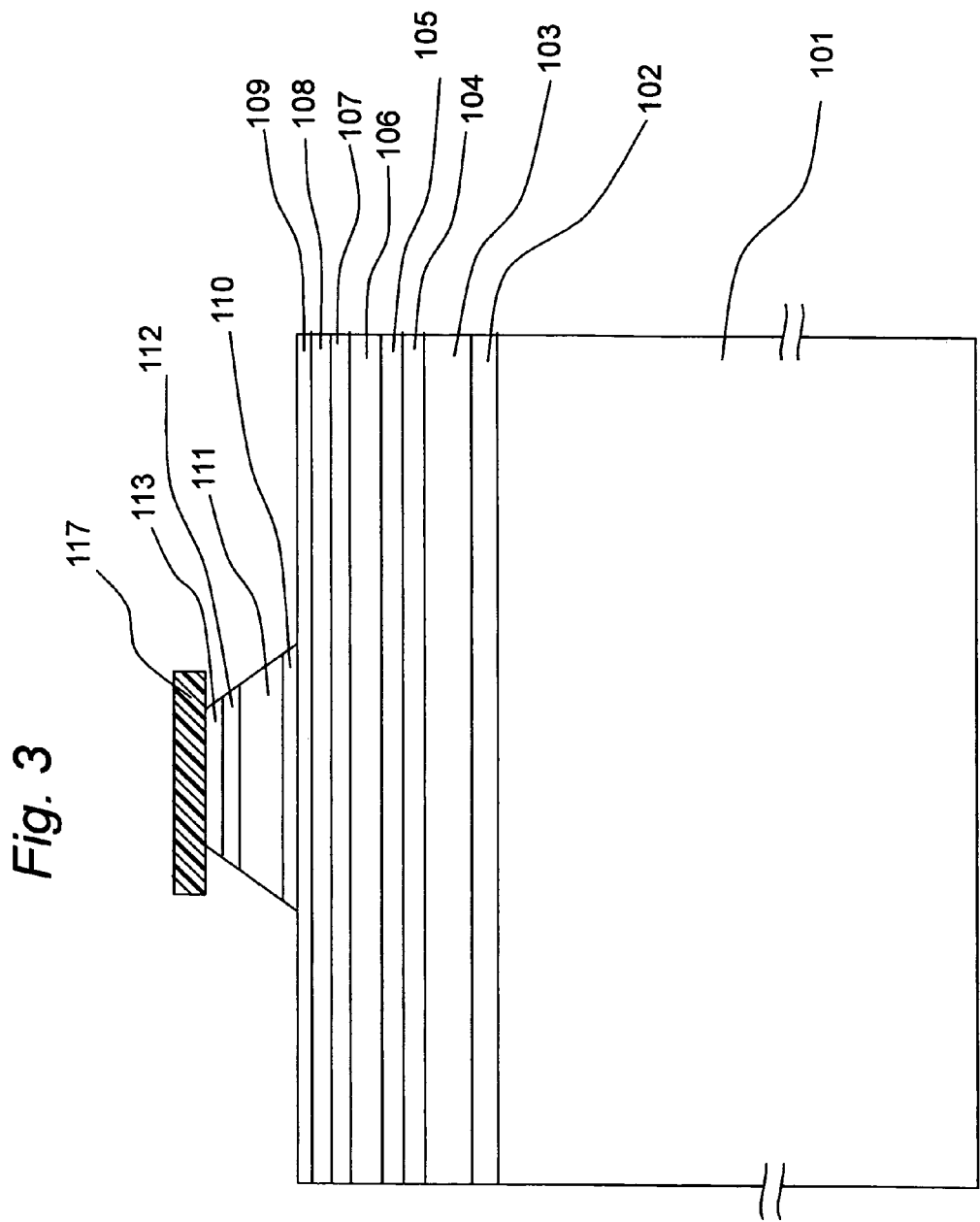

Next, as shown in FIG. 3, portions of the semiconductor layers 113, 112, 111 and 110 on both sides of the resist mask 117 are removed by etching, thereby forming the ridge structure 130 of a forward mesa stripe shape just under the resist mask 117. This etching is carried out in two steps using a mixed aqueous solution of sulfuric acid and a hydrogen peroxide solution, and hydrofluoric acid until a portion just on the etching stopper layer 110 is reached. Taking advantage of the fact that GaAs exhibits a very slow etching rate with hydrofluoric acid, it is made possible to flatten the etched surface and control the mesa stripe width. Finally, the overhang portions of the GaAs contact layers 112 and 113 are removed while the p-GaAs etching stopper layer 110 is also removed with a mixed aqueous solution of ammonia and a hydrogen peroxide solution. The etching depth is 1.78 µm, and the width of the lowermost portion of the ridge structure 130 is about 3.2 µm. After the etching ends, the resist mask 117 is removed.

Figure 4:
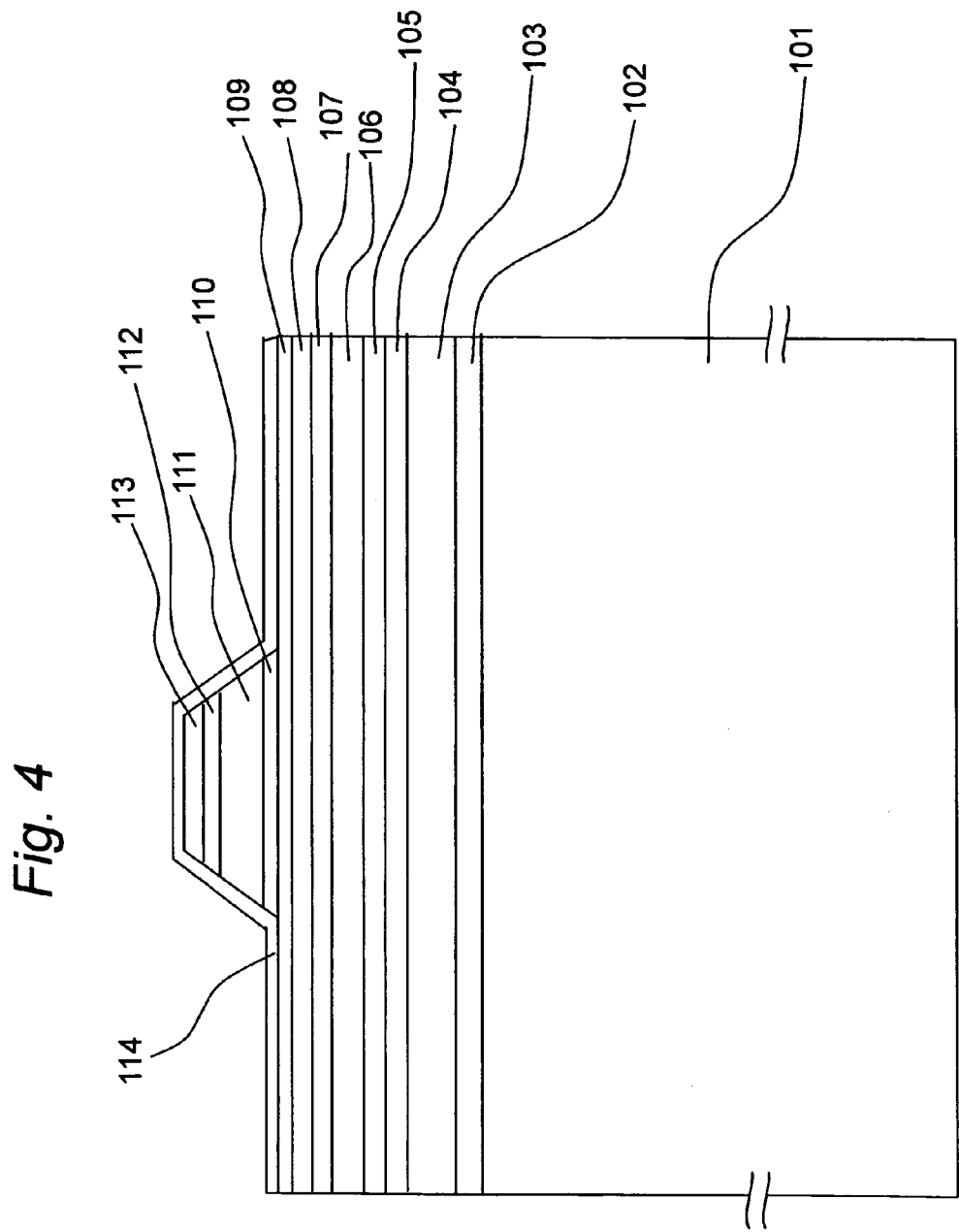

Subsequently, as shown in FIG. 4, a multi-layer metal thin film is formed by stacking layers of Pt (layer thickness: 200 Å)/Ti (layer thickness: 500 Å)/Pt (layer thickness: 500 Å)/Au (layer thickness: 4000 Å) in this order as the p-side electrode 114 by using the electron beam evaporation technique.

Subsequently, as shown in FIG. 1, the substrate 101 is ground at the back surface side to a desired thickness (about 100 µm in this case) by lapping. Then, layers of an AuGe alloy (alloy of 88% of Au and 12% of Ge, layer thickness: 1000 Å), Ni (layer thickness: 150 Å) and Au (layer thickness: 3000 Å) are stacked on the back surface as the n-side electrode 115 by using the resistive heating deposition method. Subsequently, heating is carried out at 390° C. for one minute in an N$_2$ atmosphere to subject the materials of both the p-side electrode 114 and the n-side electrode 115 to an alloying process. The thus obtained wafer is divided into a plurality of bars having a desired cavity length (800 µm in this case), and thereafter, the bars are subjected to end surface coating and then further divided into chips (800 µm×250 µm). The chips obtained after the division are stuck onto a stem (not shown) by using an In paste. Then, an Au wire 116 for electrical connection to an external circuit is bonded onto a portion (in a region 118b beside the ridge structure 130) of the p-side electrode 114 that is in contact with the second upper cladding layer 109. The semiconductor laser element is now completed. It is noted that the "external circuit" means a circuit existing outside the semiconductor laser element, such as, for example, a power circuit for supplying a current to this semiconductor laser element.

When applying a current between the p-side electrode 114 and the n-side electrode 115 of the thus-fabricated semiconductor laser element, the current is cut off at the Schottky junctions beside the ridge structure 130, and the current flows through only the ohmic junction at the top portion of the ridge structure 130. As a result, current constriction is effected.

Figure 5:
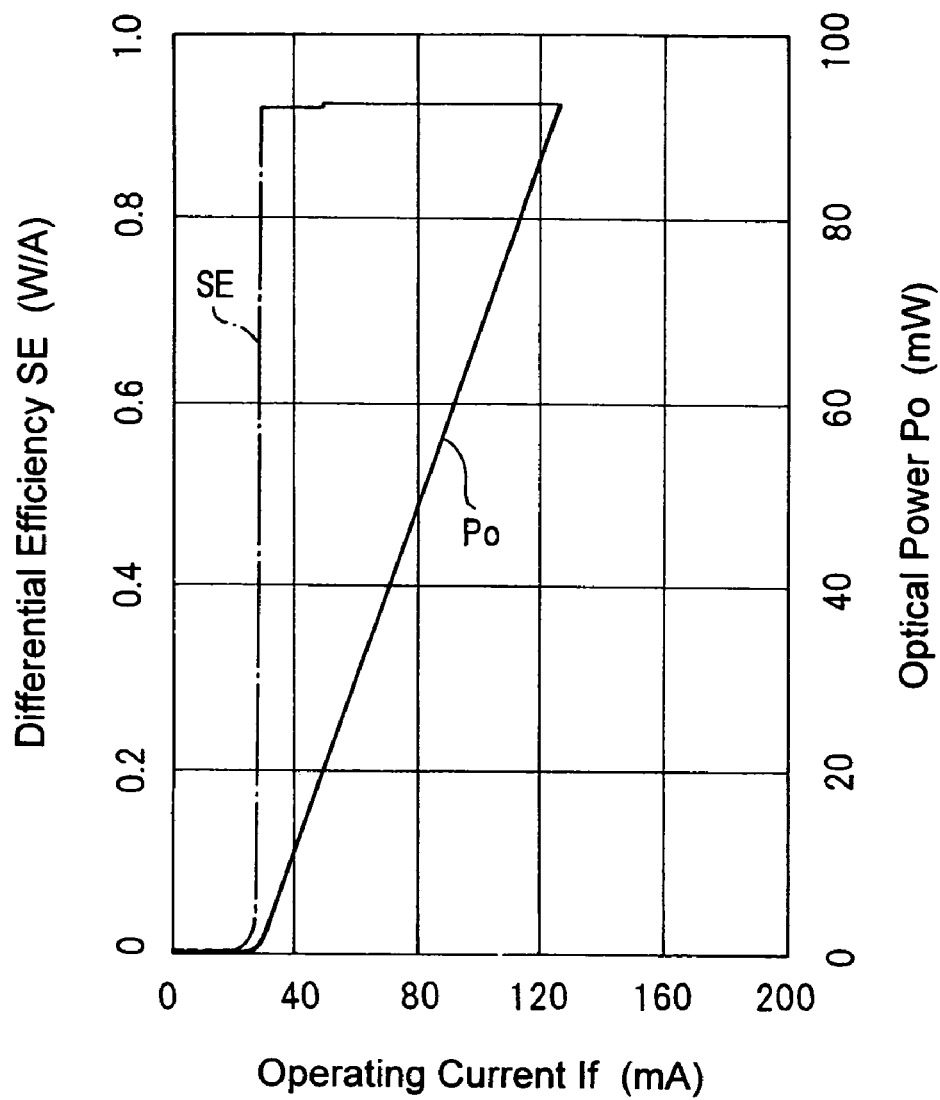
FIG. 5 is a graph showing the current-to-optical power characteristic of the above semiconductor laser element.

FIG. 5 shows the current-to-optical power characteristic of the thus-fabricated semiconductor laser element (emission wavelength: 780 nm) for optical disks. In the present laser element, a laser oscillation threshold current Ith was 27.3 mA, a differential efficiency SE was 0.93 W/A and an operating current at an optical power of 80 mW was 112 mA (when the ambient temperature was 25° C.). These values had not been achieved by conventional semiconductor lasers using the Schottky junctions for the current constriction, and also bear comparison with those of the semiconductor laser element with buried ridge structure that requires totally three crystal growth processes. Moreover, with regard to the optical characteristics, a kink-free arrangement was achieved at a vertical radiation angle of 17.5 degrees and a transverse radiation angle of nine degrees. Furthermore, stable operation for the duration of not shorter than 3000 hours was confirmed by a reliability test with a 260-mW pulse at 70° C.

In the prior art example, the upper cladding layer located just under the Schottky junction consists of one layer that has a uniform doping concentration. In contrast to this, in the semiconductor laser element of this first embodiment, a difference in the doping concentration was provided in the upper cladding layer, and in the regions corresponding to the sides of the ridge structure 130 there was provided a two-layer structure of the lightly doped second upper cladding layer 109 for forming a Schottky junction and the heavily doped first upper cladding layer 108 arranged just under the layer 109, namely on the active layer 106 side of the layer 109. With this arrangement, the current constriction property at the Schottky junction portion was remarkably improved, and an increase in the device resistance more than necessary was suppressed.

Figure 6:
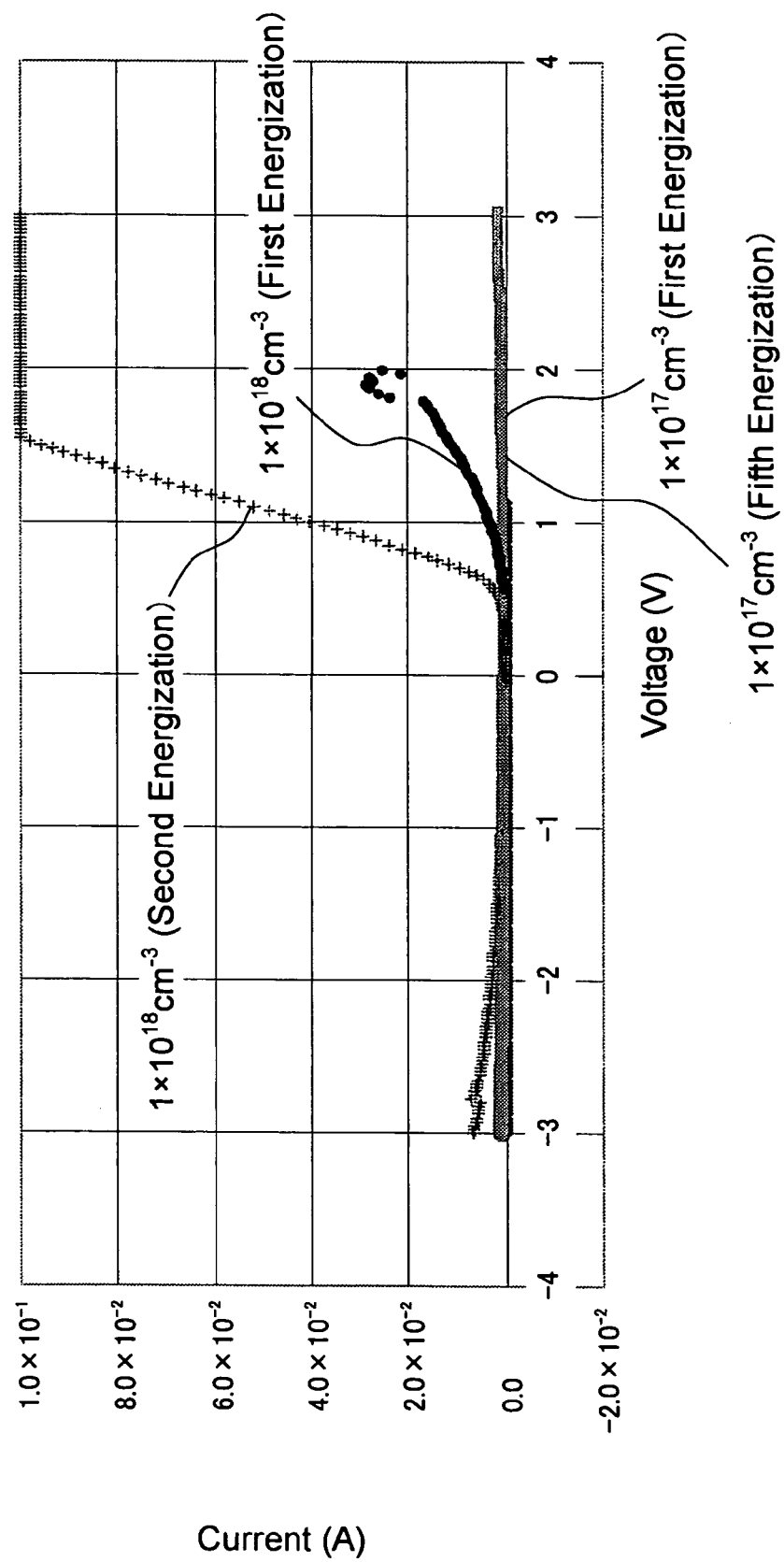
FIG. 6 is a graph showing a current constriction property and energization stability depending on the doping concentration of an upper cladding layer located just under a Schottky junction.

The above construction was drawn from the following studies conducted by the inventors. That is, as a result of the inventor's study, it was discovered that the upper cladding layer for forming the Schottky junction should preferably have an Al mole fraction of not smaller than 0.4 but not greater than 0.55 in terms of tradeoff between the convenience of the optical characteristic design (refractive index) and the current constriction property. Moreover, it was also discovered that the current constriction property was rapidly improved and stability during energization was also improved when the doping concentration became equal to or smaller than about $1 \times 10^{17}$ cm$^{-3}$. FIG. 6 shows a graph of comparison regarding the current constriction property and the energization stability between when the upper cladding layer located just under the Schottky junction is fabricated with doping concentration of $1 \times 10^{17}$ cm$^{-3}$ and when that upper cladding layer located is fabricated with a doping concentration of $1 \times 10^{18}$ cm$^{-3}$. In the semiconductor laser element of this first embodiment, the voltage in the oscillating operation stage was about +2 V (2.17 V in this example), and the leakage current at the time was about $2 \times 10^{-4}$ A, in the case of the upper cladding layer of the doping concentration of $1 \times 10^{17}$ cm$^{-3}$, as is apparent from FIG. 6. And, there was almost no change in the leakage current value even after the laser element was energized, or turned on a plurality of times (five times in this example). On the other hand, with the upper cladding layer having the doping concentration of $1 \times 10^{18}$ cm$^{-3}$, the initial leakage current value at +2 V (at the first energization) was about 100 times that of the case of doping at the concentration in the order of $10^{17}$ cm$^{-3}$, and the leakage current value was disadvantageously further increased tenfold or more when the energization was repeated (the second energization). As is understood from the above, the doping concentration of the upper cladding layer should desirably be not higher than $1 \times 10^{17}$ cm$^3$. However, if the entire upper cladding layer is lightly doped at a concentration of not higher than $1 \times 10^{17}$ cm$^{-3}$ when the Al mole fraction of the upper cladding layer is about 0.4 to 0.55, then the resistance of the upper cladding layer increases and the characteristics of the laser element disadvantageously deteriorates. As a result of further study, it was found that, if the doping concentration of the upper cladding layer was set to $1 \times 10^{17}$ cm$^{-3}$ or less at a portion where the Schottky junction is formed (i.e., the second upper cladding layer 109) and if the film thickness of the doped region at the above concentration was set to 0.1 µm-0.4 µm, inclusive, the current constriction property was maintained even though the doping concentration of the remaining region (i.e., the first upper cladding layer 108) located on the active layer 106 side of the upper cladding layer was increased to about $1 \times 10^{18}$ cm$^{-3}$. Conversely, if the thickness of the second upper cladding layer of the doping concentration of not higher than $1 \times 10^{17}$ cm$^{-3}$ is increased to more than a maximum of 0.4 µm, the increase of the device resistance becomes measurable and cannot be ignored. Thus, by setting the doping concentration at the Schottky junction forming side (second upper cladding layer 109) of the upper cladding layer to $1 \times 10^{17}$ cm$^{-3}$ or less and setting its layer thickness to 0.1 µm-0.4 µm inclusive, there were no limitations on the selection of materials for a portion on the active layer 106 side (first upper cladding layer 108) of the layer in question (the second upper cladding layer 109) and a portion on the contact layer side (the etching stopper layer 110 and the third upper cladding layer 111) of the same layer (the second upper cladding layer 109), and the degree of freedom in the optical design was largely increased. Furthermore, the increase in the device resistance more than necessary was suppressed, and the deterioration in the device characteristics was prevented. It is to be noted that the sum total of the layer thicknesses of the first upper cladding layer 108 and the second upper cladding layer 109 is required to be 0.3 µm or larger because of the constraints on the optical design including the prevention of optical leakage to the p-side electrode side. With a lesser total layer thickness, light cannot sufficiently be confined in the active layer. Moreover, it is sufficient for the sum total of the layer thicknesses of the first upper cladding layer 108 and the second upper cladding layer 109 to be max. 1.5 µm, and the total thickness should more preferably be not greater than 1.0 µm. If the total layer thickness is greater than this, the effect of reducing the device resistance due to the increased doping concentration of the first upper cladding layer 108 is reduced, causing deterioration in the device characteristics.

For the applications with optical disks that require a high power characteristic, the currents and the voltages tend to be large during operation, and this leads to a severer state in terms of reliability. Accordingly, it is preferable to set the Al mole fraction of the second upper cladding layer 109 to 0.45 or higher in order to improve the current constriction property for reduction of the currents and voltages during operation. This corresponds to the improvement of the current constriction property by increasing the energy discontinuity ΔEv in the valence band by increasing the Al mole fraction. However, since deterioration attributed to the oxidation of Al tends to easily occur when the Al mole fraction is too great, it is better to set the upper limit of the Al mole fraction to 0.5. Moreover, in order to similarly improve the current constriction property, the doping concentration of the second upper cladding layer 109 may be lowered to about $1 \times 10^{16}$ cm$^{-3}$. If the concentration is made lower than this, the resistance of the lightly doped region becomes very high, and heat generation during operation ascribed to it exerts an adverse influence on the reliability. Moreover, it was also discovered that the thickness of the second upper cladding layer 109 was sufficient if it was about 0.4 µm at maximum as described above and that a greater thickness had no effect on the improvement in the current constriction property.

Furthermore, the first embodiment was successful in providing a stable Schottky junction by employing a Pt layer as the lowermost layer of the p-side electrode 114. By employing the Pt layer, the Schottky junction with an active AlGaAs surface became stabilized, and the abrupt breakdown (destruction of the Schottky barrier) during operation was restrained. It is known that a Pt film formed on a semiconductor is thermally diffused to a depth about double the film thickness by heat treatment at a temperature of about 400° C. In this first embodiment, Pt was deposited to a thickness such that the second upper cladding layer 109 is not penetrated even when a heat treatment at the above-mentioned temperature is performed. Thereafter, an alloying process (heat treatment) was carried out upon the Pt film as well as upon the AuGe/Ni electrode on the back surface side on the same time. The thickness of the Pt lowermost layer should preferably be not smaller than 30 Å from the viewpoint of stably forming the Schottky junction and from the viewpoint of secure diffusion through the etching stopper layer 110 to the second upper cladding layer 109 when the etching stopper layer 110 is not removed, as will be described later. Also, the thickness of the Pt lowermost layer should preferably be not greater than 400 Å from the viewpoint of preventing the penetration of Pt atoms through the second upper cladding layer 109 even when the aforementioned heat treatment is carried out.

The advantage of employing the Pt layer as the lowermost layer is remarkable particularly in improving the reliability during high power operation. On the Pt lowermost layer, a well-known combination of Ti/Pt/Au was placed to constitute the p-side electrode 114. The p-side electrode 114 and the n-side electrode 115 obtained after the alloying process had very good contact resistances of $5 \times 10^{-7}$ Ωcm$^2$ and $1 \times 10^{-7}$ Ωcm$^2$, respectively, according to the TLM (Transmission Line Modeling) evaluation.

Moreover, in this first embodiment, the etching stopper layer 110 made of GaAs on the second upper cladding layer 109 is removed by etching before the deposition of the p-side electrode 114. However, when the Schottky junction using the diffusion of Pt is utilized, the etching stopper layer 110 is not always required to be removed. In the latter case, in consideration of the film thickness of the etching stopper layer 110, the layer thickness of the Pt deposited is set to a value such that Pt atoms diffuse through the etching stopper layer 110 and reach the second upper cladding layer 109. That is, the layer thickness of Pt is set to a value of not smaller than at least half of the layer thickness of the etching stopper layer 110. In this case, it is better to set the doping concentration of the GaAs etching stopper layer 110 to a value of not higher than about $1\times10^{17}$ cm$^{-3}$. However, in this first embodiment, the overhangs of the contact layers 112 and 113 made of GaAs are concurrently removed in the process of removing the GaAs etching stopper layer 110, and the p-side electrode 114 is formed so as to cover the ridge structure 130 of the forward mesa stripe structure free from overhangs. Therefore, the portions 114a, 114b and 114c of the p-side electrode 114 can be continuously formed without forming the electrode to an extremely great film thickness or adding any filling process for canceling the difference in level. That is, the first embodiment eliminates the occurrence of discontinuity of the electrode material due to a stepped portion between the electrode portion 114a that constitutes the ohmic junction with the top portion of the ridge structure 130 and the electrode portions 114c that form the Schottky junctions with the upper surfaces of the second upper cladding layer 109. As a result, it became possible to provide wire bonding only on the electrode portion 114c that forms the Schottky junction, avoiding the portion just on the stripe, and without separately taking measures for preventing the discontinuity of the electrode material, which measures would be necessary when the ridge has a stepped portion, or hang. Using the forward mesa stripe structure as in this first embodiment is effective and advantageous in that the consumption of the metal material for deposition can be reduced since a defect due to the discontinuity of the deposited material is prevented even though the electrode is formed not to a large film thickness, but to a film thickness as small as not greater than about 0.5 μm in total. Moreover, in the construction of this first embodiment, the active layer 106 is located near the ridge structure 130 of the stripe configuration and the stripe width is small. Therefore, it is difficult to bond a wire onto the electrode portion 114a that constitutes the ohmic junction. However, by carrying out the bonding onto the electrode portion 114c that forms the Schottky junction, the electrical connection to the external circuit was made possible. Furthermore, it was found that the current constriction property is maintained against heat during the wire bonding process and an impact due to ultrasonic waves with the construction of the second upper cladding layer 109 as in this first embodiment. It is to be noted that sufficient current constriction can also be obtained if an insulator constructed of an SiN$_x$ film or the like is inserted just under the electrode portion 114c (at an interface between this electrode portion and the semiconductor layer). However, such arrangement would invite an increase in the number of manufacturing process steps with the result of a cost increase, and the electrode may be peeled off during the wire bonding step since the adhesion between the insulator and the electrode material is not good. In contrast, the construction of this first embodiment enables sufficient current constriction without forming an insulator, and the electrode peel-off or detachment attributed to the provision of an insulator will not take place. Therefore, a semiconductor laser element, which can be manufactured at lower cost with high yield, is provided.

As in this first embodiment, if the thickness of the first upper cladding layer 108 is set to 0.2 μm, the thickness of the second upper cladding layer 109 is set to 0.1 μm, the doping concentration of the first upper cladding layer 108 is set to $1\times10^{18}$ cm$^{-3}$, the doping concentration of the second upper cladding layer is set to $1\times10^{17}$ cm$^{-3}$, the thickness of the third upper cladding layer 111 is set to 1.28 μm and its stripe width is set to 3.2 μm, then the optical leakage to the p-side electrode 114, i.e., a loss due to photoabsorption at the p-side electrode 114 is reduced to an ignorable level. Therefore, as shown in FIG. 5, a satisfactory differential efficiency SE has been achieved. The optical leakage to the p-side electrode 114 can be restrained to a larger extent as the sum total of the layer thickness (occasionally referred to as a "total layer thickness") of the first upper cladding layer 108 and the second upper cladding layer 109 becomes greater. However, it was discovered as the result of examinations that a level of the optical leakage raising practically no problem could be achieved if the thickness was at least 0.3 μm, as described above. If the total layer thickness of the first upper cladding layer 108 and the second upper cladding layer 109 is increased, the spread of the injected current will naturally become unignorable in the absence of any measures against that. Reducing the doping concentration of the second upper cladding layer 109 as in this first embodiment restrains the spread of the current in the second upper cladding layer 109. Also, setting the doping concentration of the first upper cladding layer 108 to $1\times10^{17}$ cm$^{-3}$ or more, and preferably, to $5\times10^{17}$ cm$^{-3}$ or more prevents the increase in the device resistance more than necessary. As a result, the oscillation threshold current was maintained low even when the total layer thickness of the first upper cladding layer 108 and the second upper cladding layer 109 was made thicker than that of the prior art example.

Figure 7A:
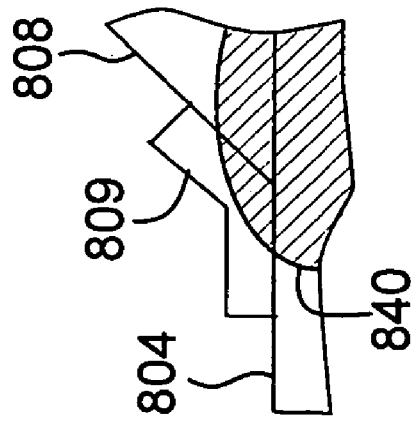
FIG. 7A is a view for explaining the concept of the provision of an insulator along both sides of a ridge structure.
Figure 7B:
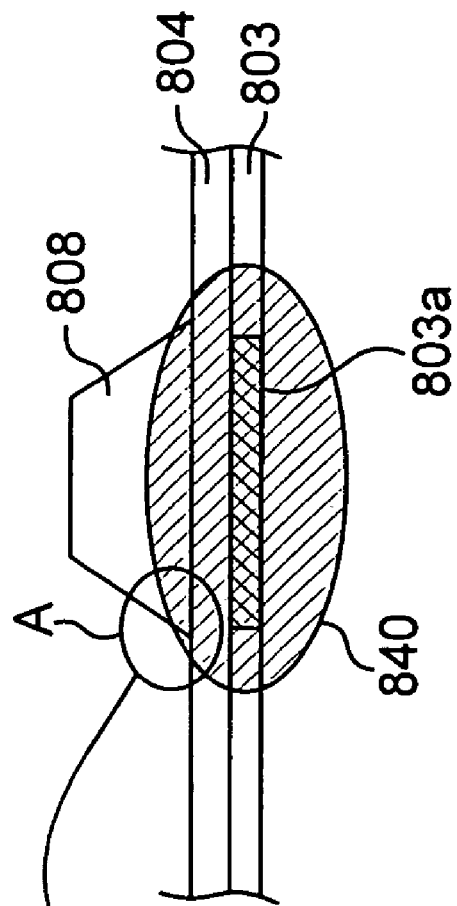
FIG. 7B is a view showing the distribution of a laser beam.

Generally speaking, when an active layer 803, an upper cladding layer 804 and a ridge structure 808 are provided as shown in FIG. 7B and a portion 803a of the active layer 803 just under the ridge structure 808 performs laser oscillation, the distribution 840 of the laser beam sometimes spreads beyond a corner defined between a side surface of the ridge structure 808 and the upper surface of the cladding layer 804 (the portion is indicated as region A). Then, an adjustment only by the design of the semiconductor stacked structure (compositions and layer thicknesses) may be insufficient so that the optical leakage in the vicinity of the ridge structure 808 from the upper cladding layer 804 to the p-side electrode thereon becomes unignorable depending on demanded optical characteristics. In the above case, forming an insulator 809 made of SiO$_2$, SiN$_x$, polyimide or the like, as shown in FIG. 7A, in a striped manner along both sides of the ridge structure 808 will restrain the absorption by the p-side electrode.

Second Embodiment

Figure 8:
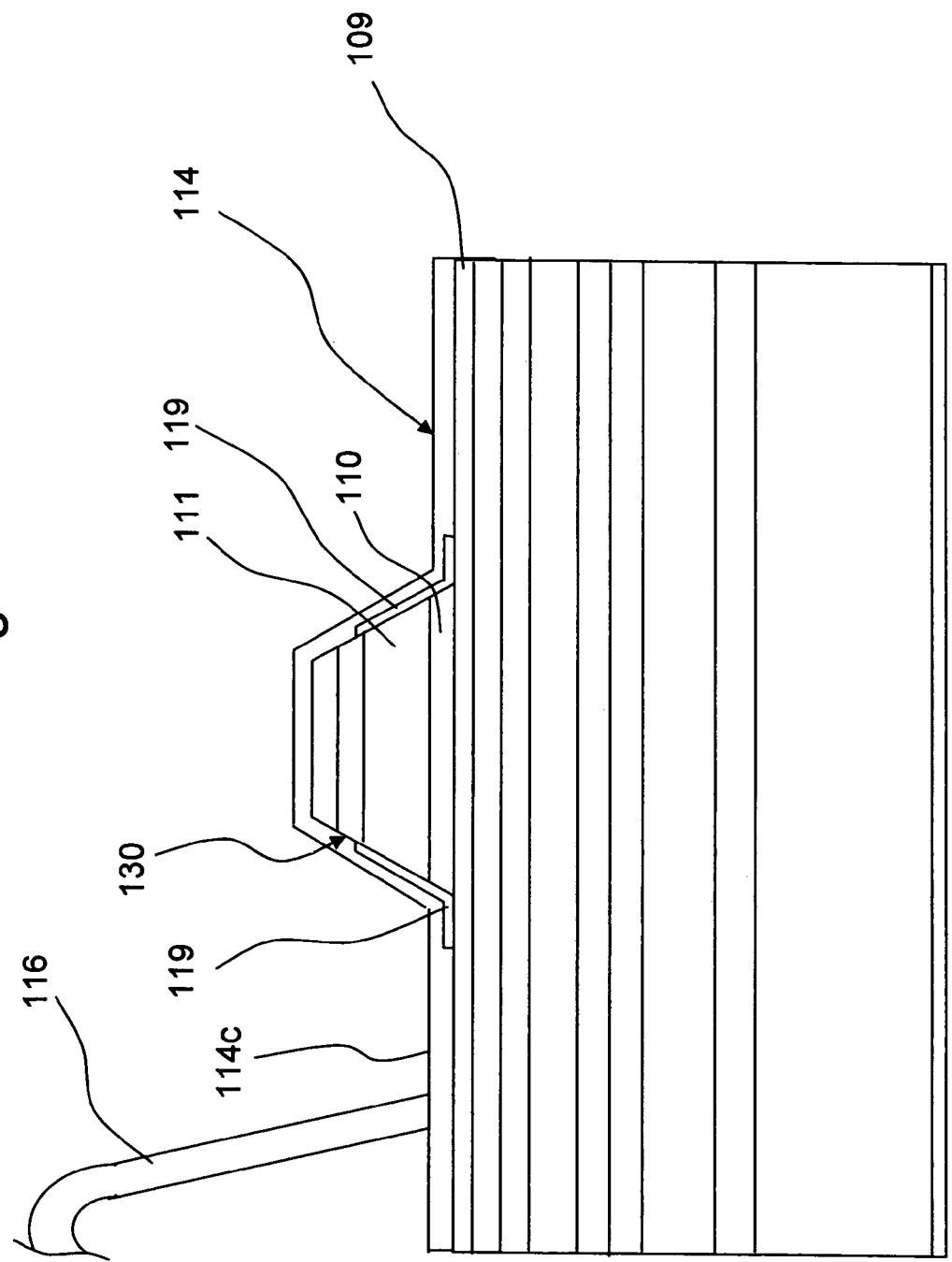
FIG. 8 is a schematic sectional view showing an exemplary structure of a semiconductor laser element according to a second embodiment of the present invention.

FIG. 8 is a schematic sectional view showing the structure of a semiconductor laser element of a second embodiment of the present invention, in which an example obtained by modifying the semiconductor laser element of the first embodiment so as to restrain the absorption by the p-side electrode is shown. In the semiconductor laser element shown in FIG. 8, SiN$_x$ films 119 and 119 (thickness: 1500 Å. The SiN$_x$ film will be referred to simply as the "SiN film".) that serve as insulators are provided in a striped manner along both sides of the ridge structure 130 of a forward mesa stripe shape. The SiN films 119 are provided so as to cover side surfaces of the third upper cladding layer 111, side surfaces of the GaAs etching stopper layer 110, and part (3 μm from the ridge structure) of the upper surfaces of the second upper cladding layer 109, and the p-side electrode 114 is provides so as to cover them. That is, each SiN film 119 is provided in a position enclosed by a side surface of the ridge structure 130, the upper surface of the second upper cladding layer 109 and the p-side electrode 114.

In the manufacturing process of this semiconductor laser element, after the ridge structure 130 described with reference to FIG. 3 is formed and the resist mask 117 is removed, a $Si_3N_4$ film ("SiN film") 119 is formed over the entire surface of the wafer by using the plasma CVD (plasma chemical vapor deposition) method. Subsequently, unnecessary portions are removed from the SiN film by etching with a buffered HF (hydrofluoric acid) by photolithography using a resist. Subsequently, Pt/Ti/Pt/Au films are formed as the p-side electrode 114 by the electron beam evaporation technique, as a result of which the construction shown in FIG. 8 is obtained. The film thickness of the SiN film 119 and its width on the second upper cladding layer 109 may be changed depending on the degree of optical leakage to the electrode 114. For ordinary optical characteristics, however, the SiN film 119 having a film thickness of about 500 Å to 5000 Å and a width of not smaller than 1 μm is sufficient. In the example of FIG. 8, the thickness was set to about 1500 Å and the width was set to 10 μm including a margin, in consideration of easy etching of the SiN film and a possible reduction in the width due to side etching. Moreover, the Au wire 116 for electrical connection to an external circuit is bonded onto the electrode portion 114c forming a Schottky junction and in a region where the SiN film 119 does not exist. This prevents the electrode from peeling off during the wire bonding process due to decreased adhesion of the electrode material caused by the insertion of the insulator like the SiN film in the semiconductor/electrode interface.

Third Embodiment

Figure 9:
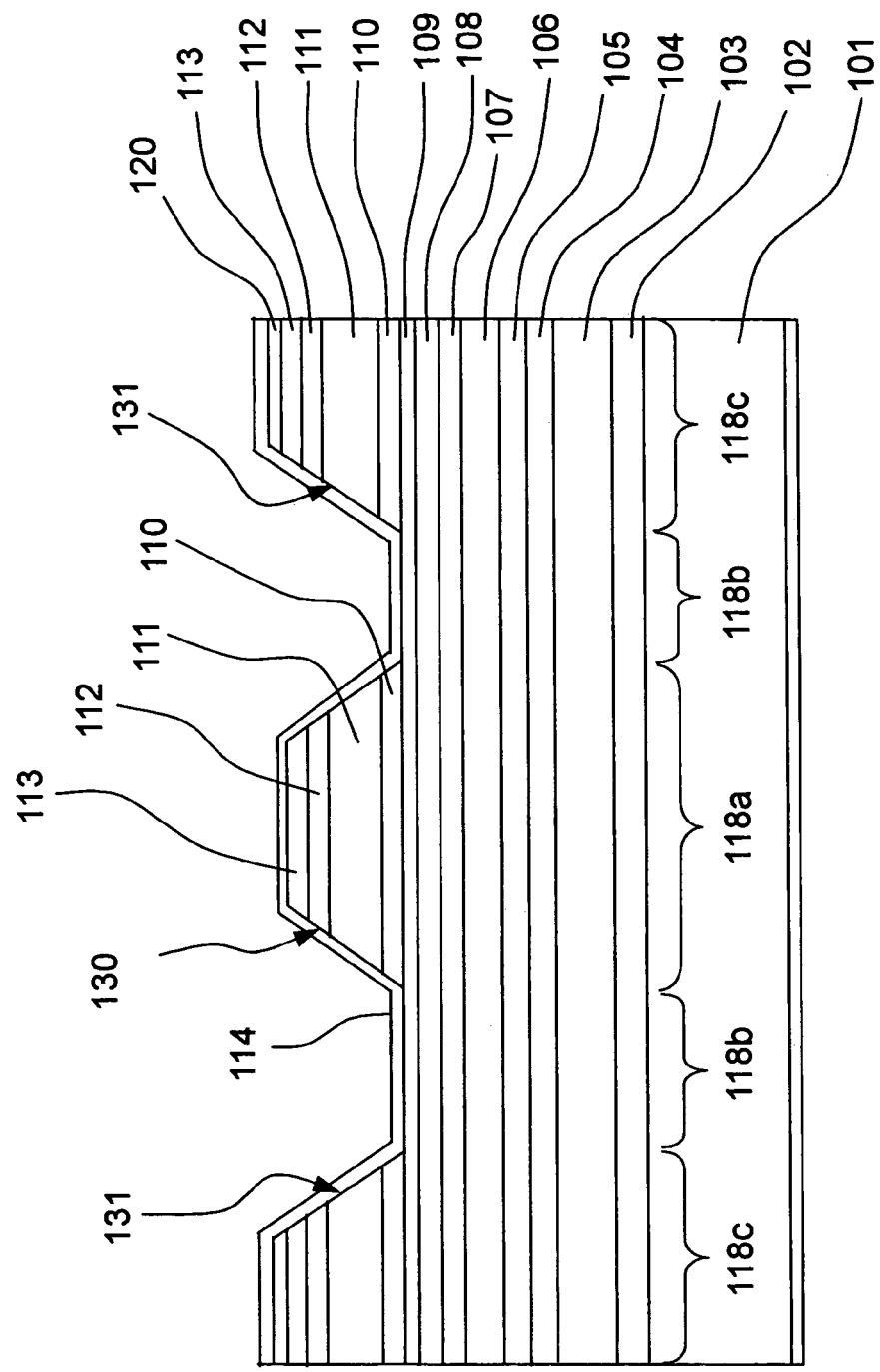
FIG. 9 is a schematic sectional view showing an exemplary structure of a semiconductor laser element according to a third embodiment of the present invention.

FIG. 9 is a schematic sectional view showing the structure of a semiconductor laser element of a third embodiment of the present invention, in which a modification of the semiconductor laser element of the first embodiment is shown. The third embodiment differs from the first embodiment in that stripe-shaped structures 131 are formed on both sides of the ridge structure 130, and is characterized by use of the junction down mounting method in which the laser element is die bonded by using a region on the stripe-shaped structure 131 of the p-side electrode as a bonding surface. The "bonding surface" means a surface of the semiconductor laser chip to be put in contact with a stem or a heat sink on which the semiconductor laser element is mounted.

The construction and the manufacturing method of the stripe-shaped structures formed on both sides of the ridge structure will be particularly described below, and no detailed description is provided for the constituents common to the first and third embodiments.

Similarly to the first embodiment, the semiconductor laser element of this third embodiment has an n-GaAs buffer layer 102, an n-$Al_{0.453}Ga_{0.547}As$ first lower cladding layer 103, an n-$Al_{0.5}Ga_{0.5}As$ second lower cladding layer 104, an $Al_{0.4278}Ga_{0.5722}As$ lower guide layer 105, a multiple strained quantum well active layer 106, an $Al_{0.4278}Ga_{0.5722}As$ upper guide layer 107, a p-$Al_{0.4885}Ga_{0.5115}As$ first upper cladding layer 108 and a p-$Al_{0.4885}Ga_{0.5115}As$ second upper cladding layer 109, which are successively stacked in this order on an n-GaAs substrate 101. A p-GaAs etching stopper layer 110, a p-$Al_{0.4885}Ga_{0.5115}As$ third upper cladding layer 111, a p-GaAs contact layer 112 and a $p^+$-GaAs contact layer 113 are provided so as to form a ridge structure 130 of a forward mesa stripe shape on the second upper cladding layer 109 in a ridge structure formation region 118a. On the other hand, a p-GaAs etching stopper layer 110, a p-$Al_{0.4885}Ga_{0.5115}As$ third upper cladding layer 111, a p-GaAs contact layer 112, a $p^+$-GaAs contact layer 113, and a p-$Al_{0.5}Ga_{0.5}As$ current cutoff layer 120 are provided on the second upper cladding layer 109 in respective stripe-shaped structure formation regions 118c so as to form the stripe-shaped structures 131 on both sides of the ridge structure 130. Further, there is provided a p-side electrode 114 of a multilayer metal thin film, which is formed by depositing Pt/Ti/Pt/Au in this order as one example of the electrode layer. The electrode continuously covers a top portion and side surface portions of the ridge structure 130, an upper surface of the second upper cladding layer 109 (mesa stripe outskirt regions 118b) and the periphery of the stripe-shaped structures 131. The p-side electrode 114 and the top portion (contact layer 113) of the ridge structure 130 form an ohmic junction, while the p-side electrode 114 and the upper surface of the second upper cladding layer 109 and current cutoff layer 120 that is the uppermost layer of the stripe-shaped structure 131 form a Schottky junction. Moreover, an n-side electrode 115 constructed of a multilayer metal thin film of AuGe/Ni/Au is formed as the other electrode layer on the back surface of the substrate 101.

This semiconductor laser element is fabricated as follows.

Figure 10A:
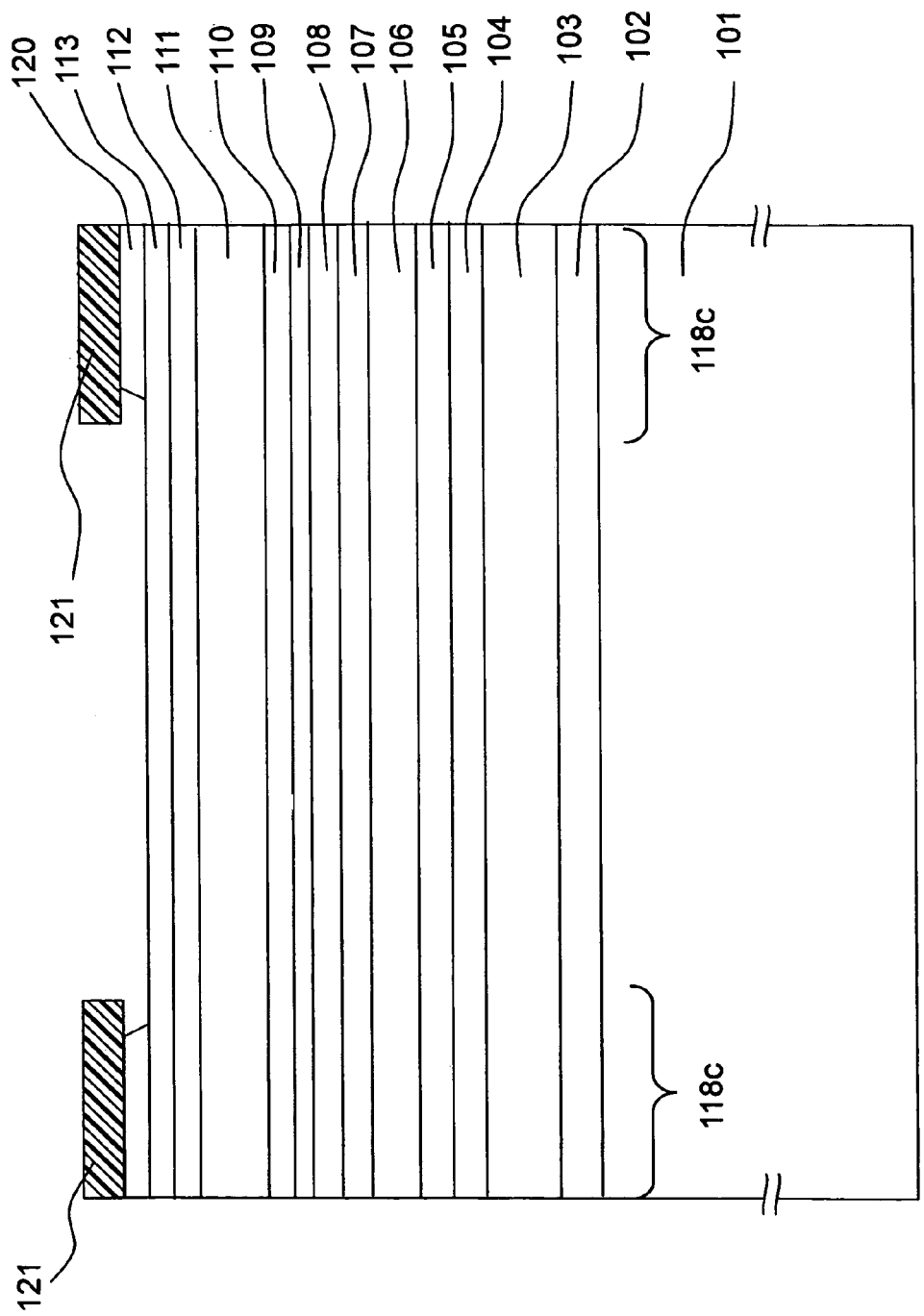
FIGS. 10A, 10B and 10C are schematic sectional views for explaining the manufacturing process steps of the semiconductor laser element of the third embodiment.

First, as shown in FIG. 10A, the n-GaAs buffer layer 102, the n-$Al_{0.453}Ga_{0.547}As$ first lower cladding layer 103, the n-$Al_{0.5}Ga_{0.5}As$ second lower cladding layer 104, the $Al_{0.4278}Ga_{0.5722}As$ lower guide layer 105, the multiple strained quantum well active layer 106, the $Al_{0.4278}Ga_{0.5722}As$ upper guide layer 107, the p-$Al_{0.4885}Ga_{0.5115}As$ first upper cladding layer 108, the p-$Al_{0.4885}Ga_{0.5115}As$ second upper cladding layer 109, the p-GaAs etching stopper layer 110, the p-$Al_{0.4885}Ga_{0.5115}As$ third upper cladding layer 111, the p-GaAs contact layer 112, the $p^+$-GaAs contact layer 113 and the p-$Al_{0.5}Ga_{0.5}As$ current cutoff layer 120 (layer thickness: 0.3 μm, Zn doping concentration: $1\times10^{17}$ $cm^{-3}$) are successively crystal-grown on the (100) face of the n-GaAs substrate 101 by the MOCVD method.

Next, as shown in FIG. 10A, a resist mask 121 for etching is formed to be located in regions where the stripe-shaped structures 131 are to be formed. The p-$Al_{0.5}Ga_{0.5}As$ current cutoff layer 120 in regions other than the above regions is removed by etching using HF, and thereafter, the resist mask is removed.

Figure 10B:
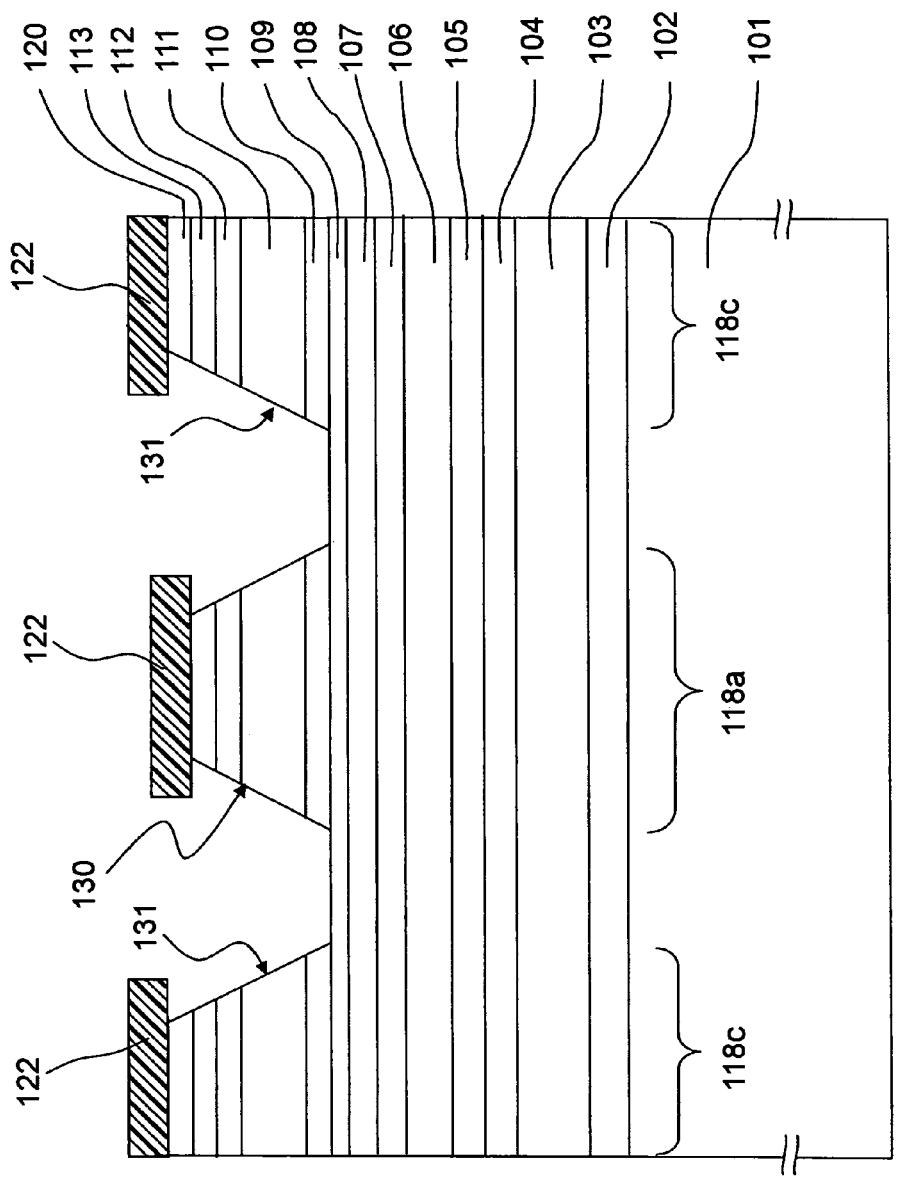

Next, as shown in FIG. 10B, a resist mask 122 that serves as an etching mask is formed through a photolithography process in regions where the ridge structure 130 and the stripe-shaped structures 131 are to be formed. This resist mask is formed so as to extend in the <0-11> direction corresponding to a direction in which the ridge structure 130 and the stripe-shaped structures 131 are extended.

Next, portions of the semiconductor layers 113, 112, 111 and 110 beside the resist mask are removed by etching until the p-$Al_{0.4885}Ga_{0.5115}As$ second upper cladding layer 109 is exposed.

Figure 10C:
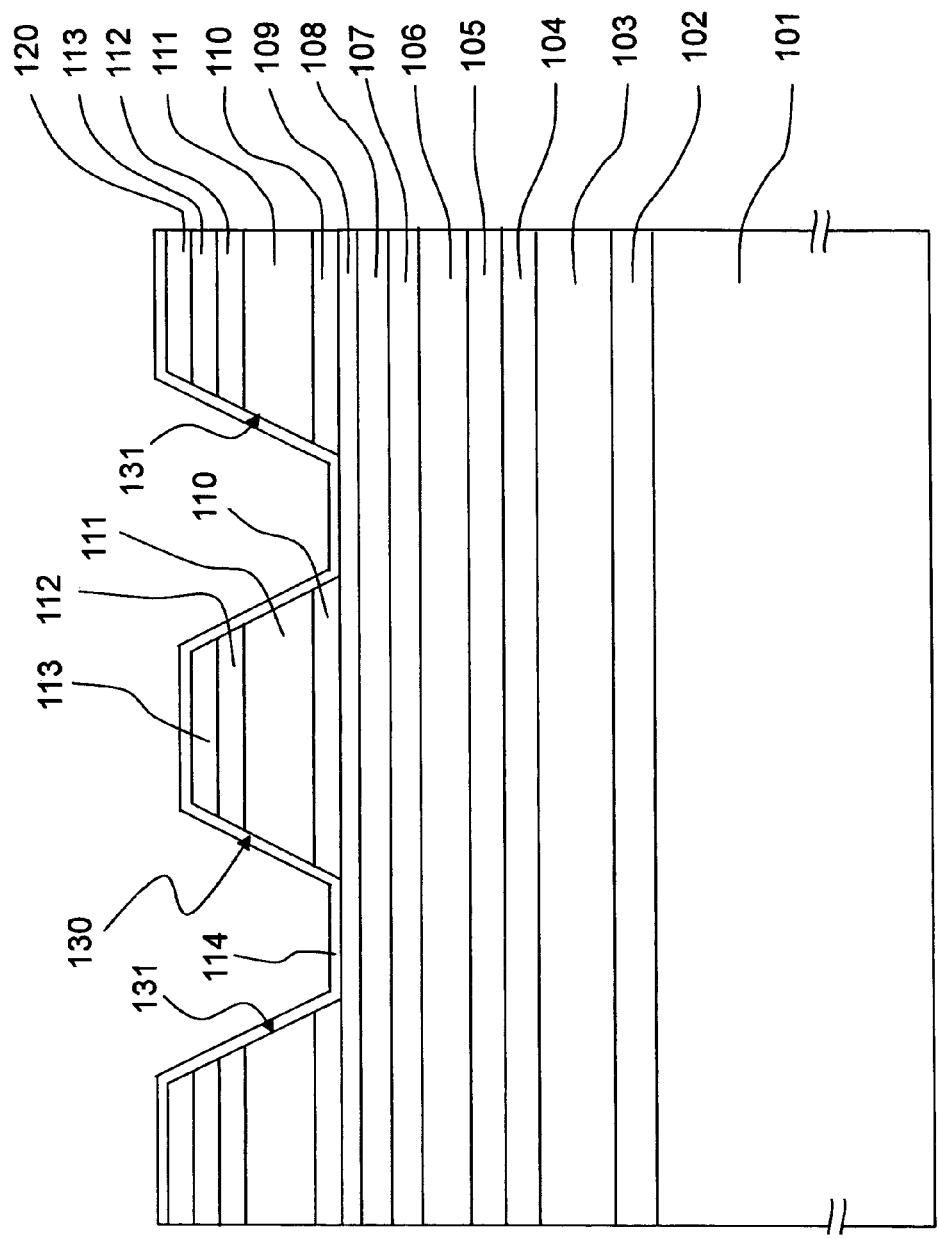

The process of forming the p-side electrode 114 shown in FIG. 10C and the subsequent processes are the same as those of the manufacturing method of the first embodiment described above.

The semiconductor laser element of this third embodiment utilizes the junction down mounting in which surface portions of the p-side electrode 114 located on top of the stripe-shaped structures 131 are bonded to a stem.

In this semiconductor laser element, the junction down mounting is employed to die-bond the p-side electrode 114, which is a ridge structure 130-side electrode and located near the active layer 106 where the laser oscillation occurs. Therefore, heat generated in the active layer 106 can easily be radiated and dissipated, by which good device reliability is obtained. At this time, in this third embodiment, the stripe-shaped structures 131, which are higher than the ridge structure 130 by the thickness of the current cutoff layer 120, are provided on both sides of the ridge structure 130. With this arrangement, no excessive stress is exerted on the ridge structure 130 even when the junction down mounting is carried out, and damages to the ridge structure 130 can be avoided. If a difference in the height between the uppermost portion of the ridge structure 130 and the uppermost portion of the stripe-shaped structure 131 is 0.1 μm or more, and preferably 0.25 μm or more in consideration of variation factors such as processing variation and so on, sufficient ridge structure protection effect is achieved.

Moreover, because the current cutoff layer 120 is formed continuously from the contact layer 113 in a crystal growth process, the manufacturing process can be simplified in comparison with the case where the process of separately forming an insulator for current cutoff or the like is carried out. By forming the current cutoff layer 120 so that its impurity doping concentration is equal to or lower than $1\times10^{17}$ cm$^{-3}$, sufficient current cutoff can be achieved due to the Schottky barrier formed at the interface even though the p-side electrode 114 is provided directly on the layer.

Although the example that uses AlGaAs as the current cutoff layer is shown in the third embodiment, InGaP and InGaAsP can also be suitably used. Even when either of these materials is used, sufficient current cutoff can be achieved by setting the doping concentration to $1\times10^{17}$ cm$^{-3}$ or less. Moreover, the film thickness of the current cutoff layer is required to be at least 0.1 μm or more from the viewpoint of the Schottky barrier. Moreover, the film thickness should preferably be not smaller than 0.1 μm in order to providing a difference in height with respect to the ridge structure. Although there is no upper limit of the film thickness in terms of the Schottky barrier property and the ridge structure protection, it is rather economical to set the upper limit to 0.3 μm to 0.4 μm in consideration of the crystal growth time and material consumption.

In the third embodiment, the p-side electrode 114 is formed on the stripe-shaped structures 131 of which the uppermost portion is higher than the uppermost portion of the ridge structure 130. Therefore, when the laser element is mounted on a conductor such as a stem and a heat sink by the junction down mounting, electrical continuity is achieved between the p-side electrode 114 on the stripe-shaped structure 131 and the conductor, whereby current injection required for laser oscillation is easily carried out.

The above-mentioned features enable realization of a semiconductor laser device that can employ the junction down mounting, which provides good heat radiation and is able to improve the device reliability without damaging the ridge structure, and that can be manufactured at low manufacturing cost, and realization of the manufacturing method therefor.

Although the wavelength of laser oscillation has been set to 780 nm in the aforementioned first through third embodiments, the present invention is, of course, not limited to this. The present invention can also be applied to, for example, an InGaAlP/GaAs based semiconductor laser element (in a fourth embodiment) of a wavelength of 650 nm for DVD use and to a semiconductor laser element that uses an InGaN/GaN based material for the 405-nm band. Moreover, an interface protection layer made of GaAs, for example, may be provided at the interface between semiconductor layers of different materials, i.e., between the upper guide layer and the barrier layer and between the lower guide layer and the barrier layer.

Fourth Embodiment

FIG. 11 shows the structure of a semiconductor laser element of the fourth embodiment of the present invention.

In this semiconductor laser element, an n-In$_{0.5}$(Ga$_{0.3}$Al$_{0.7}$)$_{0.5}$P lower cladding layer 202, an In$_{0.5}$(Ga$_{0.5}$Al$_{0.5}$)$_{0.5}$P light guide layer 203, a multiple quantum well active layer 204, an In$_{0.5}$(Ga$_{0.5}$Al$_{0.5}$)$_{0.5}$P light guide layer 205, a p-In$_{0.5}$(Ga$_{0.3}$Al$_{0.7}$)$_{0.5}$P first upper cladding layer 206, a p-In$_{0.5}$(Ga$_{0.3}$Al$_{0.7}$)$_{0.5}$P second upper cladding layer 207 of which the second-conductivity-type doping concentration is made lower than that of the first upper cladding layer 206 and a p-In$_{0.5}$Ga$_{0.5}$P etching stopper layer 208 that serves as a semiconductor layer of second conductivity type are successively stacked in this order on an n-GaAs substrate 201. A p-In$_{0.5}$(Ga$_{0.3}$Al$_{0.7}$)$_{0.5}$P third upper cladding layer 209, a p-In$_{0.5}$Ga$_{0.5}$P intermediate bandgap layer 210 and a p-GaAs contact layer 211 are provided on the p-InGaP etching stopper layer 208 in a ridge structure formation region 218$a$ so as to form a ridge structure 230 of a forward mesa stripe shape. Further, a p-side electrode 212 of a multilayer metal thin film is formed by stacking Ti/Pt/Au electrode layers in this order in such a manner that the electrode 212 continuously covers a top portion and side surface portions of the ridge structure 230 and an upper surface (in mesa stripe outskirt regions 218$b$) of the p-In$_{0.5}$Ga$_{0.5}$P etching stopper layer 208. It is to be noted that reference numerals 212$a$, 212$b$ and 212$c$ denote portions (occasionally referred to as the "electrode portions") that cover the top portion and the side surface portions of the ridge structure 230 and the upper surface of the etching stopper layer 208, respectively. The electrode portion 212$a$ and the top portion (contact layer 211) of the ridge structure 230 form an ohmic junction, while the electrode portion 212$c$ and the etching stopper layer 208 form a Schottky junction. An n-side electrode 213 formed by stacking AuGe/Ni/Au in this order is provided as the other electrode layer on the back surface side of the n-GaAs substrate 201. Further, an Au wire 214 for electrical connection to an external circuit is bonded to the electrode portion 212$c$ formed on the p-InGaP etching stopper layer 208 of the p-side electrode 212.

This semiconductor laser element is fabricated as follows.

Figure 12A:
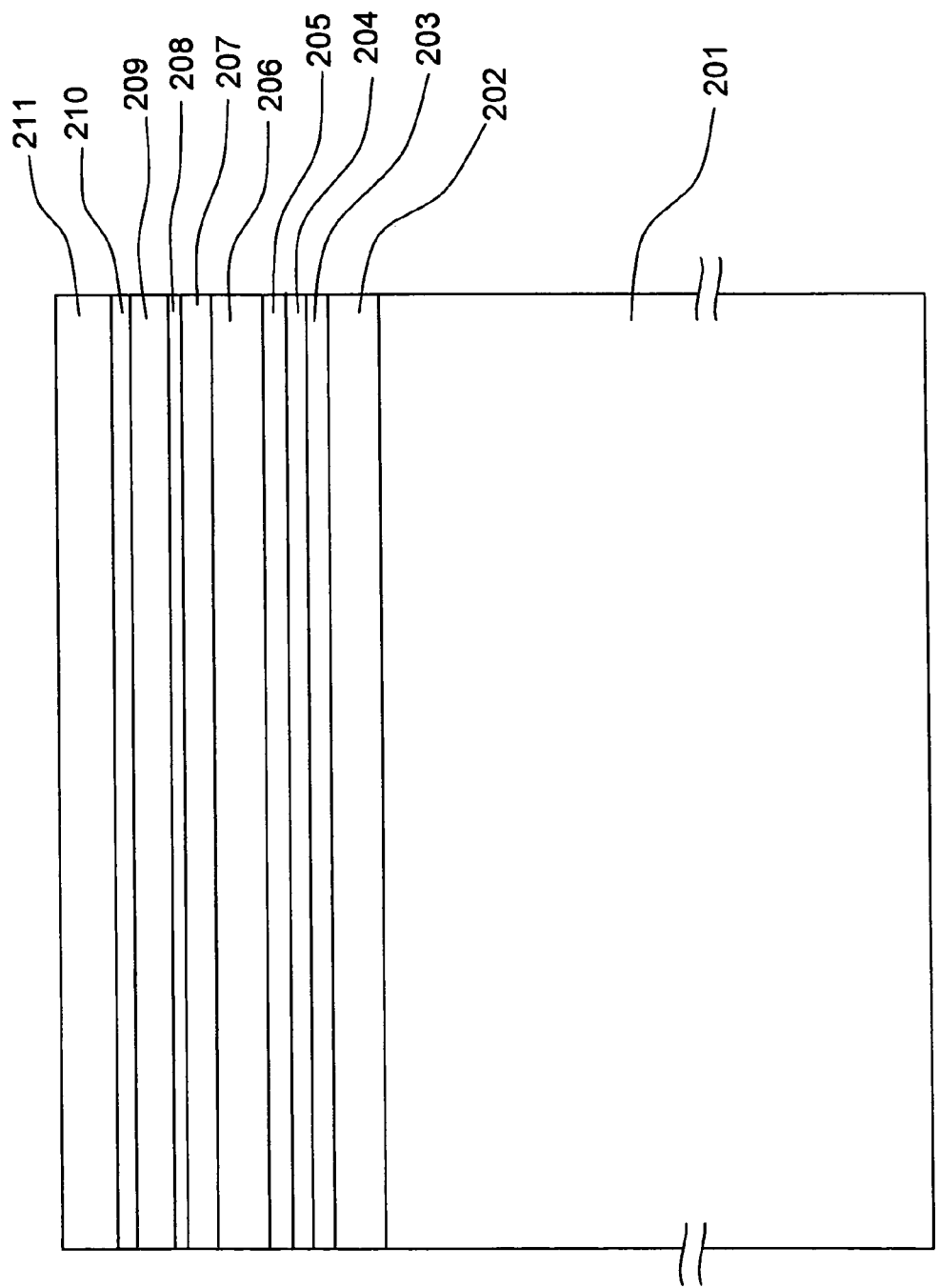

First, as shown in FIG. 12A, the n-In$_{0.5}$(Ga$_{0.3}$Al$_{0.7}$)$_{0.5}$P lower cladding layer 202 (layer thickness: 1 μm, Si doping concentration: $5\times10^{17}$ cm$^{-3}$), the In$_{0.5}$(Ga$_{0.5}$Al$_{0.5}$)$_{0.5}$P light guide layer 203 (layer thickness: 50 nm), the multiple quantum well active layer 204, the In$_{0.5}$(Ga$_{0.5}$Al$_{0.5}$)$_{0.5}$P light guide layer 205 (layer thickness: 50 nm), the p-In$_{0.5}$(Ga$_{0.3}$Al$_{0.7}$)$_{0.5}$P first upper cladding layer 206 (layer thickness: 0.3 μm, Be doping concentration: $1\times10^{18}$ cm$^{-3}$), the p-In$_{0.5}$(Ga$_{0.3}$Al$_{0.7}$)$_{0.5}$P second upper cladding layer 207 (layer thickness: 0.1 μm, Be doping concentration: $1\times10^{17}$ cm$^{-3}$), the p-In$_{0.5}$Ga$_{0.5}$P etching stopper layer 208 (layer thickness: 50 Å, Be doping concentration: $1\times10^{17}$ cm$^{-3}$), the p-In$_{0.5}$(Ga$_{0.3}$Al$_{0.7}$)$_{0.5}$P third upper cladding layer 209 (layer thickness: 0.5 μm, Be doping concentration: $1.5\times10^{18}$ cm$^{-3}$), the p-In$_{0.5}$Ga$_{0.5}$P intermediate bandgap layer 210 (layer thickness: 50 Å, Be doping concentration: $2\times10^{18}$ cm$^{-3}$) and the p-GaAs contact layer 211 (layer thickness: 0.3 μm, Be doping concentration: $1\times10^{19}$ cm$^{-3}$) are successively grown in a stacked manner one on another on the n-GaAs substrate 201 by MBE (molecular beam epitaxy) technique.

It is to be noted that the multiple quantum well active layer 204 has a multiple quantum well structure consisting of four 30-Å thick $In_{0.5}Ga_{0.5}P$ well layers and four 40-Å thick $In_{0.5}(Ga_{0.5}Al_{0.5})_{0.5}P$ barrier layers that are alternately stacked.

Figure 12B:
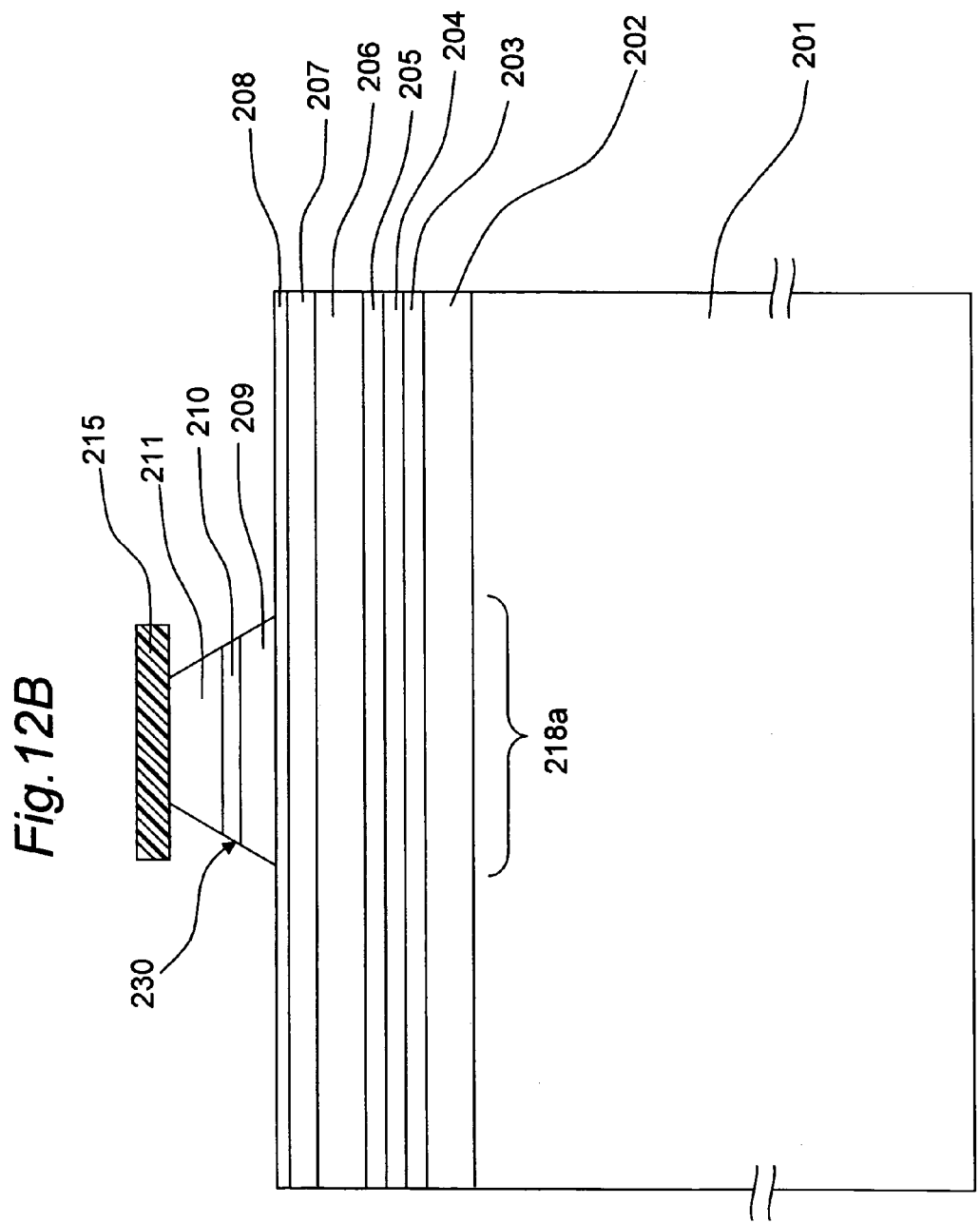

Next, as shown in FIG. 12B, a stripe-shaped resist mask 215 is formed on the contact layer 211 in the ridge structure formation region 218a where the ridge structure 230 is to be formed (see FIG. 11). Then, portions of the semiconductor layers 211, 210 and 209 on both sides of the resist mask 215 are removed by etching, thereby forming the ridge structure 230 of forward mesa stripe shape just under the resist mask 215. After the etching ends, the resist mask 215 is removed, as shown in FIG. 12C.

Subsequently, as shown in FIG. 12D, a metal thin film is formed by stacking Ti (layer thickness: 500 Å)/Pt (layer thickness: 500 Å)/Au (layer thickness: 3000 Å) in this order as the p-side electrode 212 by using the electron beam evaporation technique.

Subsequently, as shown in FIG. 11, the substrate 201 is thinned to a thickness of about 100 1m by etching from the back surface side. Then, the n-side electrode 213 constructed of AuGe (layer thickness: 1500 Å)/Ni (layer thickness: 150 Å)/Au (layer thickness: 3000 Å) is formed on the back surface side of the substrate by using the resistance heating deposition technique and thereafter subjected to an alloying process. Subsequently, similarly to the first embodiment, the thus obtained wafer is divided into chips, and each chip is mounted on a stem, and the Au wire 214 is bonded. The semiconductor laser element is completed through the aforementioned processes.

The semiconductor laser element of this fourth embodiment exhibited initial characteristics equivalent to those of the conventional buried ridge structure, similarly to the semiconductor laser element of the first embodiment. Moreover, stable operation lasting for 1000 hours or more was also confirmed by a 60-mW reliability test at 70° C.

In this fourth embodiment, dissimilarly to the first embodiment, portions of the p-$In_{0.5}Ga_{0.5}P$ etching stopper layer 208 on both sides of the ridge structure 230 are not removed, and the p-side electrode 212 is formed thereon. The current constriction property is improved when the p-side electrode 212 is formed directly on the p-$In_{0.5}(Ga_{0.3}Al_{0.7})_{0.5}P$ second upper cladding layer 207 rather than on the p-$In_{0.5}Ga_{0.5}P$ etching stopper layer 208. However, the current constriction property provided by the Schottky junction formed by the $In_{0.5}Ga_{0.5}P$ etching stopper layer 208 is practically sufficient. Therefore, by eliminating the process of partially removing the etching stopper layer 208 as in this fourth embodiment, further cost reduction can be achieved.

Fifth Embodiment

Figure 13:
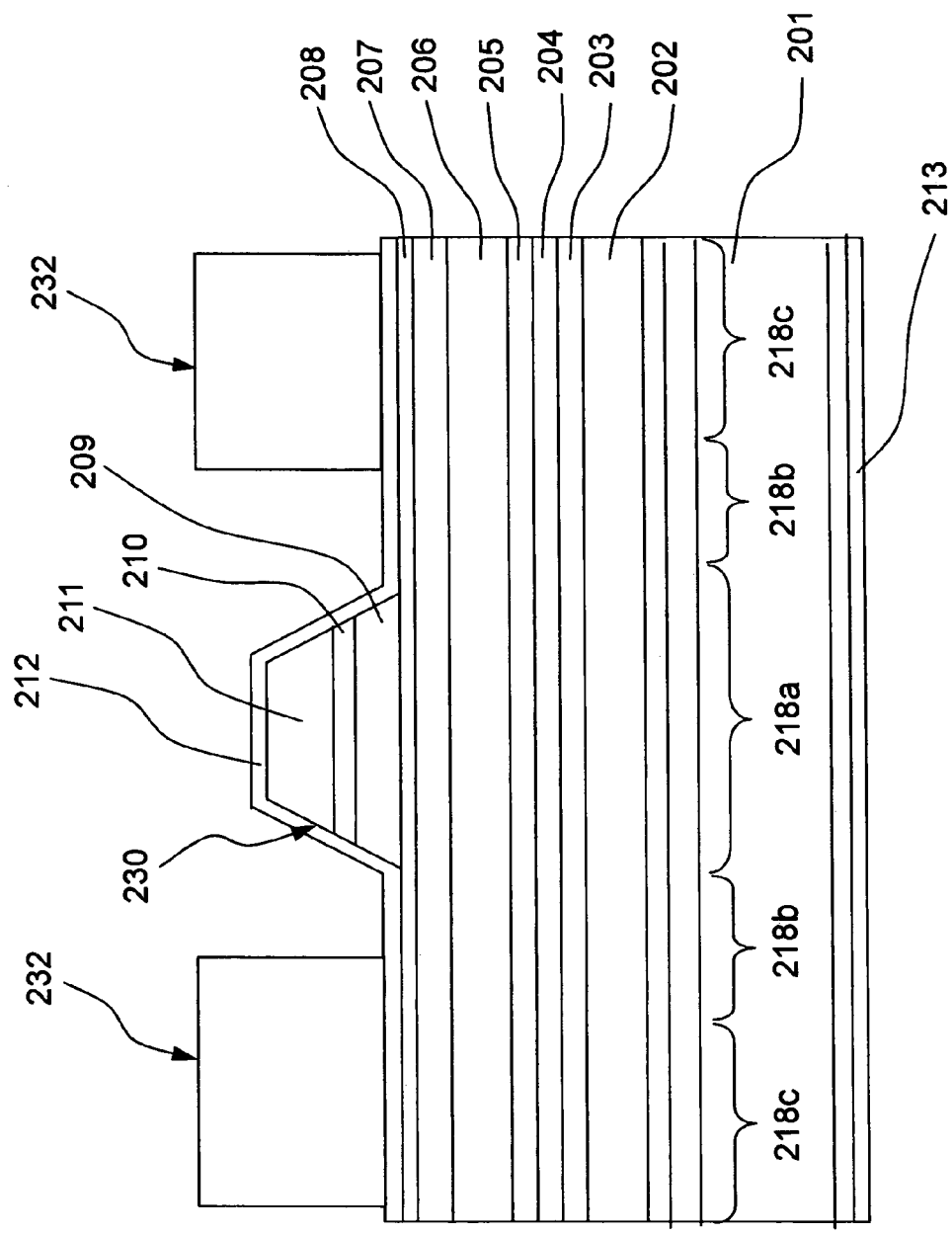
FIG. 13 is a schematic sectional view showing an exemplary structure of a semiconductor laser element according to a fifth embodiment of the present invention.

FIG. 13 is a schematic sectional view showing the structure of a semiconductor laser element of a fifth embodiment of the present invention, in which a modification of the semiconductor laser element of the fourth embodiment suitable for the aforementioned junction down mounting is shown.

The semiconductor laser element shown in FIG. 13 is characterized in having, in addition to the above-described features of the semiconductor laser element of the fourth embodiment, stripe-shaped structures 232 made of a conductor on both sides of the ridge structure 230, the stripe-shaped structures 232 being formed by a gold plating method. In FIG. 13, reference numeral 218a denotes a ridge structure formation region, 218b denotes a mesa stripe outskirt region 218b, and 218c denotes a stripe-shaped structure formation region.

A manufacturing process of the semiconductor laser element of the fifth embodiment is the same as that of the fourth embodiment until after the formation of the p-side electrode 212. Subsequently, outside of regions where the stripe-shaped structures 232 are to be formed is masked with a photoresist (see 1222 in FIG. 28) prior to the substrate etching process, and the stripe-shaped structures 232 of which the uppermost portion is higher than the uppermost portion of the ridge structure 230 are formed by the gold electroplating method using the p-side electrode 212 as a feeding metal. At this time, the height of the stripe-shaped structures 232 is set to 1.5 µm, so that the uppermost portion of the stripe-shaped structure 232 is higher than the height (0.805 µm) of the uppermost portion of the ridge structure 230. After the plating ends, the photoresist is removed.

Subsequently, steps of substrate etching and n-side electrode deposition and alloying are carried out, and division into chips of a desired size is then carried out.

In the subsequent process steps of this fifth embodiment, dissimilarly to the fourth embodiment, instead of carrying out wire bonding to the semiconductor laser element in the chip state, the junction down mounting is carried out using the uppermost surface of each stripe-shaped structure 232 as the bonding surface to the stem.

This semiconductor laser element also adopts the junction down mounting method to die bond to the stem the stripe-shaped structures 232 constructed of conductor that are located close to the active layer 204 in which the laser oscillation occurs, as described hereinabove. Therefore, heat generated at the active layer 204 can easily be radiated and dissipated, and accordingly the element reliability can be improved. At this time, the uppermost portion of each stripe-shaped structure 232 is formed so as to be higher than the uppermost portion of the ridge structure 230. Therefore, no excessive stress is exerted on the ridge structure 230 even when the junction down mounting is carried out, and the ridge structure 230 is prevented from being damaged.

Furthermore, in the semiconductor laser element of this fifth embodiment, the stripe-shaped structure 232 formed in the heat radiation path between the active layer 204 and the stem or heat sink is constructed of a conductor that has excellent heat conduction. Therefore, heat radiation is particularly good, and the effect of improving the reliability is great.

Moreover, according to the construction of this fifth embodiment, there is an effect that the process of forming the current cutoff layer in the third embodiment or the insulator that substitutes for the layer becomes unnecessary.

Although the semiconductor laser element of the fifth embodiment has the construction in which the stripe-shaped structures 232 are formed by means of gold plating, the structures are, of course, not limited to it. The structures are merely required to be a conductor from the viewpoint of electric continuity and heat radiation to the stem or heat sink.

However, the conductor material should preferably be gold or an alloy that contains gold in that the material is hard to oxidize and allowed to have a reduced contact resistance to other metals. When gold or an alloy that contains gold is used as the material of the stripe-shaped structure, the height of the stripe-shaped structure tends to reduce due to deformation in the mounting stage because of its material characteristic of softness, so that a difference in the height from the ridge structure should be at least about 0.5 µm.

Moreover, the fifth embodiment realizes the junction down mounting providing satisfactory yield and heat radiation by forming on both sides of the ridge structure 230 the stripe-shaped structures 232 constructed of conductor. However, it is needless to say that the construction employed in the third embodiment can also be used as a substitute.

Sixth Embodiment

Figure 14:
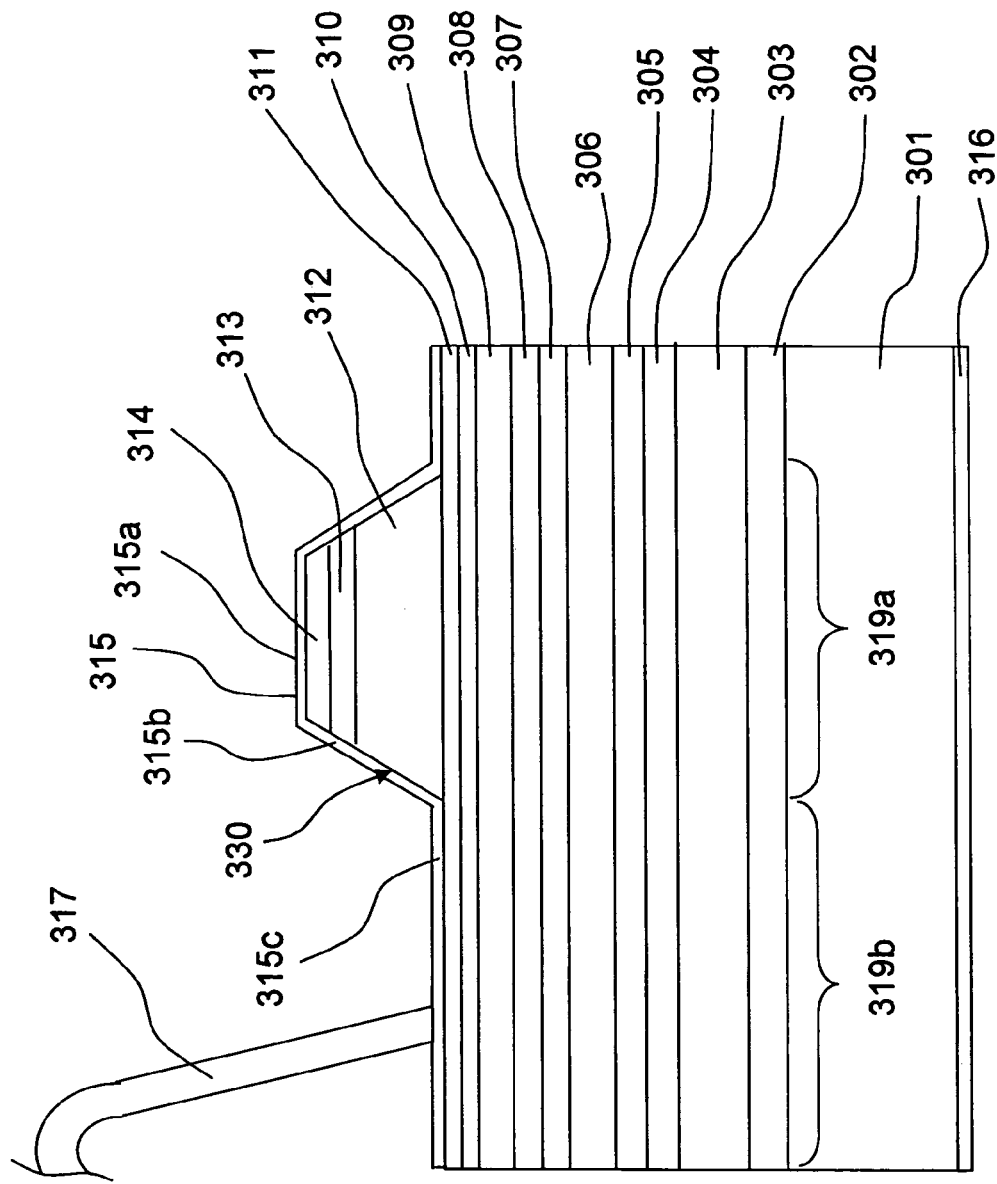
FIG. 14 is a schematic sectional view of a semiconductor laser element according to a sixth embodiment of the present invention, showing a section perpendicular to the stripe direction of the element.

FIG. 14 shows the structure of a semiconductor laser element of a sixth embodiment of the present invention.

In this semiconductor laser element, an n-GaAs buffer layer 302, an n-$Al_{0.5}Ga_{0.5}As$ first lower cladding layer 303, an n-$Al_{0.422}Ga_{0.578}As$ second lower cladding layer 304, an $Al_{0.25}Ga_{0.75}As$ lower guide layer 305, a multiple strained quantum well active layer 306, an $Al_{0.25}Ga_{0.75}As$ first upper guide layer 307, a p-$Al_{0.4}Ga_{0.6}As$ second upper guide layer 308, a p-$Al_{0.456}Ga_{0.544}As$ first upper cladding layer 309, a p-$Al_{0.456}Ga_{0.544}As$ second upper cladding layer 310 and a p-$In_{0.1568}Ga_{0.8432}As_{0.4}P_{0.6}$ semiconductor layer 311 are successively stacked in this order on an n-GaAs substrate 301. A p-$Al_{0.5}Ga_{0.5}As$ third upper cladding layer 312, a p-GaAs contact layer 313 and a $p^+$-GaAs contact layer 314 are provided on the semiconductor layer 311 so as to form a ridge structure 330 of a forward mesa stripe shape. Further, a p-side electrode 315, which is constructed of a multilayer metal thin film formed by stacking Ti/Pt/Au electrode layers in this order, is provided such that the electrode continuously covers the top portion and the side surface portions of the ridge structure 330 and the upper surface of the semiconductor layer 311. It is to be noted that reference numerals 315a, 315b and 315c denote portions (occasionally referred to as the "electrode portions") that cover the top portion and the side surface portions of the ridge structure 330 and the upper surface of the semiconductor layer 311, respectively. The electrode portion 315a and the top portion (contact layer 314) of the ridge structure 330 form an ohmic junction, while the electrode portion 315c and the upper surface of the semiconductor layer 311 form a Schottky junction. Moreover, an n-side electrode 316, which is constructed of a multilayer metal thin film of AuGe/Ni/Au, is formed as the other electrode layer on the back surface of the substrate 301. Further, an Au wire 317 for electrical connection to an external circuit is bonded to the portion 315c formed on the semiconductor layer 311 of the p-side electrodes 315.

This semiconductor laser element is fabricated as follows.

First, as shown in FIG. 15A, the n-GaAs buffer layer 302 (layer thickness: 0.5 µm, Si doping concentration: $7.2 \times 10^{17}$ $cm^{-3}$), the n-$Al_{0.5}Ga_{0.5}As$ first lower cladding layer 303 (layer thickness: 2 µm, Si doping concentration: $5.4 \times 10^{17}$ $cm^{-3}$), the n-$Al_{0.422}Ga_{0.578}As$ second lower cladding layer 304 (layer thickness: 0.1 µm, Si doping concentration: $5.4 \times 10^{17}$ $cm^{-3}$), the $Al_{0.25}Ga_{0.75}As$ lower guide layer 305 (layer thickness: 30 Å), the multiple strained quantum well active layer 306, the $Al_{0.25}Ga_{0.75}As$ first upper guide layer 307 (layer thickness: 30 Å), the p-$Al_{0.4}Ga_{0.6}As$ second upper guide layer 308 (layer thickness: 0.1 µm, C doping concentration: $1.35 \times 10^{18}$ $cm^{-3}$), the p-$Al_{0.456}Ga_{0.544}As$ first upper cladding layer 309 (layer thickness: 0.4 µm, C doping concentration: $1.35 \times 10^{18}$ $cm^{-3}$), the p-$Al_{0.456}Ga_{0.544}As$ second upper cladding layer 310 (layer thickness: 0.1 µm, C doping concentration: $1 \times 10^{17}$ $cm^{-3}$), the p-$In_{0.1568}Ga_{0.8432}As_{0.4}P_{0.6}$ semiconductor layer 311 (layer thickness: 150 Å, C doping concentration: $1 \times 10^{17}$ $cm^{-3}$), the p-$Al_{0.5}Ga_{0.5}As$ third upper cladding layer 312 (layer thickness: 1.28 µm, C doping concentration: $2.4 \times 10^{18}$ $cm^{-3}$), the p-GaAs contact layer 313 (layer thickness: 0.2 µm, C doping concentration: $3 \times 10^{18}$ $cm^{-3}$) and the $p^+$-GaAs contact layer 314 (layer thickness: 0.3 µm, C doping concentration: $1 \times 10^{20}$ $cm^{-3}$) are successively crystal-grown on the (100) face of the n-GaAs substrate 301 by the MOCVD method. The multiple strained quantum well active layer 306 is constructed by alternately arranging $In_{0.1001}Ga_{0.8999}As$ compressively strained quantum well layers (strain: 0.7%, layer thickness: 46 Å, two layers) and $In_{0.238}Ga_{0.762}As_{0.5463}P_{0.4537}$ barrier layers (strain: 0.1%, bandgap $Eg \approx 1.60$ eV, three layers of layer thickness: 215 Å, 79 Å and 215 Å from the substrate side, the layer nearest to the substrate 301 serves as an n-side barrier layer and the layer farthest from the substrate serves as a p-side barrier layer).

Next, as shown in FIG. 15A, a resist mask 318 (mask width: 4.5 µm) is produced by a photolithography process on the contact layer 314 in a ridge structure formation region 319a (see FIG. 14) where the ridge structure 330 is to be formed. This resist mask 318 is formed so as to extend in the <0-11> direction in correspondence with the direction in which the ridge structure 330 formed is extended.

Figure 15B:
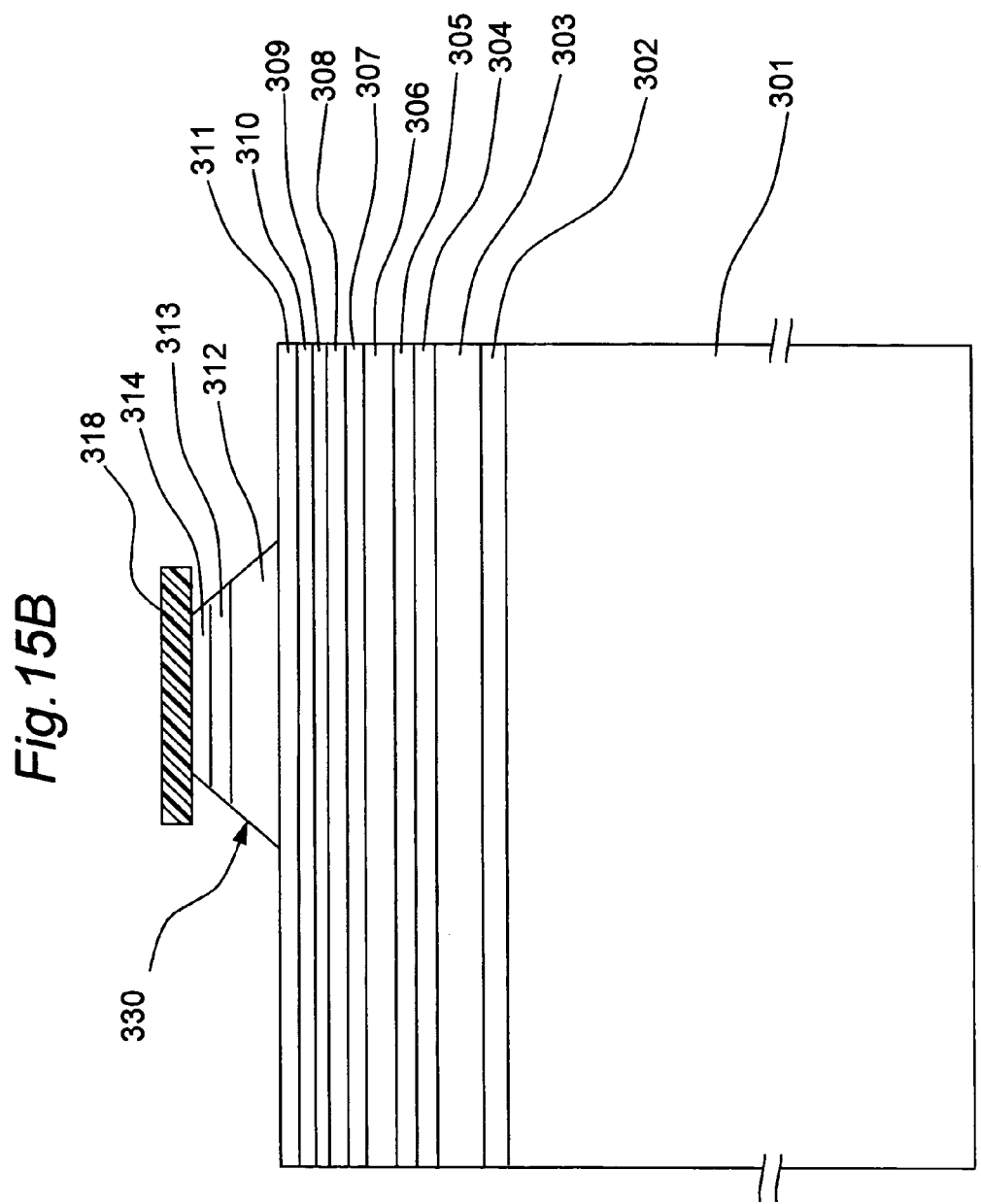

Next, as shown in FIG. 15B, portions of the semiconductor layers 314, 313 and 312 on both sides of the resist mask 318 are removed by etching, thereby forming the ridge structure 330 of a forward mesa stripe shape just under the resist mask 318. This etching is carried out using a mixed aqueous solution of sulfuric acid and a hydrogen peroxide solution until the p-InGaAsP semiconductor layer 311 is exposed, and then the shape of the ridge structure 330 is adjusted to the forward mesa shape with hydrofluoric acid and a mixed aqueous solution of ammonia and a hydrogen peroxide solution so that the GaAs contact layers 313 and 314 do not overhang beyond the p-AlGaAs third upper cladding layer 312. The etching depth is 1.78 µm, and the width of the lowermost portion of the ridge structure 330 is about 3.5 µm. After the etching ends, the resist mask 318 is removed.

Subsequently, as shown in FIG. 15C, a multilayer metal thin film is formed by stacking layers of Ti (layer thickness: 1000 Å)/Pt (layer thickness: 500 Å)/Au (layer thickness: 4000 Å) in this order as the p-side electrode 315 by using the electron beam evaporation method.

Subsequently, as shown in FIG. 14, the substrate 301 is ground at the back surface side to a desired thickness (about 100 µm in this case) by lapping. Then, layers of an AuGe alloy (alloy of 88% of Au and 12% of Ge, layer thickness: 1000 Å), Ni (layer thickness: 150 Å) and Au (layer thickness: 3000 Å) are stacked on the back surface as the n-side electrode 316 by using the resistance heating deposition method. Subsequently, an alloying process is carried out by heating at 390° C. for one minute in an $N_2$ atmosphere. The thus obtained wafer is divided into a plurality of bars having a desired cavity length (500 µm in this case), and thereafter, the bars are subjected to end surface coating and then further divided into chips (500 µm×200 µm). The dividing into chips is performed such that the ridge structure 330 is displaced (offset) by a prescribed distance from the center of the chip, to get a region 319b for wire bonding performed later. In this example, the position of the ridge structure 330 was set about 50 µm apart from one chip end (In this case, the width of the wire bonding region 319b on the opposite side was set to about 150 µm.). The chips obtained through the bar division are each stuck to a stem (not shown) with an In paste. Then, an Au wire 317 for electrical connection to the external circuit is bonded to a portion (in the region 319b beside the ridge structure 330) of the p-side electrodes 315 that is in contact with the semiconductor layer 311. The semiconductor laser element is now completed.

The semiconductor laser element of this sixth embodiment is a semiconductor laser element for infrared communications of a wavelength of 890 nm. No description will be provided as to features similar to the first embodiment, and only differences will be described below.

In the sixth embodiment, a layer of InGaAsP (layer thickness: 150 Å, C doping concentration: $1\times10^{17}$ cm$^{-3}$), of which the P mole fraction in the V-group elements is 60%, is provided as the semiconductor layer 311 between the second upper cladding layer 310 and the p-side electrode 315. Then, with the second upper cladding layer 310 being not exposed, the InGaAsP semiconductor layer 311 forms a Schottky junction with the p-side electrode 315. According to this arrangement, the semiconductor layer 311 made of InGaAsP covers the second upper cladding layer 310 and functions as a surface protection layer. As a result, the following three novel advantages have been produced.

Figure 16:
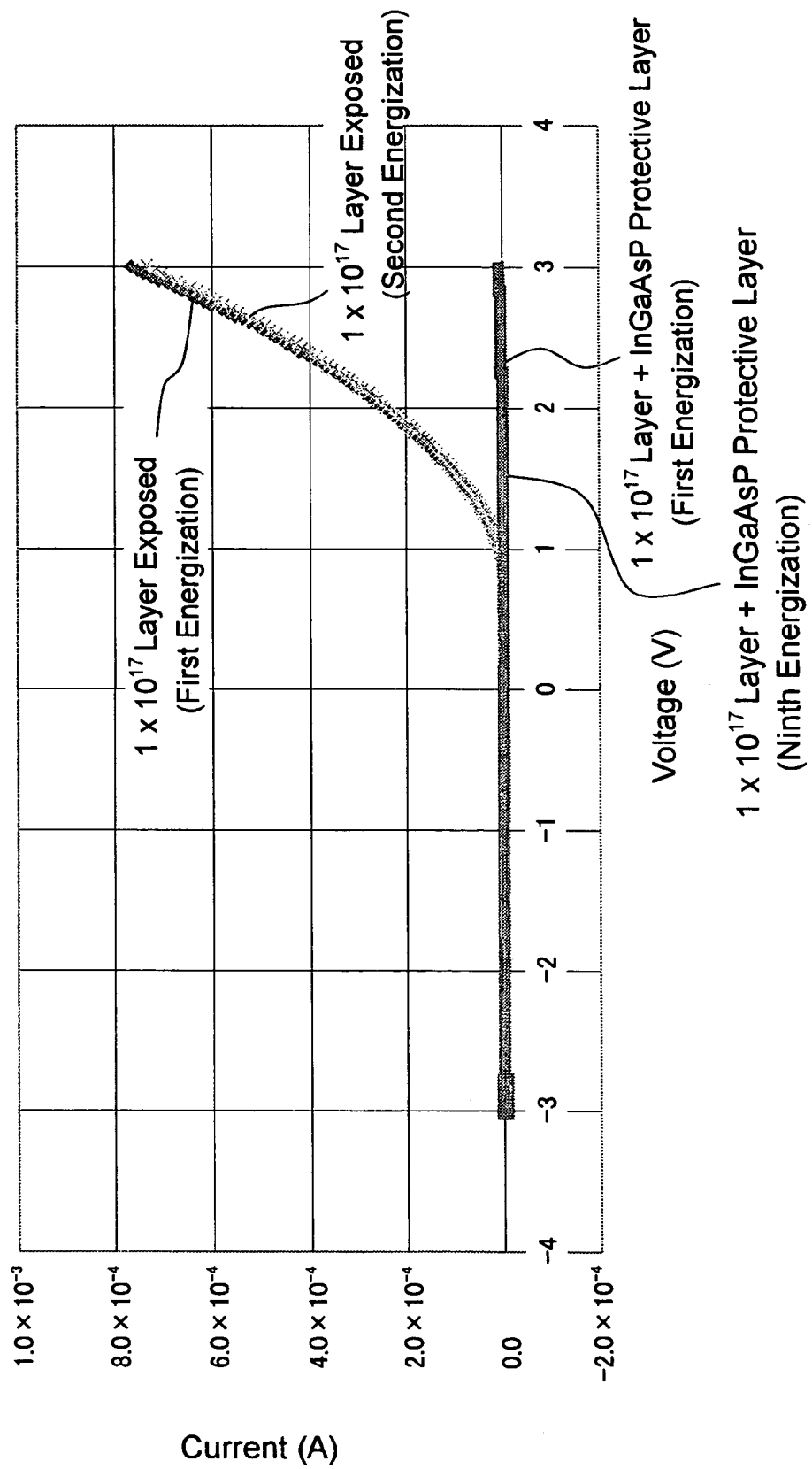
FIG. 16 is a graph showing comparison between the current constriction property and energization stability when an InGaAsP semiconductor layer is provided on the upper cladding layer and the current constriction property and energization stability when the semiconductor layer is not provided.

A first advantage is that the device life, of which the end is attributed to the destruction of the Schottky barrier, was extended during the long-term reliability test. This can easily be understood by comparison with a case where a Schottky electrode is provided just on the AlGaAs layer (This case corresponds to the first embodiment.). When the Schottky electrode is provided just on the AlGaAs layer, a MOS (Metal-Oxide-Semiconductor) structure with a very thin natural Al oxide film takes place. This MOS structure is unstable incomparably to a MOS structure that uses $SiO_2$ in a silicon device. One reason for that is that the Al natural oxide film is hardly homogeneously formed and is not firm as a barrier in comparison with $SiO_2$. In contrast to this, when an InGaAsP layer, which is stabler than AlGaAs, hardly develops a natural oxide film and hardly causes pinning of the Fermi level, is provided on the surface of the AlGaAs layer (corresponding to the sixth embodiment), the surface recombination of carriers is restrained and the parasitic current can be restrained. As a result, a reduction in the operating current and the improvement of reliability were concurrently achieved, and the stability of the Schottky barrier was greatly improved. FIG. 16 is a graph showing differences in the current constriction property and the energization stability between the case where the semiconductor layer 311 made of InGaAsP is provided (indicated as "$1\times10^{17}$ layer+InGaAsP protective layer" in FIG. 16) and the case where such a layer is not provided (indicated as "$1\times10^{17}$ layer exposed" in FIG. 16). As apparent from FIG. 16, with regard to the current constriction property, when the InGaAsP semiconductor layer 311 was provided, almost no leakage current was observed and the leakage current remained on the order of $10^{-6}$ A at most even if a voltage up to about +3 V was applied. That leakage current value is about one-hundredth of that in the case where no InGaAsP semiconductor layer was provided (Note that a leakage current in a very minute region is observed in FIG. 16 as compared with FIG. 6). On the other hand, with regard to the energization stability, initial characteristics (the first energization) and intermediate characteristics after a plurality of times of energization (the ninth energization in this example) were almost the same when the InGaAsP semiconductor layer 311 was provided, indicating that almost no change was observed. In contrast to this, it can be seen from precise comparison on the scale of the vertical axis of FIG. 16 that the leakage current was increased a little when the InGaAsP semiconductor layer 311 was not provided.

In the light of the improvement in stability, the sixth embodiment used the well-known Ti/Pt/Au multilayer film as the p-side electrode 315, and achieved a sufficient current constriction property and long-term reliability. According to an evaluation performed by the TLM method as in the first embodiment, the contact resistance when the Ti/Pt/Au film was used was $7\times10^{-7}$ Ωcm$^2$, which value was almost equal to that of the first embodiment in which the Pt layer is the lowermost layer of the p-side electrode. However, this sixth embodiment using the Ti layer as the lowermost layer of the p-side electrode exhibited slightly superior adhesion of the electrode material and, advantageously, defects due to electrode peeloff during wire bonding were reduced accordingly.

Secondly, etching of the semiconductor layers 314, 313 and 312 (compositions that do not contain P, such as GaAs, AlGaAs, or InGaAs that was not used in the present embodiment) located above the semiconductor layer 311 in the process of forming the ridge structure 330 is selective etching against the semiconductor layer 311 that contains P as a crystalline material, and therefore, the degree of freedom in selecting the etchant was increased, and a forward mesa shape free from overhangs was more easily achieved. As a result, the problem of yield reduction attributed to the discontinuity due to overhangs (defective continuity) of the p-side electrode 315 was eliminated.

Thirdly, in comparison with an InGaP material that has a etching characteristic similar to that of the InGaAsP semiconductor layer 311 of this sixth embodiment, when InGaAsP is used, the difference |ΔEv| of Ev of the semiconductor layer from that of the GaAs substrate 301 is smaller than when InGaP is used, and therefore, the injection efficiency of holes into the quantum well active layer 306 can be greatly improved. For this reason, in this sixth embodiment, lower power-consumption operation by virtue of a reduced resistance and a reduced threshold current became possible, in comparison with the case where InGaP was used as the semiconductor layer material of the second upper cladding layer (provided that the other layers have the same constructions as the sixth embodiment). At this time, the P mole fraction y of the $In_{1-x}Ga_xAs_{1-y}P_y$ material is desirably $0.4 \leq y \leq 0.7$. By setting the P mole fraction within the aforementioned range, it became possible to employ the InGaAsP semiconductor layer as an etching stopper layer that has satisfactory etching selectivity while maintaining the injection efficiency of holes high. Further, by making the InGaAsP semiconductor layer have a thickness of not smaller than 50 Å, the layer became able to work sufficiently as a surface protection layer of the second upper cladding layer made of AlGaAs, and the current constriction property was further improved by setting its doping concentration to $1\times10^{17}$ cm$^{-3}$ or less. In order to prevent an unnecessary increase in the device resistance, the lower limit of the doping concentration of the InGaAsP semiconductor layer should preferably be not lower than $1\times10^{16}$ cm$^{-3}$. Moreover, in comparison with the GaAs material (Eg=1.4 eV) used in the first embodiment, the InGaAsP material of the semiconductor layer 311 (Eg=1.9 eV in this sixth embodiment) has a greater bandgap Eg. Therefore, the InGaAsP material does not become a photoabsorption component even though the emission wavelength of the semiconductor laser element has a shorter wavelength. Accordingly, there is an advantage that the factor of increasing the threshold current can be eliminated in the semiconductor laser element that oscillates at a wavelength of not longer than 700 nm.

Moreover, C (carbon) was used as the p-type dopant in the semiconductor laser element of this sixth embodiment. With this arrangement, the following two advantages are produced. First, a structure for concurrently achieving the current constriction property and the low contact resistance can stably be fabricated with good controllability since the diffusion of the dopant during the epitaxial growth is a little. By virtue of this advantage, the manufacturing yield was improved. If Zn is used as the p-type dopant, the doping concentration of each layer also influences the doping concentrations of the other layers due to the dopant diffusion during the epitaxial growth. Therefore, it is required to control the doping during the epitaxial growth in consideration of the doped state after the epitaxial growth, and the condition setting has sometimes become complicated in order to achieve the low contact resistance without reducing the current constriction property. In contrast, the doping profile during the growth was maintained substantially as it was as the result of the success in restraining the dopant diffusion by using C as the p-type dopant, and this facilitated designing of the device structure. Moreover, the C doping enabled a sufficiently low contact resistance to be obtained as described above even though the doping concentration of the p-side contact layer was reduced from $1\times10^{21}$ cm$^{-3}$ to $1\times10^{20}$ cm$^{-3}$. The other advantage that the device reliability was improved since the diffusion of the dopant during the operation of the semiconductor laser element was prevented. Use of Mg (magnesium) as the p-type dopant can produce effects similar to the effects obtained by the use of the C doping.

Figure 17:
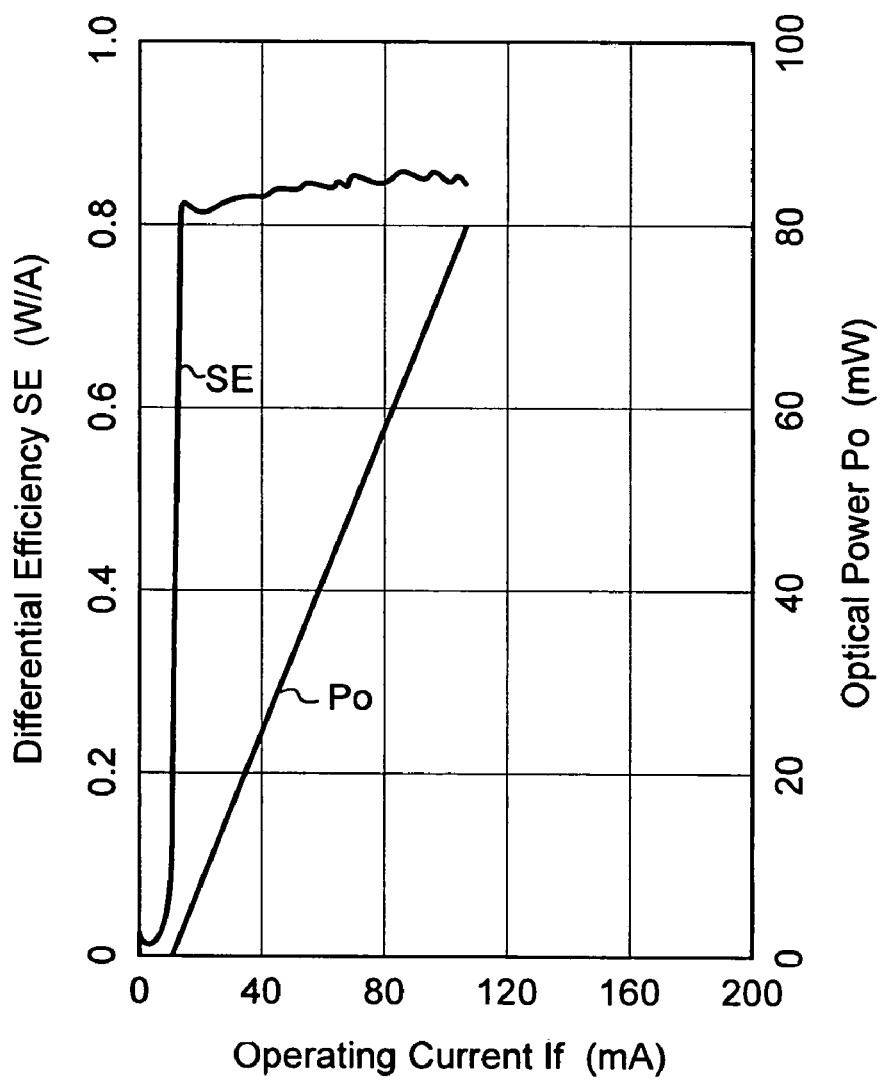
FIG. 17 is a graph showing the current-to-optical power characteristic of the semiconductor laser element of the sixth embodiment of the present invention.

FIG. 17 shows the current-to-optical power characteristic of the semiconductor laser element of the sixth embodiment. In this laser element, the laser oscillation threshold current Ith was 10.0 mA, the differential efficiency SE was 0.83 W/A and the operating current at an optical power of 50 mW was 69 mA (at an ambient temperature of 25° C.). Moreover, the COD (catastrophic optical destruction) level was not smaller than 200 mW. As is apparent, a laser of a low threshold value and a high power bearing comparison with the semiconductor laser element of the buried ridge structure was realized. Furthermore, stable operation for the duration of not shorter than 5000 hours was confirmed by a reliability test at 70° C. and 120 mW using the semiconductor laser element of this sixth embodiment, and it was discovered that the element had sufficient reliability for use in infrared communications.

Seventh Embodiment

Figure 18:
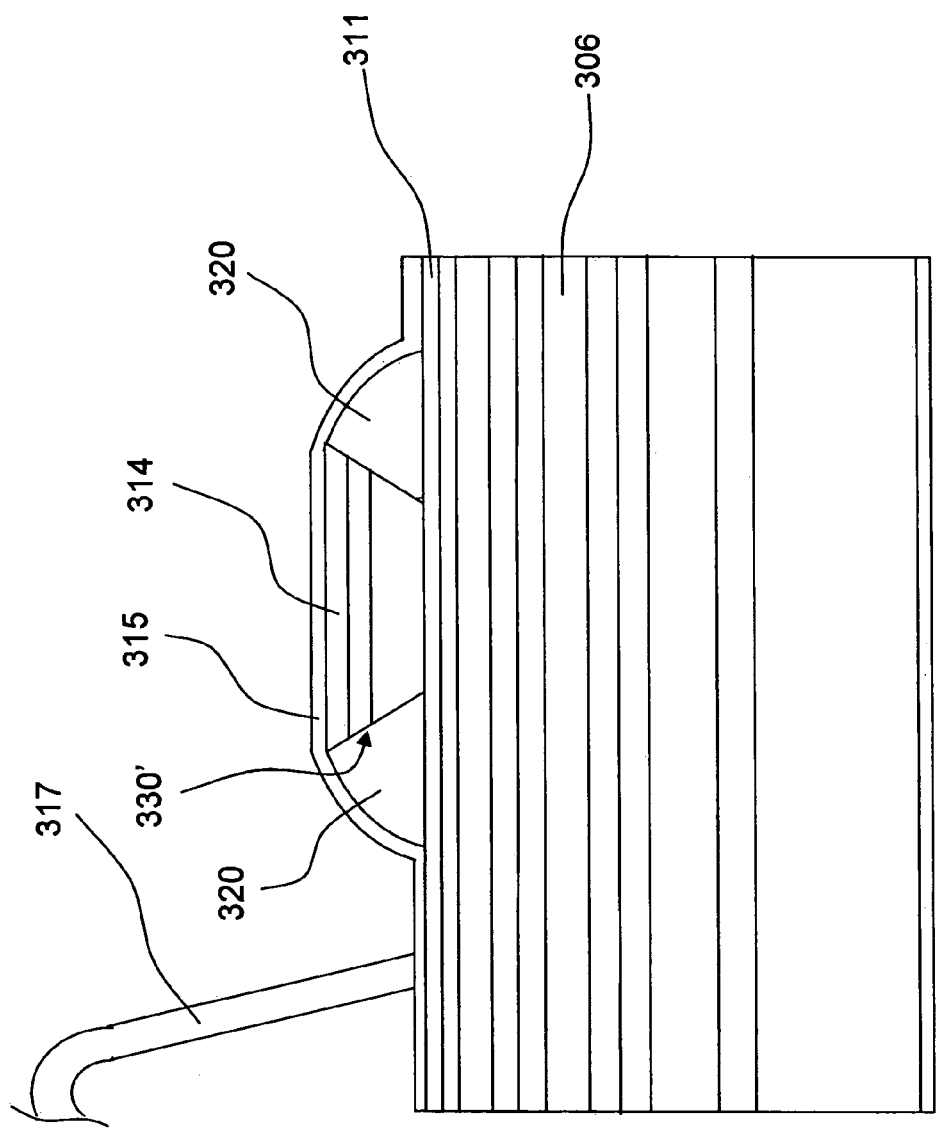
FIG. 18 is a schematic sectional view showing an exemplary structure of a modification of the semiconductor laser element of FIG. 14.

FIG. 18 is a schematic sectional view showing the structure of the semiconductor laser element of the seventh embodiment of the present invention, which is a modification example of the semiconductor laser element of the sixth embodiment. The semiconductor laser element of this seventh embodiment is an exemplary semiconductor laser element suitably modified so as to provide against the optical leakage to the p-side electrode 315, as in the embodiment of FIG. 7A.

The semiconductor laser element shown in FIG. 18 has a ridge structure 330' of a reverse mesa stripe shape in place of the ridge structure 330 of the forward mesa stripe shape. Polyimide resins 320 and 320 are provided as insulators in a striped manner along both sides of this ridge structure 330'. The polyimide resin 320 is located in a position surrounded by a side surface of the ridge structure 330', the upper surface of the p-type semiconductor layer 311 and the p-side electrode 315.

The ridge structure 330' of the reverse mesa shape suppresses the spread of a current injected from the p-side electrode 315 to the active layer 306 in comparison with the forward mesa ridge, whereby a reduction in the oscillation threshold current can be expected. However, when the p-side electrode 315 is formed so as to cover the ridge structure 330' of the reverse mesa shape, the p-side electrode 315 disadvantageously undergoes a cut or discontinuity between the top portion of the ridge structure 330' and the upper surface of the semiconductor layer 311 due to an overhang attributed to the reverse mesa shape. Moreover, optical leakage outwardly of the semiconductor layer 311 easily occurs in the vicinity of the ridge stripe-shaped structure due to the narrow width of the bottom portion of the ridge structure 330'. Accordingly, in this example, polyimide resins 320 and 320 as the insulator are provided in a stripe shape along both sides of the ridge structure 330'. As shown in FIG. 18, the polyimide resins 320 connect the p$^+$-GaAs contact layer 314 located at the top portion of the ridge structure 330' to the upper surface of the p-InGaAsP semiconductor layer 311 so as to make a gentle slope therebetween. Therefore, the p-side electrode 315 formed on them is prevented from being cut. Furthermore, by virtue of the filling polyimide resins 320 and 320 on both sides of the ridge structure 330', the optical leakage to the electrode 315 can be eliminated. Accordingly, neither increase in the threshold current attributed to the loss due to absorption nor a reduction in the differential efficiency were observed.

In the manufacturing process of this semiconductor laser element, by providing a resist mask in a stripe shape in the <011> direction in the photolithography process as described with reference to FIG. 15A, the ridge structure 330' is formed so as to extend in a stripe shape in the <011> direction. Then, upon the completion of the etching, the ridge structure 330' comes to have a reverse mesa shape as shown in FIG. 18. After the formation of the ridge structure 330' of the reverse mesa shape, a positive type photosensitive polyimide precursor is applied to a thickness of about 2 μm on the wafer by the spin coating method. After pre-baking at 80° C. for 30 minutes, a polyimide pattern is formed in a region of five micrometers in width beside the ridge structure by the photolithography technique using a mask. Subsequently, post-baking is carried out first at 300° C. for 30 minutes and then at 350° C. for 30 minutes for imidation (conversion to imide) of the precursor. In this stage, the thickness of the polyimide resins 320 and 320 becomes reduced by about 10% from the initial thickness in the application stage and comes to have a gentle cross-sectional configuration as shown in FIG. 18 with a height almost equalized to the height of the ridge structure 330' and rounded corners. Subsequently, Ti/Pt/Au films are deposited by the electron beam evaporation technique for the formation of the p-side electrode 315, as a result of which the structure shown in FIG. 18 is obtained.

The Au wire 317 for the electrical connection to the external circuit is bonded to the p-side electrode in a region where the polyimide resin 320 does not exist and where a Schottky junction is formed, similarly to the sixth embodiment shown in FIG. 14. With this arrangement, the electrode peeloff problem in the bonding stage is avoided.

The p-side electrode 315 is, of course, limited neither to the aforementioned Ti/Pt/Au based material nor to the Pt/Ti/Pt/Au based material of the first through third embodiments, and any material can be used so long as the contact resistance changes from the ohmic junction to the Schottky junction according to the doping concentration of the semiconductor layer. For example, Pd and Al or Cr and Mo can be used.

Eighth Embodiment

Figure 19:
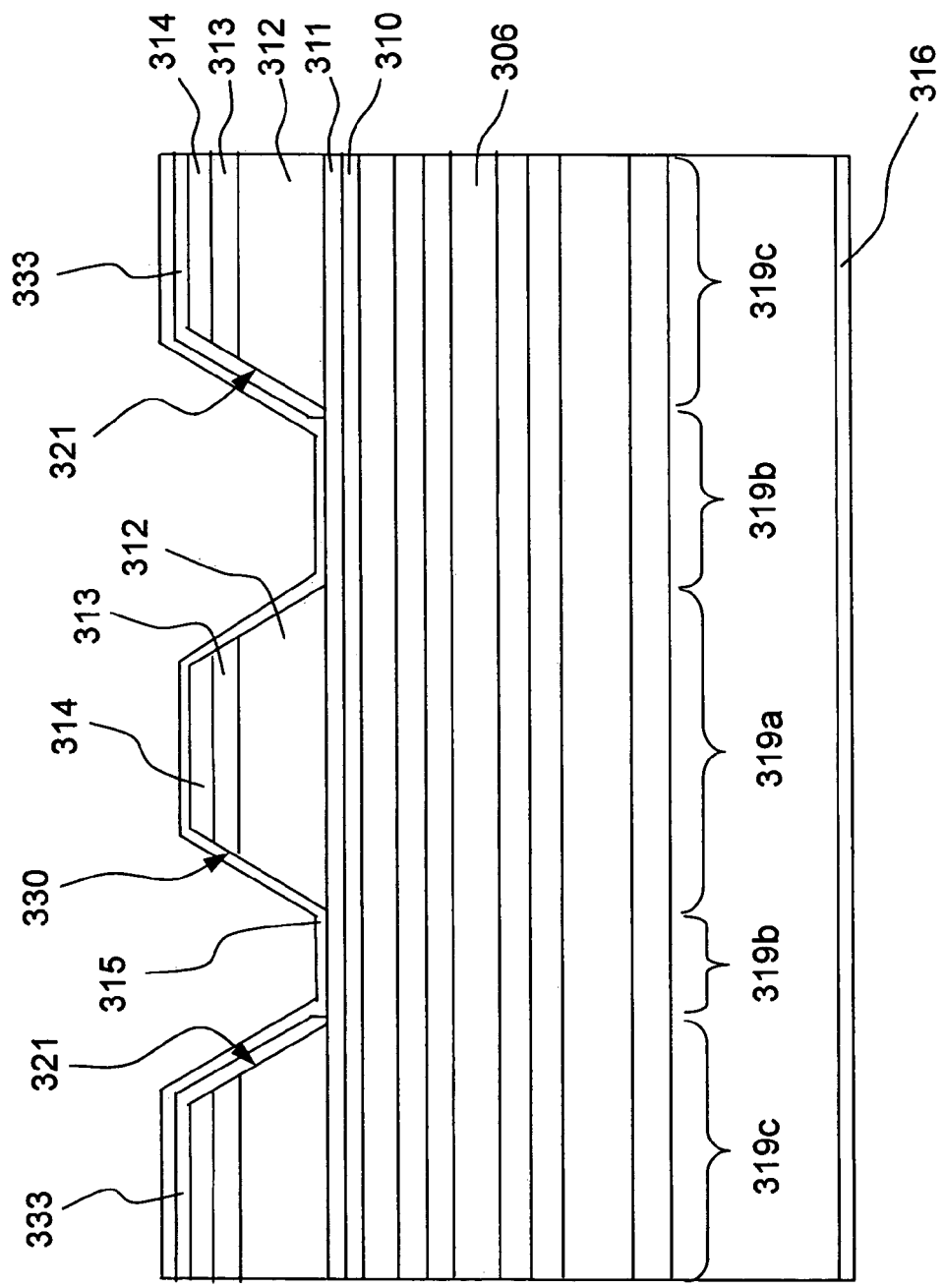
FIG. 19 is a schematic sectional view showing an exemplary structure of a semiconductor laser element according to an eighth embodiment of the present invention.

FIG. 19 shows the structure of a semiconductor laser element of an eighth embodiment of the present invention, which is an example of the semiconductor laser element of the sixth embodiment suitably modified to be adapted to the junction down mounting. In FIG. 19, reference numeral 319a denotes a ridge structure formation region, 319b denotes a mesa stripe outskirt region, and 319c denotes a stripe-shaped structure formation region.

The semiconductor laser element of this eighth embodiment has stripe-shaped structures 333 on both sides of the ridge structure 330. Each stripe-shaped structure 333 has semiconductor layers (p-Al$_{0.5}$Ga$_{0.5}$As third upper cladding layer 312, p-GaAs contact layer 313 and p$^+$-GaAs contact layer 314) same as those of the ridge structure 330, and an insulator 321 made of silicon nitride (SiN$_x$) is formed over the semiconductor layers to a thickness of 2000 Å. The uppermost portion of the stripe-shaped structure 333 is higher than that of the ridge structure 330 by thickness of the insulator 321. The p-side electrode 315 is provided on the ridge structure 330, the stripe-shaped structure 333 and the exposed surface of the semiconductor layer 311.

In the junction down mounting process, the semiconductor laser chip is die-bonded to a heat sink called the submount using a surface of the uppermost portion of each structure 333 as the bonding surface, instead of carrying out wire bonding. The chip mounted on the submount in the junction down manner is then mounted onto a stem, as a result of which the semiconductor laser element of this eighth embodiment is completed. By virtue of provision of the stripe-shaped structure 333 of which the uppermost portion is higher than the uppermost portion of ridge structure 330 on both sides of the ridge structure 330, damages to the ridge structure 330 can be prevented.

In the aforementioned eighth embodiment, by virtue of the insulator 321 inserted at the interface between the semiconductor layers that constitute the stripe-shaped structure 333 and the p-side electrode 315, a current is prevented from flowing from the p-side electrode 315 to the active layer 306 side via the stripe-shaped structure 333. Therefore, it becomes possible to provide a semiconductor laser element which is free from excessive leakage current, possesses a low threshold current value and is able to carry out the junction down mounting without damaging the ridge structure 330.

In this case, a current cutoff layer, which is constructed of a semiconductor layer as described in connection with the third embodiment, is of course not required.

Moreover, although the silicon nitride film was used as the insulator 321 in this eighth embodiment, silicon oxide can also be suitably used as a substitute for this. Advantageously, these insulators can be formed comparatively simply and are easy to process after the film formation and also excellent in reliability, as compared with organic insulator materials.

Moreover, the thickness of the insulator formed at the top of the stripe-shaped structure should preferably be 1000 Å or more in order to secure a difference in height from the ridge structure. However, also in consideration of tradeoff with the film formation time and a stress generated by an increased film thickness, the upper limit should preferably be not more than 2500 Å. The thickness was set to 2000 Å in this eighth embodiment, and an insulative property against the current leakage and the ridge structure protectability during the junction down mounting were sufficient.

In this eighth embodiment, no wire bonding is carried out beside the ridge structure. Accordingly, there is no need to offset the ridge structure, unlike the semiconductor laser element of the sixth embodiment. Conversely, it is rather desirable that the ridge structure is formed at the center of the chip so that a force is evenly applied to each of the two stripe-shaped structures beside the ridge structure.

Moreover, it is a matter of course that the constituents of each of the aforementioned embodiments can be interchanged.

Ninth Embodiment

Figure 20:
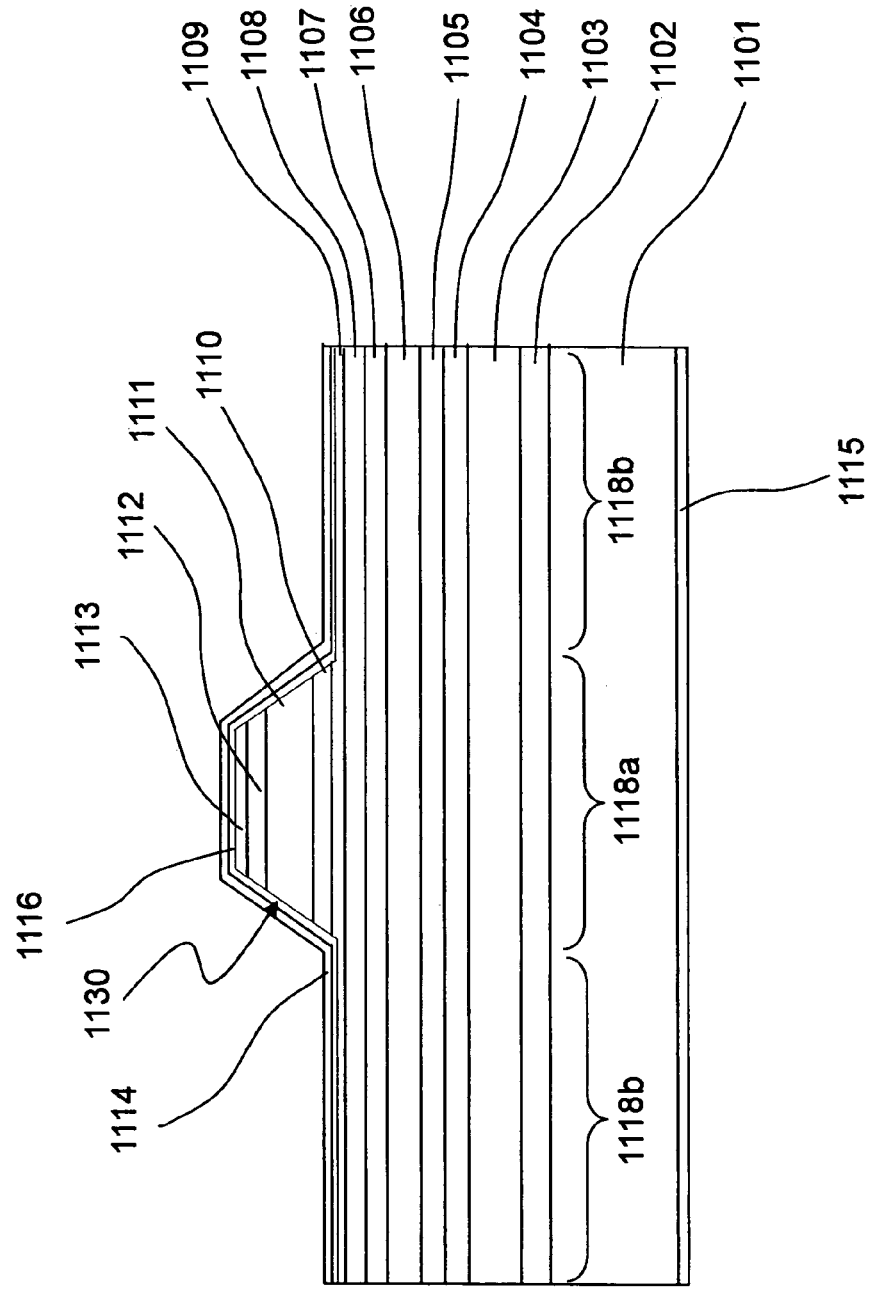
FIG. 20 is a schematic sectional view of a semiconductor laser element according to a ninth embodiment of the present invention, showing a section perpendicular to the stripe direction of the semiconductor laser element.

FIG. 20 shows the structure of a semiconductor laser element of the 780-nm band according to a ninth embodiment of the present invention. In this ninth embodiment, the first conductivity type is n-type, and the second conductivity type is p-type. In FIG. 20, components corresponding to the components in FIG. 1 are denoted by reference numerals obtained by adding a number 1000 to each of the reference numerals in FIG. 1.

In this semiconductor laser element, as shown in FIG. 20, an n-GaAs buffer layer 1102, an n-Al$_{0.453}$Ga$_{0.547}$As first lower cladding layer 1103, an n-Al$_{0.5}$Ga$_{0.5}$As second lower cladding layer 1104, an Al$_{0.4278}$Ga$_{0.5722}$As lower guide layer 1105, a multiple strained quantum well active layer 1106, an Al$_{0.4278}$Ga$_{0.5722}$As upper guide layer 1107, a p-Al$_{0.4885}$Ga$_{0.5115}$As first upper cladding layer 1108 and a p-Al$_{0.4885}$Ga$_{0.5115}$As second upper cladding layer 1109 that serves as one example of the low-concentration semiconductor layer are successively stacked on an n-GaAs substrate 1101. A p-GaAs etching stopper layer 1110, a p-Al$_{0.4885}$Ga$_{0.5115}$As third upper cladding layer 1111, a p-GaAs contact layer 1112 and a p$^+$-GaAs contact layer 1113 that serves as one example of the high-concentration semiconductor layer are provided on the second upper cladding layer 1109. The p-GaAs etching stopper layer 1110, the p-Al$_{0.4885}$Ga$_{0.5115}$As third upper cladding layer 1111, the p-GaAs contact layer 1112 and the p$^+$-GaAs contact layer 1113 constitute a ridge structure (mesa stripe portion) 1130 of a forward mesa stripe shape. A p-side electrode 1114, which is constructed of a multilayer metal thin film formed by stacking Pt/Ti/Pt/Au in this order, is provided on the top portion and the side surface portions of the ridge structure 1130 and an upper portion of the second upper cladding layer 1109. Further, formed at an interface between the p-side electrode 1114 and the semiconductor layers is a compound layer 1116 obtained by alloying Pt with each semiconductor layer material. Moreover, a multilayer metal thin film of AuGe/Ni/Au is formed as an n-side electrode 1115 on the back surface of the substrate 1101.

The p-AlGaAs first upper cladding layer 1108, the p-AlGaAs second upper cladding layer 1109, the p-GaAs etching stopper layer 1110, the p-AlGaAs third upper cladding layer 1111, the p-GaAs contact layer 1112 and the p$^+$-GaAs contact layer 1113 constitute a semiconductor layer stack of second conductivity type.

The manufacturing process steps and the processing conditions of this semiconductor laser element are the same as those of the first embodiment shown in FIGS. 2 and 3 except for the following points, and therefore, no detailed description is provided therefor.

One point of difference is that C was used as the p-type dopant in this ninth embodiment, while Zn was used in the first embodiment.

Another point of difference is that the Pt layer of the p-type electrode was formed to a thickness of 250 Å in this ninth embodiment, while the thickness was set to 200 Å in the first embodiment.

Another point of difference is that the heating temperature in the N$_2$ atmosphere after the formation of the electrode was set to 400° C. in this ninth embodiment, while the temperature was set to 390° C. in the first embodiment.

Figure 21:
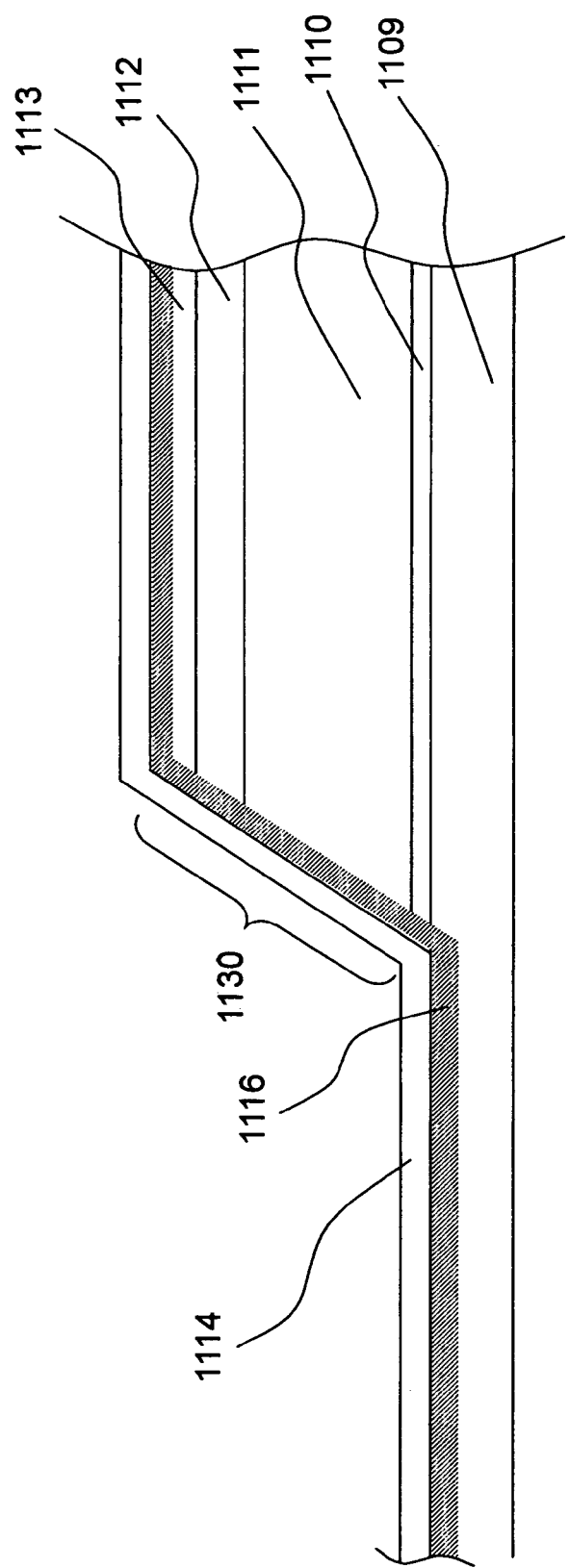
FIG. 21 is a schematic sectional view for explaining a compound layer made of alloyed Pt.

FIG. 21 is an enlarged schematic view for explaining a region where the compound layer 1116 is formed. The thickness of the compound layer 1116 is about 500 Å in the direction normal to the interface between the p-side electrode and the semiconductor layers. Therefore, the p-Al$_{00.4885}$Ga$_{0.5115}$As second upper cladding layer 1109 is less thick by about 500 Å in a region having no ridge structure 1130 thereon than in a region just under the ridge structure 1130.

Next, dividing of the substrate 1101 into bars of a desired cavity length (800 μm in this case) is performed, followed by the process steps of end surface coating and dividing the bars into chips (800 μm×250 μm). As a result, the semiconductor laser element of the ninth embodiment of the present invention is completed (FIG. 20).

In the semiconductor laser element of this ninth embodiment, the p-side electrode 1114 is formed on a plurality of semiconductor layers of different p-type doping concentrations. The p-side electrode 1114, which is constructed of Pt/Ti/Pt/Au, forms the compound layer 1116 by being alloyed with a GaAs based semiconductor material by a heat treatment at 350 to 450° C. This compound layer 1116 forms a satisfactory ohmic junction or forms a stable Schottky junction with an associated p-type semiconductor layer depending on the doping concentration of the p-type semiconductor layer. Taking advantage of this fact, in the semiconductor laser element of this ninth embodiment, a high concentration-side compound layer of Pt and GaAs for achieving a satisfactory ohmic junction is formed at an interface between the p-side electrode 1114 and the p$^+$-GaAs contact layer 1113 that serves as one example of the high-concentration semiconductor layer having a doping concentration of not lower than $1\times10^{18}$ cm$^{-3}$ in the ridge structure (mesa stripe portion) 1130. Also, a low concentration-side compound layer of Pt and AlGaAs exhibiting a stable Schottky junction property even in the energized stage is formed at an interface between the p-side electrode 1114 and the second upper cladding layer 1109 that serves as one example of the low-concentration semiconductor layer having a doping concentration of not higher than $1\times10^{17}$ cm$^{-3}$ in a mesa stripe outskirt region 1118b. Note that heat treatment at a temperature of 350° C. or lower will not cause a sufficient alloying reaction, whereas heat treatment at a temperature of 450° C. or higher will increase the contact resistance of the ohmic junction and also deteriorate the Schottky junction property. In the ninth embodiment, a heat treatment at 400° C. for one minute is applied according to the optimum conditions of the alloying process of AuGe/Ni/Au of the n-side electrode.

As described above, by forming the high concentration-side compound layer between the electrode and the semiconductor layer that has a doping concentration of not lower than $1\times10^{18}$ cm$^{-3}$ as the high-concentration semiconductor layer, a practically sufficient contact resistance can be obtained. In this case, if the doping concentration of the high-concentration semiconductor layer is set higher, as in the semiconductor laser element of the ninth embodiment, an ohmic junction that has a lower contact resistance is realized.

Moreover, as described later, by setting the doping concentration of the low-concentration semiconductor layer to $1\times10^{17}$ cm$^{-3}$ or less and forming the low concentration-side compound layer at the interface between the semiconductor layer and the electrode, current constriction with excellent reliability can be effected. The lower the doping concentration of the low-concentration semiconductor layer, the further the current constriction property can be improved. However, in carrying out crystal growth using the normal MOCVD method or MBE (molecular beam epitaxial) method, the lower limit of the concentration is limited to about $1\times10^{16}$ cm$^{-3}$ under the influence of the background impurities. Moreover, since the device resistance will disadvantageously be increased when the doping concentration is excessively lowered, it is better not to excessively lower the doping concentration of the low-concentration semiconductor layer from the above viewpoint, and it is proper to set the concentration within a range of not lower than $1\times10^{16}$ cm$^{-3}$ and not higher than $1\times10^{17}$ cm$^3$.

Furthermore, there is achieved successful restraint of the increase in the device resistance more than necessary by providing the first upper cladding layer 1108 of which the doping concentration is higher than that of the second upper cladding layer 1109 between the second upper cladding layer 1109 and the multiple strained quantum well active layer 1106 and optimizing the layer thickness of the first upper cladding layer 1108 and the second upper cladding layer 109. The layer thickness of the second upper cladding layer 1109 is set so as to become greater than the thickness of the compound layer 1116. In the present invention, the thickness of the compound layer 1116 is 500 Å (0.05 μm) in contrast to the layer thickness of 0.1 μm of the second upper cladding layer 1109. It is better for the compound layer 1116 to be not so thick since in order to effect sufficient current constriction, a semiconductor layer that has a doping concentration of not higher than $1\times10^{17}$ cm$^{-3}$ is needed just under the compound layer 1116. According to the examinations conducted by the inventors, the thickness of the compound layer 1116 is required to be 0.2 μm at maximum. If the thickness is made greater than the above value, the influence of the increase in the device resistance due to the increase in the thickness of the semiconductor layer that has the doping concentration of not higher than $1\times10^{17}$ cm$^{-3}$ will disadvantageously be increased.

As a result, the semiconductor laser element of this ninth embodiment achieved a satisfactory device resistance without performing a crystal regrowth process of the electrode contact layer and sufficient current constriction without performing a regrowth process for forming the filling current block layer.

The semiconductor laser element of this ninth embodiment was able to obtain the same current-to-optical power characteristic (see FIG. 5) and reliability as those of the semiconductor laser of the first embodiment. That is, the laser oscillation threshold current Ith was 27.3 mA, the differential efficiency SE was 0.93 W/A and the operating current If when the optical power Po was at 80 mW was 112 mA (at an ambient temperature of 25° C.). Moreover, stable operation for the duration of not shorter than 3000 hours was confirmed through pulse aging at 260-mW and 70° C.

Moreover, with regard to the optical characteristics, the laser element of this embodiment achieved a kink free output at a vertical radiation angle of 17.5 degrees and a transverse radiation angle of nine degrees until after not smaller than 300 mW was reached, similarly to the first embodiment. The degree of freedom in this optical design is owing to the division of the upper cladding layer into a plurality of layers including the second upper cladding layer 1109 that mainly takes charge of the current constriction by the Schottky junction and the first upper cladding layer 1108 assigned mainly to the adjustment of the optical characteristics. By setting the doping concentration of the second upper cladding layer 1109 that mainly takes charge of the current constriction by the Schottky junction to $1\times10^{17}$ cm$^{-3}$ or less and setting its layer thickness to as thin as possible within a range in which the thickness is thicker than that of the compound layer 1116, the increase in the device resistance due to the addition of the layer of a doping concentration of not higher than $1\times10^{17}$ cm$^{-3}$ is suppressed to a minimum.

With the above-mentioned arrangement, it has become possible to freely change the layer thickness, the chemical composition and so on of the first upper cladding layer 1108 according to demanded optical characteristic specifications without undergoing any restrictions regarding the Schottky junction property.

For optical disk uses that require a high power characteristic, the currents and voltages during operation are increased, and severer conditions are required with regard to the reliability, in comparison with the other uses. The Schottky junction defined between the p-side electrode 114 and the second upper cladding layer 109 between which the compound layer 1116 obtained by alloying Pt with AlGaAs was present, was very stable thermally and electrically and very effective in achieving long-term reliability.

The semiconductor laser element of this ninth embodiment uses C in place of a most popular Zn as the p-type dopant by the MOCVD method. Since the diffusion of the dopant to the second upper cladding layer 1109 that forms the Schottky junction from upper and lower layers can be reduced to an extremely low level by using C, reduction of the current constriction property due to the dopant diffusion is avoided, and this greatly contributes to the reduction in the variations during mass production and the improvement of the reliability during energization. Mg is also a material that can similarly lower the diffusion level during the MOCVD process. It is of course acceptable to use Zn similarly to the conventional case. Although C was used as the dopant since the crystal growth was carried out by using the MOCVD method in this ninth embodiment, similar effects can be obtained by using Mg as described above, or using Be if the MBE method is used.

Although the wavelength was set to 780 nm in the semiconductor laser element of this ninth embodiment, the present invention is not limited to this. For example, the present invention can be applied also to the InGaAlP/GaAs based semiconductor laser element of 650-nm wavelength band for DVD and the InGaN/GaN based semiconductor laser element of 405-nm wavelength band. Moreover, it is acceptable to dispose a semiconductor layer serving as, for example, a kind of interface protection layer, which is not specified in this ninth embodiment though, at the interface between semiconductor layers of different material systems. Moreover, although the wet etching method was used in forming the ridge structure in this ninth embodiment, it is, of course, acceptable to use the dry etching method. Furthermore, it is acceptable to form a ridge structure by combining the dry etching with the wet etching.

As is apparent from FIG. 6, a satisfactory Schottky junction free from the leakage current can be obtained so long as the doping concentration of the semiconductor layer joined to the p-side electrode is $1 \times 10^{17}$ cm$^{-3}$.

Moreover, comparison was made between the case where an InGaAsP protective layer was laid on a semiconductor layer having a doping concentration of $1 \times 10^{17}$ cm$^{-3}$ and the case where the semiconductor layer was exposed. As a result, it can be understood from FIG. 16 that the leakage current can be made smaller when the protective layer is provided, although the leakage current is sufficiently small in either case.

Tenth Embodiment

Figure 22:
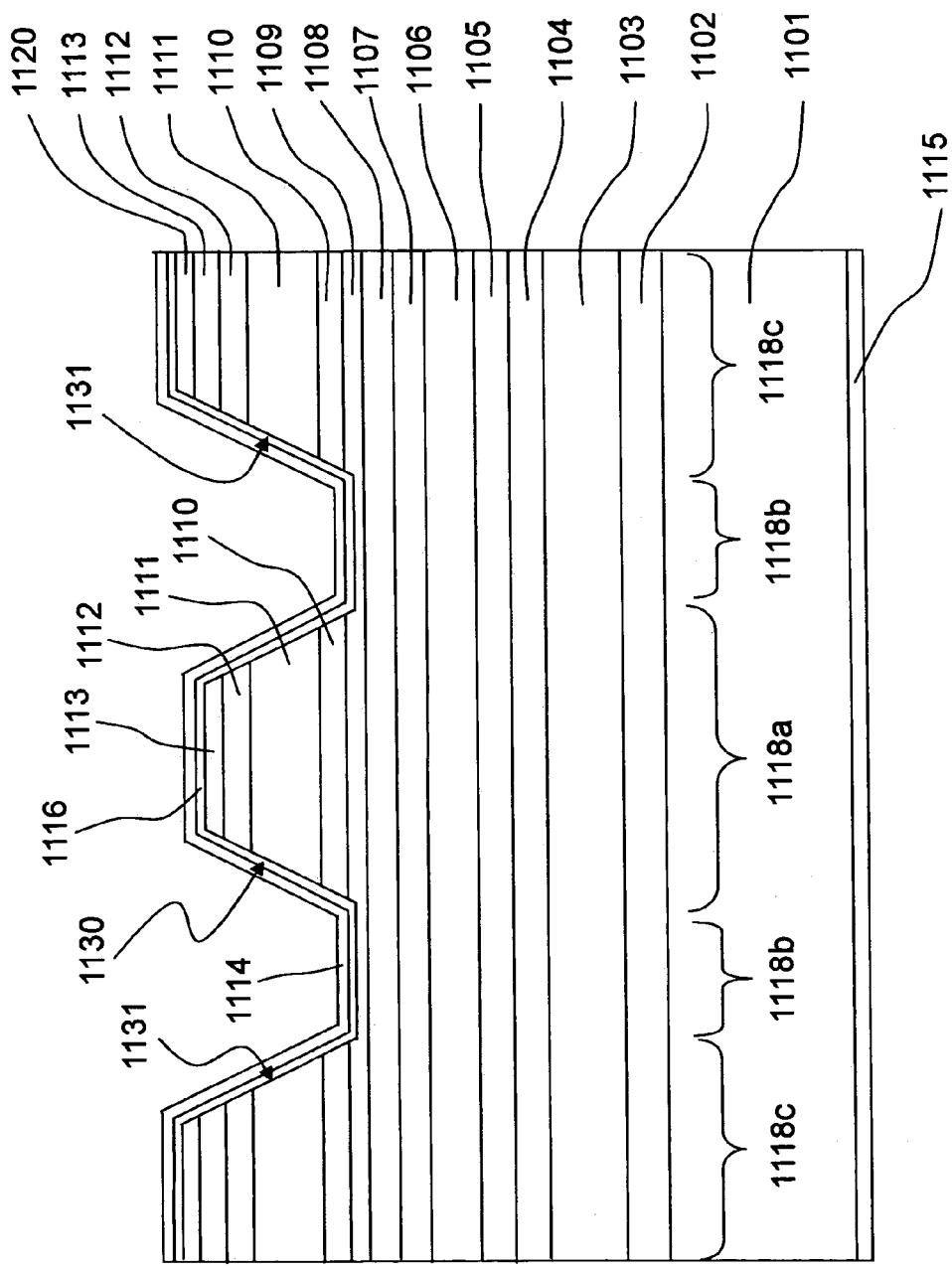
FIG. 22 is a schematic sectional view of a semiconductor laser element according to a tenth embodiment of the present invention, showing a section perpendicular to the stripe direction of the laser element.

FIG. 22 is a schematic sectional view showing the structure of a semiconductor laser element of the 780-nm band according to a tenth embodiment of the present invention, in which a preferred modification of the semiconductor laser element of the ninth embodiment is shown. This tenth embodiment differs from the semiconductor laser element of the ninth embodiment in that stripe-shaped structures 1131 are provided on both sides of the ridge structure 1130. The tenth embodiment is characterized by use of the junction down mounting in which the laser element is die bonded by using a portion on top of the stripe-shaped structure 1131 of the p-side electrode as a bonding surface, and in this respect the tenth embodiment resembles the third embodiment. Therefore, in FIG. 22, components corresponding to the components in FIG. 9 are denoted by reference numerals obtained by adding a number 1000 to each of the reference numerals in FIG. 9.

The following will describe particularly the construction and the manufacturing method of the stripe-shaped structures 1131 formed on both sides of the ridge structure 130, and no particular description will be provided for the components in common with the ninth embodiment.

The semiconductor laser element of this tenth embodiment, similarly to the ninth embodiment, has an n-GaAs buffer layer 1102, an n-Al$_{0.453}$Ga$_{0.547}$As first lower cladding layer 1103, an n-Al$_{0.5}$Ga$_{0.5}$As second lower cladding layer 1104, an Al$_{0.4278}$Ga$_{0.5722}$As lower guide layer 1105, a multiple strained quantum well active layer 1106, an Al$_{0.4278}$Ga$_{0.5722}$As upper guide layer 1107, a p-Al$_{0.4885}$Ga$_{0.5115}$As first upper cladding layer 1108 and a p-Al$_{0.4885}$Ga$_{0.5115}$As second upper cladding layer 1109 that serves as one example of the low-concentration semiconductor layer, which are successively stacked in this order on an n-GaAs substrate 1101. A p-GaAs etching stopper layer 1110, a p-Al$_{0.4885}$Ga$_{0.5115}$As third upper cladding layer 1111, a p-GaAs contact layer 1112 and a p$^{+}$-GaAs contact layer 1113 that serves as one example of the high-concentration semiconductor layer are provided on the second cladding layer 1109 so as to form a ridge structure (mesa stripe portion) 1130 of a forward mesa stripe shape. On the other hand, in addition to the p-GaAs etching stopper layer 1110, the p-Al$_{0.4885}$Ga$_{0.5115}$As third upper cladding layer 1111, the p-GaAs contact layer 1112 and the p$^{+}$-GaAs contact layer 1113, a p-InGaP current cutoff layer 1120 (the current cutoff layer 120 in the third embodiment is made of p-AlGaAs) that serves as one example of the second low-concentration semiconductor layer is also formed for the ridge structures 1131. Further, a p-side electrode 1114 of a multilayer metal thin film, which is formed by stacking Pt/Ti/Pt/Au in this order, is provided on the top portion and the side surface portions of the ridge structure (mesa stripe portion) 1130, the upper portion of the second upper cladding layer 1109 and the periphery of the stripe-shaped structures 1131. Further, formed at an interface between the p-side electrode 1114 and the semiconductor layers is a compound layer 1116 obtained by alloying Pt with each semiconductor layer material. Moreover, as in the ninth embodiment, a multilayer metal thin film of AuGe/Ni/Au is formed as an n-side electrode 1115 on the back surface of the substrate 1101.

This semiconductor laser element of the tenth embodiment is fabricated as follows. The schematic sectional views of the semiconductor laser element during the manufacturing process steps of this embodiment are similar to the schematic sectional views during the manufacturing process steps of the third embodiment shown in FIGS. 10A through 10C Thus, reference is made to FIGS. 10A through 10C in the following description as necessary. In that case, the reference numerals shown in FIGS. 10A through 10C are to be read as 1000-added numerals.

First, the n-GaAs buffer layer 1102, the n-Al$_{0.453}$Ga$_{0.547}$As first lower cladding layer 1103, the n-Al$_{0.5}$Ga$_{0.5}$As second lower cladding layer 1104, the Al$_{0.4278}$Ga$_{0.5722}$As lower guide layer 1105, the multiple strained quantum well active layer 1106, the Al$_{0.4278}$Ga$_{0.5722}$As upper guide layer 1107, the p-Al$_{0.4885}$Ga$_{0.5115}$As first upper cladding layer 1108, the p-Al$_{0.4885}$Ga$_{0.5115}$As second upper cladding layer 1109 (layer thickness: 0.1 μm, C doping concentration: $1 \times 10^{17}$ cm$^{-3}$), the p-GaAs etching stopper layer 1110 (layer thickness: 30 Å, C doping concentration: $2 \times 10^{18}$ cm$^{-3}$), the p-Al$_{0.4885}$Ga$_{0.5115}$As third upper cladding layer 1111 (layer thickness: 1.28 μm, C doping concentration: $2.7 \times 10^{18}$ cm$^{-3}$), the p-GaAs contact layer 1112 (layer thickness: 0.2 μm, C doping concentration: $3.3 \times 10^{18}$ cm$^{-3}$), the p$^+$-GaAs contact layer 1113 (layer thickness: 0.3 μm, C doping concentration: $1 \times 10^{21}$ cm$^{-3}$) and the p-InGaP current cutoff layer 1120 (layer thickness: 0.2 μm, C doping concentration: $1 \times 10^{17}$ cm$^{-3}$) are successively crystal-grown on the (100) face of the n-GaAs substrate 1101 by the MOCVD method.

Next, as shown in FIG. 10A, a resist mask 1121 for etching is formed in the stripe-shaped structure formation regions 1118c where the stripe-shaped structures 1131 (shown in FIG. 22) are to be formed. The p-InGaP current cutoff layer 1120 in regions other than the stripe-shaped structure formation regions is removed by etching using a mixed aqueous solution of hydrochloric acid and phosphoric acid mixed at a ratio of 1:3. At this time, selective etching can be similarly carried out only with hydrochloric acid without adding phosphoric acid.

After the resist mask 1120 is removed, as shown in FIG. 10B, a new resist mask 1122 is formed in the ridge structure formation region 1118a where the ridge structure 1130 is to be formed and the stripe-shaped structure formation regions 1118c where the stripe-shaped structures 1131 are to be formed, and unnecessary semiconductor layers are removed by etching using a mixed aqueous solution of sulfuric acid and a hydrogen peroxide solution, hydrofluoric acid, and a mixed aqueous solution of ammonia and a hydrogen peroxide solution.

Subsequently, as shown in FIG. 10C, the p-side electrode 1114 of a multilayer metal thin film is formed by stacking Pt/Ti/Pt/Au layers in this order using the electron beam evaporation technique such that the electrode continuously covers the top portion and the side surface portions of the ridge structure 1130 and the surfaces of the second upper cladding layer 1109 (regions 1118b) and of the stripe-shaped structure 1131.

Next, the substrate 1101 is processed to have a desired thickness, and thereafter, an n-side electrode is formed similarly to the ninth embodiment. Subsequently, division of the wafer into bars, end surface coating of the bars, and division of the bars into chips are carried out. Thereafter, in the semiconductor laser element of this tenth embodiment, the junction down mounting of the laser element is carried out, whereby surface portions of the p-side electrode 1114 located on top of the stripe-shaped structures 1131 are bonded to a stem (not shown) as one example of the support.

The semiconductor laser element of the tenth embodiment has all the functions, effects and advantages described in connection with the third embodiment.

Although the example using InGaP as the current cutoff layer has been described in connection with the aforementioned ninth embodiment, InGaAsP and AlGaAs can alternatively be suitably used. Even when these materials are used, sufficient current cutoff can be effected by setting the doping concentration to $1 \times 10^{17}$ cm$^{-3}$ or less. When InGaAsP is used, satisfactory selective etching can be carried out with a mixed aqueous solution of hydrochloric acid and phosphoric acid or even with hydrochloric acid only, similarly to the manufacturing method of this tenth embodiment. On the other hand, when AlGaAs is used as the current cutoff layer, hydrofluoric acid is appropriate as a selective etchant, which is used also in the third embodiment.

Eleventh Embodiment

Figure 23:
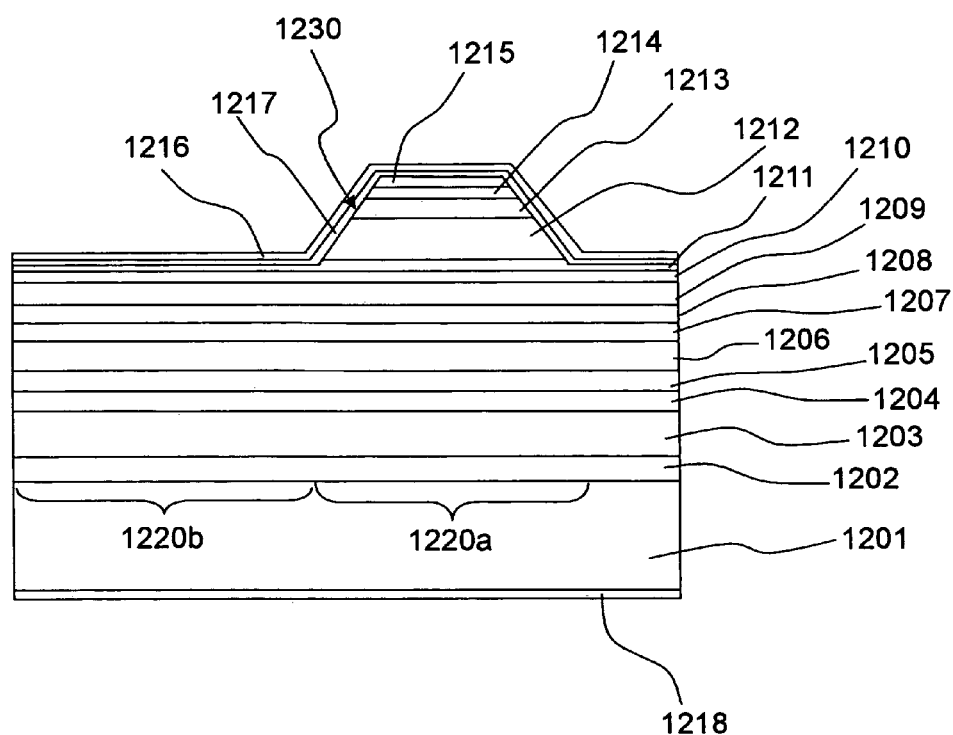
FIG. 23 is a schematic sectional view of a semiconductor laser element according to an eleventh embodiment of the present invention, showing a section perpendicular to the stripe direction of the laser element.

FIG. 23 shows the structure of a semiconductor laser element of an eleventh embodiment of the present invention. In this eleventh embodiment, the first-conductivity-type is n-type, and the second-conductivity-type is p-type.

As shown in FIG. 23, this semiconductor laser element has an n-GaAs buffer layer 1202, an n-Al$_{0.5}$Ga$_{0.5}$As first lower cladding layer 1203, an n-Al$_{0.422}$Ga$_{0.578}$As second lower cladding layer 1204, an Al$_{0.25}$Ga$_{0.75}$As lower guide layer 1205, a multiple strained quantum well active layer 1206, an Al$_{0.25}$Ga$_{0.75}$As first upper guide layer 1207, a p-Al$_{0.4}$Ga$_{0.6}$As second upper guide layer 1208, a p-Al$_{0.456}$Ga$_{0.544}$As first upper cladding layer 1209, a p-Al$_{0.456}$Ga$_{0.544}$As second upper cladding layer 1210 and a p-In$_{0.1568}$Ga$_{0.8432}$As$_{0.4}$P$_{0.6}$ semiconductor layer 1211 that serves as one example of the low-concentration semiconductor layer, which layers are successively stacked in this order on an n-GaAs substrate 1201. A p-Al$_{0.5}$Ga$_{0.5}$As third upper cladding layer 1212, a p-GaAs contact layer 1213, a p$^+$-In$_x$Ga$_{1-x}$As graded layer 1214 (x=0→0.5) and a P$^+$-In$_{0.5}$Ga$_{0.5}$As contact layer 1215 that serves as one example of the high-concentration semiconductor layer are provided on the semiconductor layer 1211. The p-Al$_{0.5}$Ga$_{0.5}$As third upper cladding layer 1212, the p-GaAs contact layer 1213, the p$^+$-In$_x$Ga$_{1-x}$As graded layer 1214 and the p$^+$-In$_{0.5}$Ga$_{0.5}$As contact layer 1215 constitute a ridge structure (mesa stripe portion) of a forward mesa stripe shape. There is provided a p-side electrode 1216 constructed of a multilayer metal thin film formed by stacking Ti/Pt/Au in this order at the top portion and the side surface portions of the ridge structure 1230 and the upper portion of the semiconductor layer 1211. Further, formed at an interface between the p-side electrode 1216 and the semiconductor layers is a compound layer 1217 obtained by alloying Ti with each semiconductor layer material. In detail, a high concentration-side compound layer of Ti and InGaAs providing a satisfactory ohmic junction is formed at an interface between the p-side electrode 1216 and the p$^+$-In$_{0.5}$Ga$_{0.5}$As contact layer 1215 that serves as one example of the high-concentration semiconductor layer having a doping concentration of not lower than $1 \times 10^{18}$ cm$^{-3}$ in the ridge structure (mesa stripe portion) 1230, and a low concentration-side compound layer of Ti and InGaAsP that exhibits a stable Schottky junction property even during energization is formed at an interface between the p-side electrode 1216 and the p-In$_{0.1568}$Ga$_{0.8432}$As$_{0.4}$P$_{0.6}$ semiconductor layer 1211 that serves as one example of the low-concentration semiconductor layer having a doping concentration of not higher than $1 \times 10^{17}$ cm$^{-3}$ in mesa stripe outskirt regions 1220b. A multilayer metal thin film of AuGe/Ni/Au is formed as an n-side electrode 1218 on the back surface of the substrate 1201.

The p-AlGaAs second upper guide layer 1208, the p-AlGaAs first upper cladding layer 1209, the p-AlGaAs second upper cladding layer 1210, the p-InGaAsP semiconductor layer 1211, the p-AlGaAs third upper cladding layer 1212, the p-GaAs contact layer 1213, the p$^+$-InGaAs graded layer 1214 and the p$^+$-InGaAs contact layer 1215 constitute a stack of semiconductor layers of second conductivity type.

The manufacturing method of the above-mentioned semiconductor laser element will be described next with reference to FIGS. 24 through 26.

Figure 24:
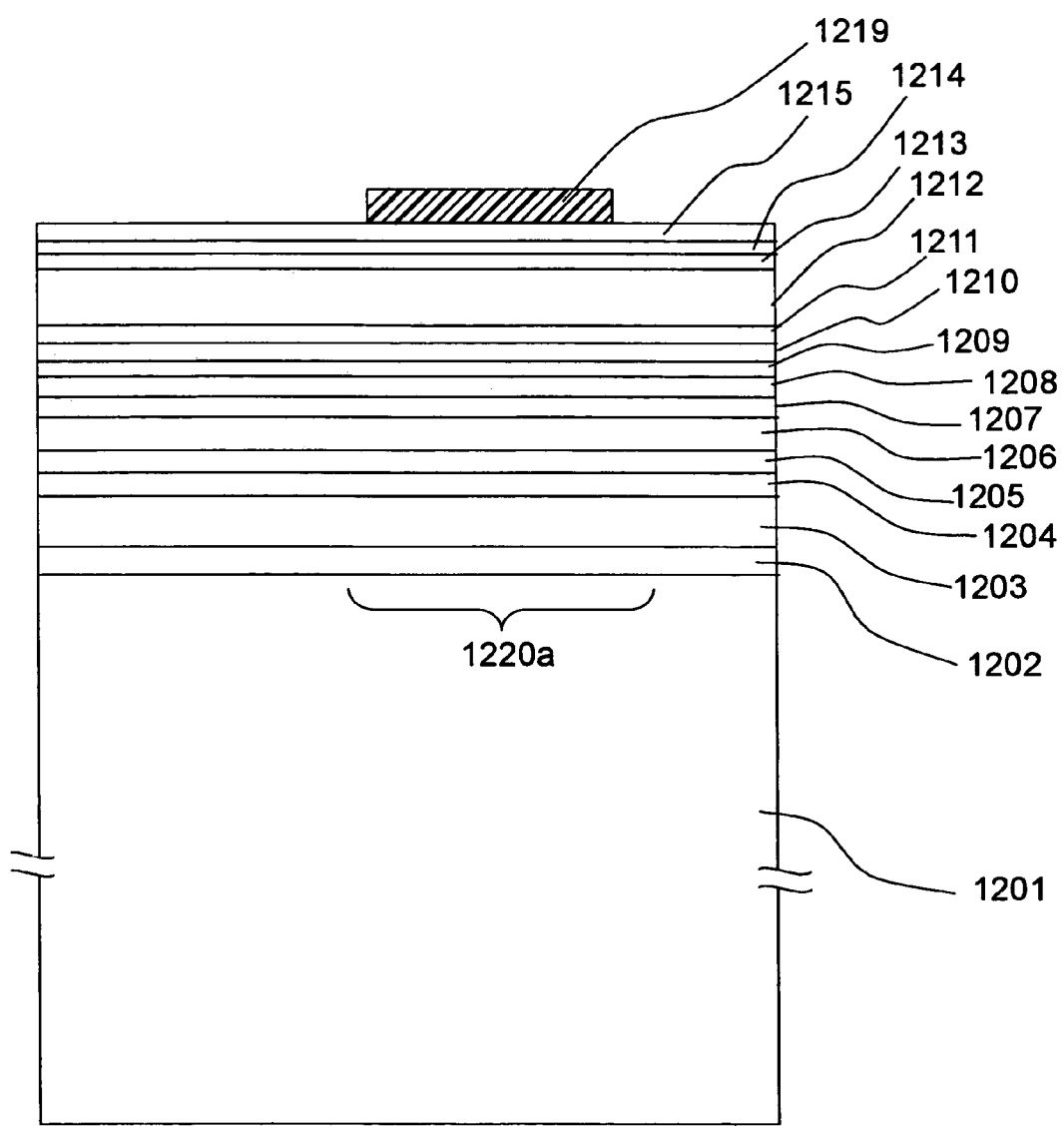
FIGS. 24, 25 and 26 are schematic sectional views for explaining the manufacturing process steps of the semiconductor laser element of the eleventh embodiment.

First, as shown in FIG. 24, the n-GaAs buffer layer 1202 (layer thickness: 0.5 μm, Si doping concentration: $7.2 \times 10^{17}$ cm$^{-3}$), the n-Al$_{0.5}$Ga$_{0.5}$As first lower cladding layer 1203 (layer thickness: 2 μm, Si doping concentration: $5.4 \times 10^{17}$ cm$^{-3}$), the n-Al$_{0.422}$Ga$_{0.578}$As second lower cladding layer 1204 (layer thickness: 0.1 μm, Si doping concentration: $5.4 \times 10^{17}$ cm$^{-3}$), the Al$_{0.25}$Ga$_{0.75}$As lower guide layer 1205 (layer thickness: 30 Å), the multiple strained quantum well active layer 1206, the Al$_{0.25}$Ga$_{0.75}$As first upper guide layer 1207 (layer thickness: 30 Å), the p-Al$_{0.4}$Ga$_{0.6}$As second upper guide layer 1208 (layer thickness: 0.1 μm, Mg doping concentration: $1.35 \times 10^{18}$ cm$^{-3}$), the p-Al$_{0.456}$Ga$_{0.544}$As first upper cladding layer 1209 (layer thickness: 0.4 μm, Mg doping concentration: $1.35 \times 10^{18}$ cm$^{-3}$), the p-Al$_{0.456}$Ga$_{0.544}$As second upper cladding layer 1210 (layer thickness: 0.1 μm, Mg doping concentration: $1 \times 10^{17}$ cm$^{-3}$), the p-In$_{0.1568}$Ga$_{0.8432}$As$_{0.4}$P$_{0.6}$ semiconductor layer 1211 (layer thickness: 150 Å, Mg doping concentration: $1 \times 10^{17}$ cm$^{-3}$), the p-Al$_{0.4885}$Ga$_{0.5115}$As third upper cladding layer 1212 (layer thickness: 1.28 μm, Mg doping concentration: $2.4 \times 10^{18}$ cm$^{-3}$), the p-GaAs contact layer 1213 (layer thickness: 0.2 μm, Mg doping concentration: $3 \times 10^{18}$ cm$^{-3}$), the p$^+$-In$_x$Ga$_{1-x}$As graded layer 1214 (layer thickness: 500 Å, x=0→0.5, Mg doping concentration: $1 \times 10^{20}$ cm$^{-3}$) and the p$^+$-In$_{0.5}$Ga$_{0.5}$As contact layer 1215 (layer thickness: 0.1 μm, Mg doping concentration: $1 \times 10^{20}$ cm$^{-3}$) are successively crystal-grown on the (100) face of the n-GaAs substrate 1201 by the MOCVD method. The multiple strained quantum well active layer 1206 is constructed by alternately arranging In$_{0.1001}$Ga$_{0.8999}$As compressively strained quantum well layers (strain: 0.7%, layer thickness: 46 Å, two layers) and In$_{0.238}$Ga$_{0.762}$As$_{0.5463}$P$_{0.4537}$ barrier layers (strain: 0.1%, Eg≈1.60 Ev, three layers of layer thicknesses: 215 Å, 79 Å and 215 Å from the substrate side, the layer nearest to the substrate 1201 serves as an n-side barrier layer and the layer farthest from the substrate serves as a p-side barrier layer).

Next, in FIG. 24, a resist mask 1219 (mask width: 4.5 μm) is produced by a photolithography process in a ridge structure formation region 1220a where the ridge structure (mesa stripe portion) 1230 is to be formed. This resist mask 1219 is formed so as to extend in the <0-11> direction.

Figure 25:
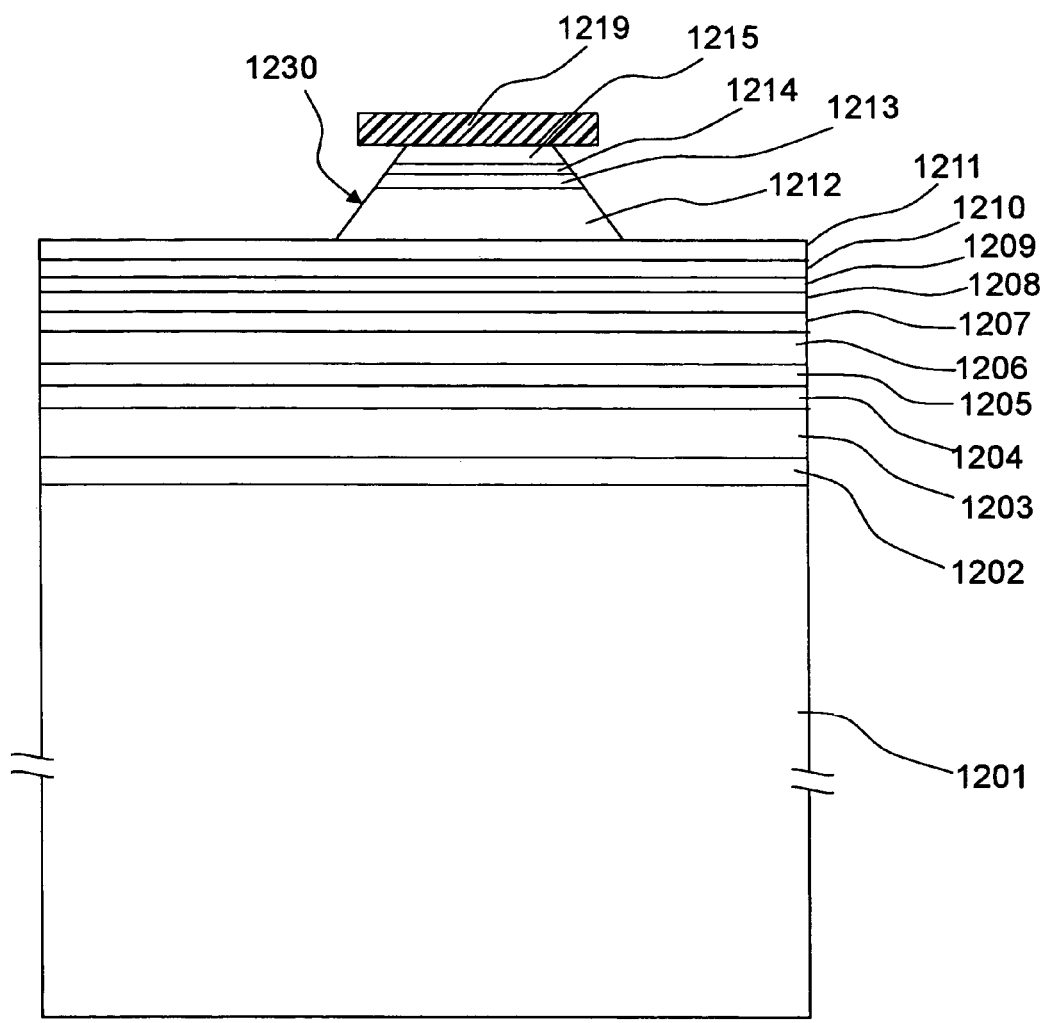

Next, as shown in FIG. 25, portions not covered by the resist mask 1219 are removed by etching, whereby the ridge structure (mesa stripe portion) 1230 is formed. The etching is carried out with a mixed aqueous solution of sulfuric acid and a hydrogen peroxide solution until the p-InGaAsP semiconductor layer 1211 is exposed, and then the shape of the ridge structure is adjusted to the forward mesa shape with hydrofluoric acid and a mixed aqueous solution of ammonia and a hydrogen peroxide solution so that the GaAs contact layer 1213 and the InGaAs graded layers 1214 and 1215 do not come to have an overhang configuration with respect to the p-AlGaAs third upper cladding layer 1212. The etching depth is 1.63 μm, and the width of the lowermost portion of the ridge structure 1230 is about 3.5 μm. After the etching ends, the resist mask 1219 is removed.

Figure 26:
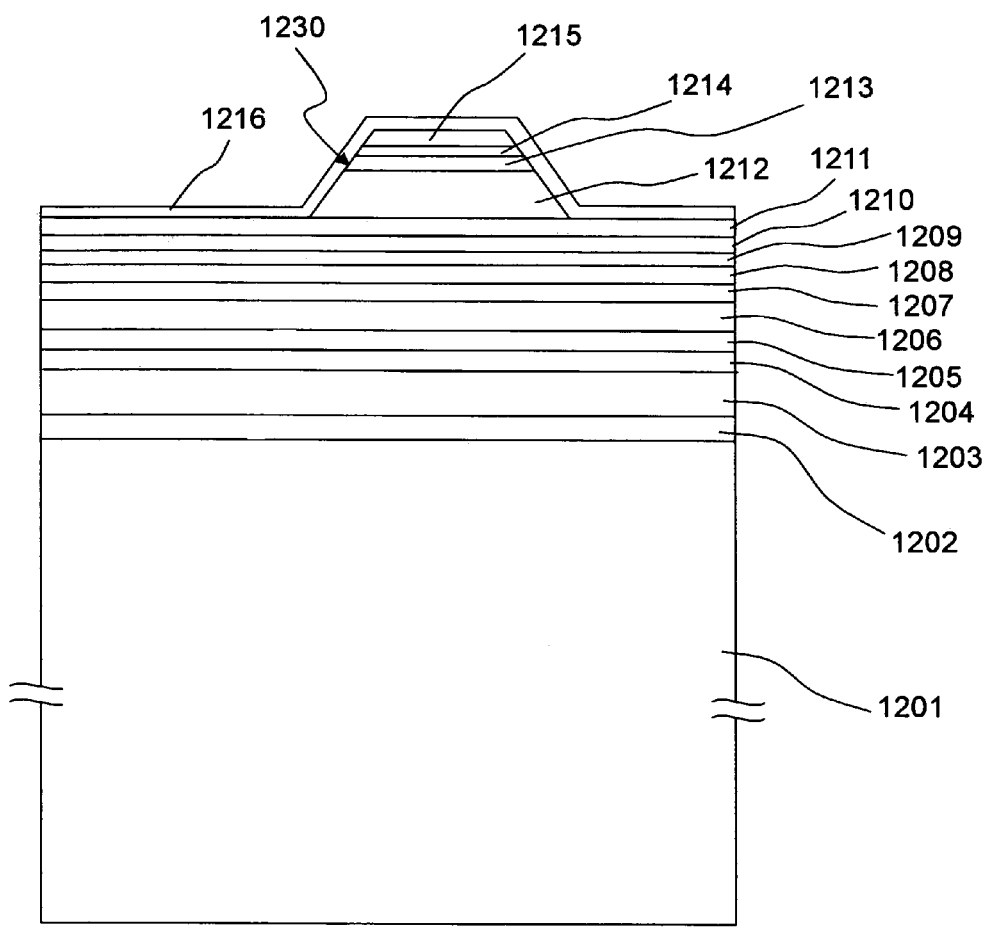

Subsequently, as shown in FIG. 26, the p-side electrode 216 is formed by stacking metal thin films of Ti (1000 Å)/Pt (500 Å)/Au (4000 Å) in this order by using the electron beam evaporation method.

Thereafter, the substrate 1201 is ground at the back surface side to a desired thickness (about 100 μm in this case) by lapping. Then, an AuGe alloy (Au: 88%, Ge: 12%) is formed on the back surface to a thickness of 1000 Å and subsequently Ni (150 Å) and Au (3000 Å) are stacked thereon by using the resistance heating deposition method to form the n-side electrode 1218. Subsequently, the Ti and AuGe/Ni material is subjected to an alloying process by being heated at 390° C. for one minute in an N$_2$ atmosphere.

Subsequently, the substrate 1201 is divided into a plurality of bars of a desired cavity length (500 μm in this case), and thereafter, the bars are subjected to end surface coating. The bars are divided into chips (500 μm×200 μm). As a result, the semiconductor laser element shown in FIG. 23 of the eleventh embodiment of the present invention is completed.

The semiconductor laser element of this eleventh embodiment is a semiconductor laser element for infrared communications at a wavelength of 890 nm. No description will be provided as to features similar to the eleventh embodiment, and only differences will be described below.

In this eleventh embodiment, the multilayer metal thin film of Ti/Pt/Au is employed as the p-side electrode 1216, and the alloying reaction is caused between Ti and semiconductor layers by carrying out heat treatment after the formation of the electrode. If Ti is heated to about 400° C. after being formed by deposition on semiconductor layers, then an oxide layer formed at surfaces of the semiconductor layers during the manufacturing process is removed, and a stable Schottky junction can be obtained with the low-concentration semiconductor layer of a doping concentration of not higher than $1 \times 10^{17}$ cm$^{-3}$. If Ti is formed on the InGaAsP layer of this eleventh embodiment or the AlGaAs layer of the first embodiment and appropriately heated, then a Schottky junction, which is particularly stable thermally and electrically, can be obtained. This is presumably ascribed to a very thin Ti alloyed layer formed at the interface between the electrode and the semiconductor layer. Such a stable Schottky junction was not obtained when the heat treatment was not carried out.

Moreover, regarding the GaAs and InGaAs layers doped to a concentration of not lower than $1 \times 10^{18}$ cm$^{-3}$, a low contact resistance can be achieved by the formation of a TiAs layer in addition to the aforementioned oxide layer removal effect.

A heat treatment temperature appropriate for these reactions is not lower than 350° C. but not higher than 430° C. When the temperature is lower than 350° C., the alloying reaction to generate a compound layer is not sufficiently promoted, and when the temperature exceeds 430° C., the contact resistance gradually deteriorates at the ohmic junction. The deterioration in the resistance at a temperature of not lower than 430° C. is presumably ascribed to the generation of a Ti$_1$Ga$_{1-x}$ layer and the mixing of metal materials of upper layers on or above Ti. In the eleventh embodiment as well, heat treatment was carried out at 390° C. for one minute in consideration of the optimum heat treatment condition of the AuGe/Ni/Au electrode material on the back surface side.

As in this eleventh embodiment, by providing the semiconductor layer 1211 that contains at least In and P on the AlGaAs second upper cladding layer 1210 and using the semiconductor layer 1211 as an etching stopper layer during the ridge formation, the manufacturing variation in the element manufacturing stage is reduced, and it becomes possible to easily obtain a semiconductor laser element that has stable element characteristics.

Particularly, because it is not the AlGaAs second upper cladding layer 1210 but the InGaAsP layer containing no Al that is exposed, a deep level, which is often observed in AlGaAs exposed to the atmosphere, is prevented from occurrence, and the surface recombination is also restrained. Accordingly, there is an effect that the reliability during element operation is greatly improved. This effect can also be similarly obtained with InGaP that does not contain Al. However, when InGaP is used, there is a disadvantage that the hole injection efficiency into the active layer is reduced because there is no room for the compositional modification since the mole fraction of In which is lattice matched to GaAs is uniquely determined and ΔEv that operates as a barrier on the hole side is great. When InGaAsP is used, the degree of freedom in selecting the composition is great, and the hole injection efficiency can be improved further than in the case of InGaP.

In the semiconductor laser element of this eleventh embodiment, the oscillation threshold current Ith was 10.0 mA, the differential efficiency SE was 0.85 W/A, and the operating current at an optical power of 150 mW was 186.5 mA (at an ambient temperature of 25° C.). Moreover, the COD (catastrophic optical destruction) level was not smaller than 200 mW. Thus, a semiconductor laser element, which has a low threshold value and a high power bearing comparison with those of the semiconductor laser of the buried ridge structure, is achievable. Furthermore, stable operation for the duration of not shorter than 1000 hours was able to be confirmed by a reliability test at 85° C. and 120 mW using the semiconductor laser element of this eleventh embodiment, and it was discovered that the element had sufficient reliability for infrared communication uses.

Twelfth Embodiment

Figure 27:
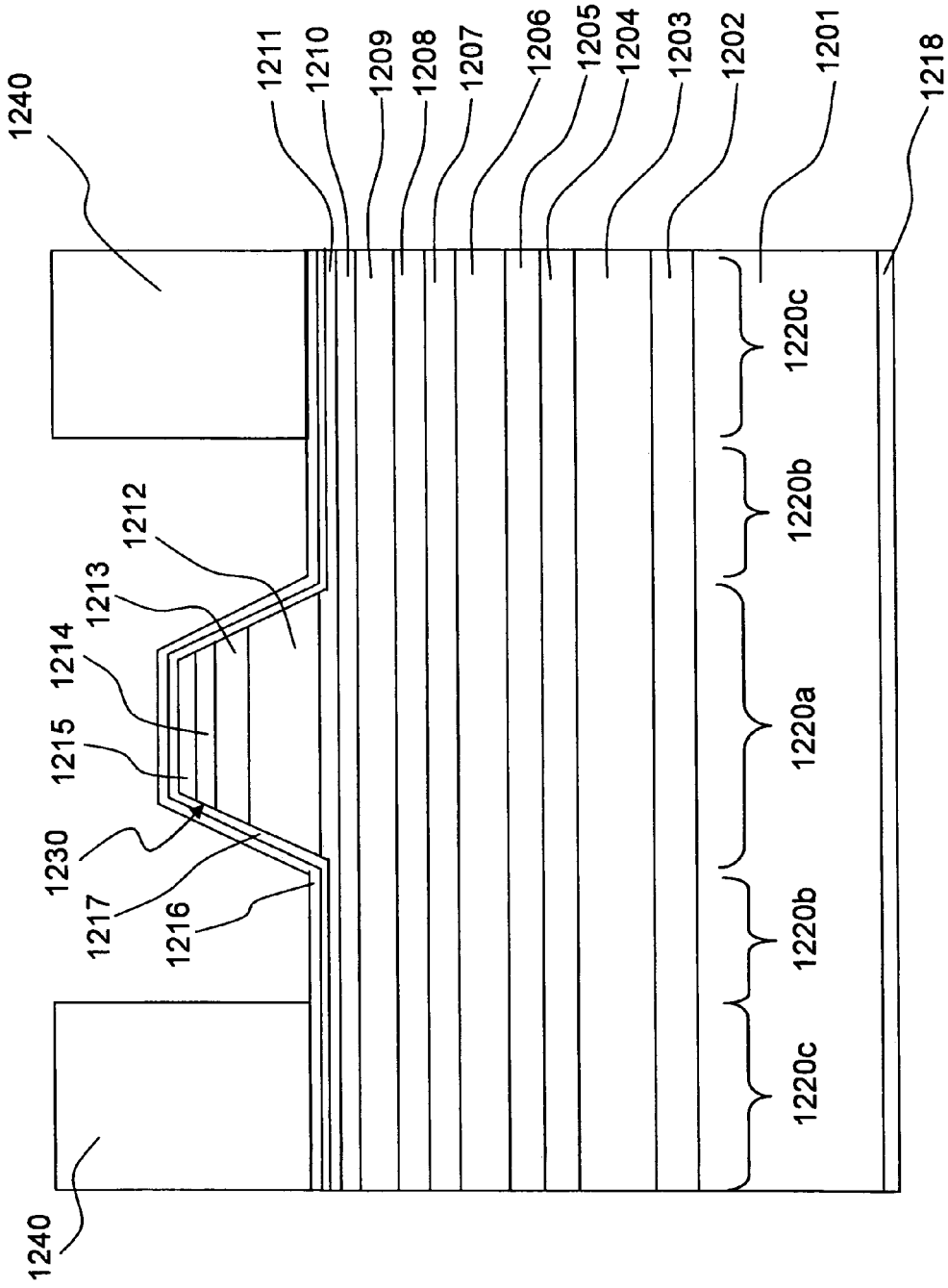
FIG. 27 is a schematic sectional view of a semiconductor laser element according to a twelfth embodiment of the present invention, showing a section perpendicular to the stripe direction of the laser element.

FIG. 27 shows the structure of a semiconductor laser element of a twelfth embodiment of the present invention, which is a preferred modification (a first modification) of the semiconductor laser element of the eleventh embodiment.

The semiconductor laser element of the twelfth embodiment shown in FIG. 27 is characterized in having, in addition to the above-described features of the semiconductor laser element of the eleventh embodiment, stripe-shaped structures 1240 made of a conductor in stripe-shaped structure formation regions 1220c on both sides of the ridge structure 1230, the stripe-shaped structures 1240 being formed by the gold plating method. The stripe-shaped structures 1240 are similar to the stripe-shaped structures 232 of the fifth embodiment shown in FIG. 13.

Figure 28:
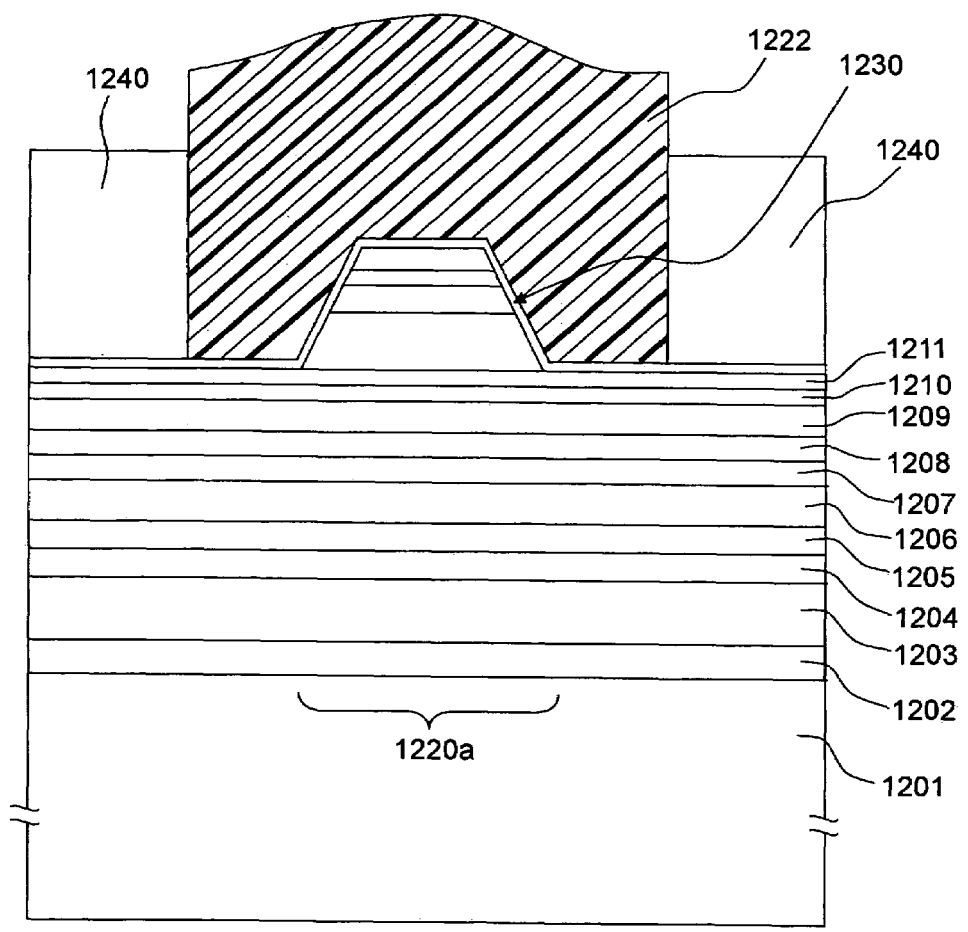
FIG. 28 is a schematic sectional view for explaining a manufacturing process step of the semiconductor laser element of the twelfth embodiment.

A manufacturing process of the semiconductor laser element of the twelfth embodiment is the same as that of the eleventh embodiment until after the formation of the p-side electrode 1216. Subsequently, as shown in FIG. 28, outside of the stripe-shaped structure formation regions 1220c is masked with a photoresist 1222, prior to the substrate etching process, and the stripe-shaped structures 1240 of which the uppermost portion is higher than the uppermost portion of the ridge structure 1230 are formed by the gold electroplating method using the p-side electrode 1216 as a feeding metal. At this time, the height of the stripe-shaped structures 1240 is set to 2.5 µm, so that the uppermost portion of the stripe-shaped structure 1230 is higher than the height (1.63 µm) of the uppermost portion of the ridge structure 1230. After the plating ends, the photoresist 1222 is removed.

Subsequently, steps of substrate etching and n-side electrode deposition and alloying are carried out, and then division into chips of a desired size is carried out.

In the subsequent process step of the twelfth embodiment, similarly to the fifth embodiment, the junction down mounting is carried out using the uppermost surface (the top surface) of each stripe-shaped structure 1240 as the bonding surface to a stem that is an example of the support.

The effects and advantages peculiar to the stripe-shaped structures and the effects and advantages peculiar to the junction down mounting are as described in connection with the fifth embodiment. Moreover, it may easily be understood that all the matters described in connection with the stripe-shaped structure in the fifth embodiment are true with this twelfth embodiment.

In the manufacturing process of the semiconductor laser element of the eleventh embodiment, the chip division is carried out so as to offset the ridge structure from the center of the chip so that wire bonding is facilitated. In contrast, in this twelfth embodiment, there is no need to form the ridge structure in an offset manner since no wire bonding is carried out on any side of the ridge structure 1230. Preferably, in this embodiment, the ridge structure should be located at the center of the chip so that a force is evenly applied to the two stripe-shaped ridge structures located on both sides of the ridge structure in the mounting stage.

Thirteenth Embodiment

Figure 29:
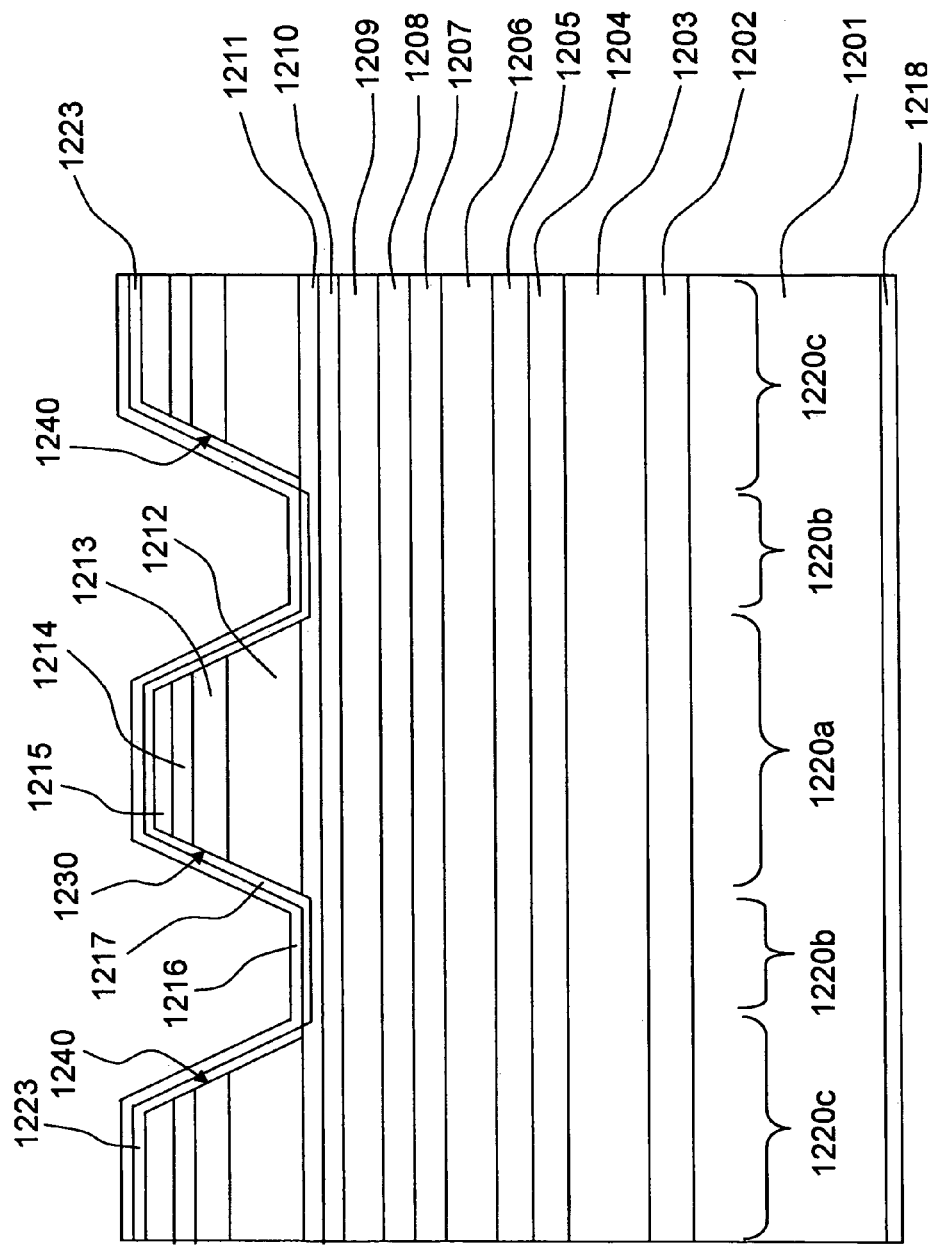
FIG. 29 is a schematic sectional view of a semiconductor laser element according to a thirteenth embodiment of the present invention, showing a section perpendicular to the stripe direction of the laser element.
Figure 30:
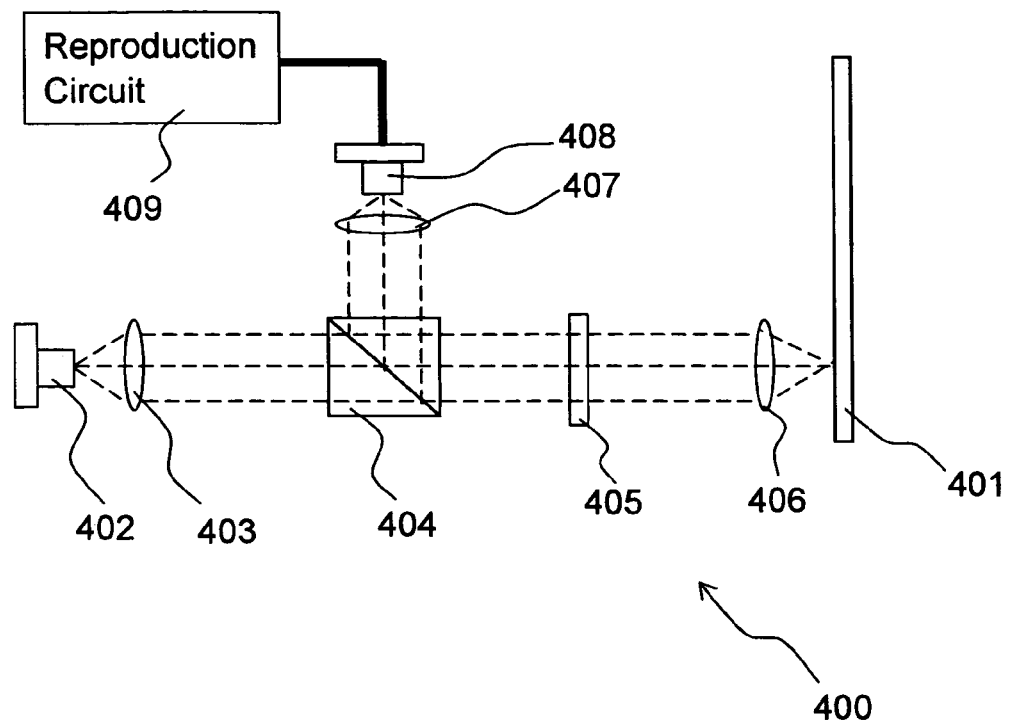
FIG. 30 is a schematic diagram of an optical disk apparatus according to a fourteenth embodiment of the present invention.

FIG. 29 shows the structure of a semiconductor laser element of a thirteenth embodiment of the present invention, which is another preferred modification (a second modification) of the semiconductor laser element of the eleventh embodiment appropriate for the junction down mounting.

The semiconductor laser element of this thirteenth embodiment has the same semiconductor layers as those of the ridge structure 1230, namely, p-$Al_{0.5}Ga_{0.5}As$ third upper cladding layer 1212, p-GaAs contact layer 1213, p$^+$-$In_xGa_{1-x}As$ graded layer 1214 (x=0→0.5) and p$^+$-$In_{0.5}Ga_{0.5}As$ contact layer 1215. Moreover, an insulator 1223 made of silicon nitride ($SiN_x$) is formed to a thickness of 2000 Å on the periphery of the semiconductor layers, and a p-side electrode 1216 is further provided on the insulator 1223. This provides a construction in which the stripe-shaped structures 1240 are formed in the stripe-shaped ridge structure formation regions 1220c located on both sides of the ridge structure 1230. This stripe-shaped structure 1240 has its uppermost portion higher than the uppermost portion of the ridge structure 1230 by the thickness of the insulator 1223.

In the junction down mounting process, the uppermost (top) side of each stripe-shaped structure 240 is used as the bonding surface and die-bonded to a heat sink called the submount that serves as one example of the support. By further mounting the chip, which has been mounted on the submount in the junction down manner, to a stem, the semiconductor laser element of the thirteenth embodiment is completed.

The effects peculiar to the junction down mounting method have been described in connection with the fifth embodiment.

Moreover, in the thirteenth embodiment, an insulator is inserted in the interface between the semiconductor layers that constitute the stripe-shaped structure and the p-side electrode, similarly to the eighth embodiment. Particular functions and effects obtained from this construction are as described in connection with the eighth embodiment. Moreover, it can easily be understood that all the matters or features described in connection with the stripe-shaped structure and the insulator that covers the structure in the eighth embodiment are also true with this thirteenth embodiment.

Moreover, the components of each of the aforementioned embodiments can be mutually interchanged.

Fourteenth Embodiment

FIG. 9 is a view showing an example of the structure of an optical disk apparatus according to the present invention. This optical disk apparatus operates to write data on an optical disk 401 and reproduce data written on the optical disk. In this optical disk apparatus, a semiconductor laser device (of the 780 nm band) 402 of any one of the first to third and ninth to tenth embodiments is included as a light-emitting device for use in those operations.

This optical disk apparatus will be described in more detail. In this optical disk apparatus, for write operations, signal light emitted from the semiconductor laser device 402 passes through a collimator lens 403, becoming parallel light, and is transmitted by a beam splitter 404. Then, after its polarized state is adjusted by a λ/4 polarizer 405, the signal light is converged by an irradiation objective lens 406 to thereby irradiate the optical disk 401. For read operations, a laser beam with no data signal superimposed on the laser beam travels along the same path as in the write operation, irradiating the optical disk 401. Then, the laser beam reflected by the surface of the optical disk 401, on which data has been recorded, passes through the laser-beam irradiation objective lens 406 and the λ/4 polarizer 405, and is thereafter reflected by the beam splitter 404 so as for its traveling direction to be changed by 90°. Subsequently, the laser beam is focused by a reproduction-light objective lens 407 and applied to a signal-detection use photodetector device 408. Then, in the signal-detection use photodetector device 408, a data signal read from the optical disk 401 is transformed into an electric signal according to the intensity of the incident laser beam, and reproduced to the original information signal by a signal-light reproduction circuit 409.

The optical disk apparatus employs the semiconductor laser device that operates with higher optical power than conventional. Therefore, data read and write operations are implementable even if the rotational speed of the optical disk is increased to be higher than conventional. Accordingly, the access time to optical disks, which has hitherto mattered particularly in write operations, can be reduced to a large extent. This makes it feasible to provide an optical disk apparatus which allows more comfortable manipulation.

This embodiment has been described on a case where the semiconductor laser device according to any one of the first to third and ninth to tenth embodiments is applied to a recording and playback type optical disk apparatus. However, needless to say, the semiconductor laser device of this invention is applicable also to optical-disk recording apparatuses or optical-disk playback apparatuses using the 780 nm wavelength band and also to optical disk apparatuses using other bands (For example, the 650 nm band, in which case the fourth or fifth embodiment is usable.).

Fifteenth Embodiment

Figure 31:
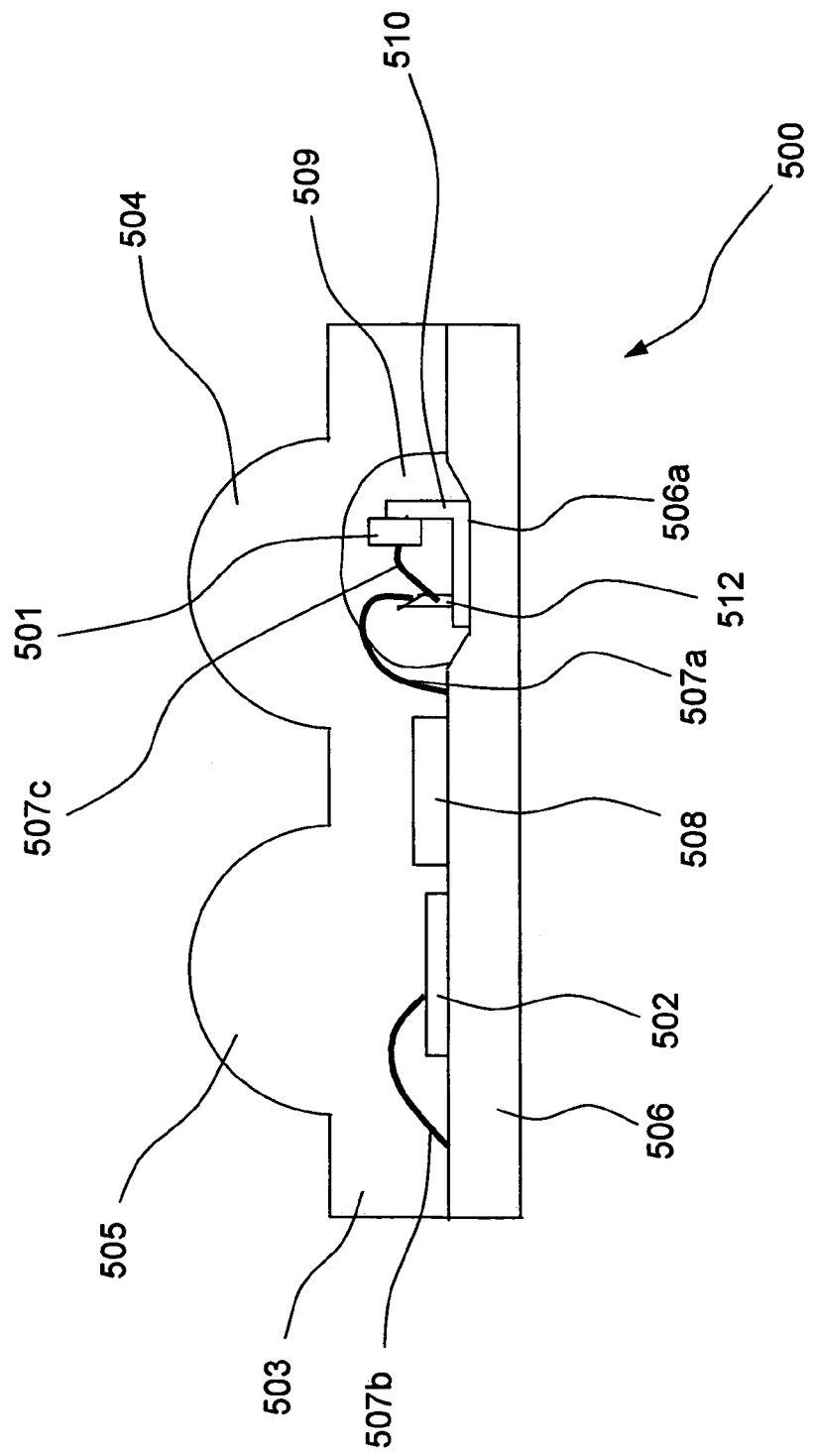
FIG. 31 is a schematic view of an optical transmission module for use in an optical transmission system according to a fifteenth embodiment of the present invention.
Figure 32:
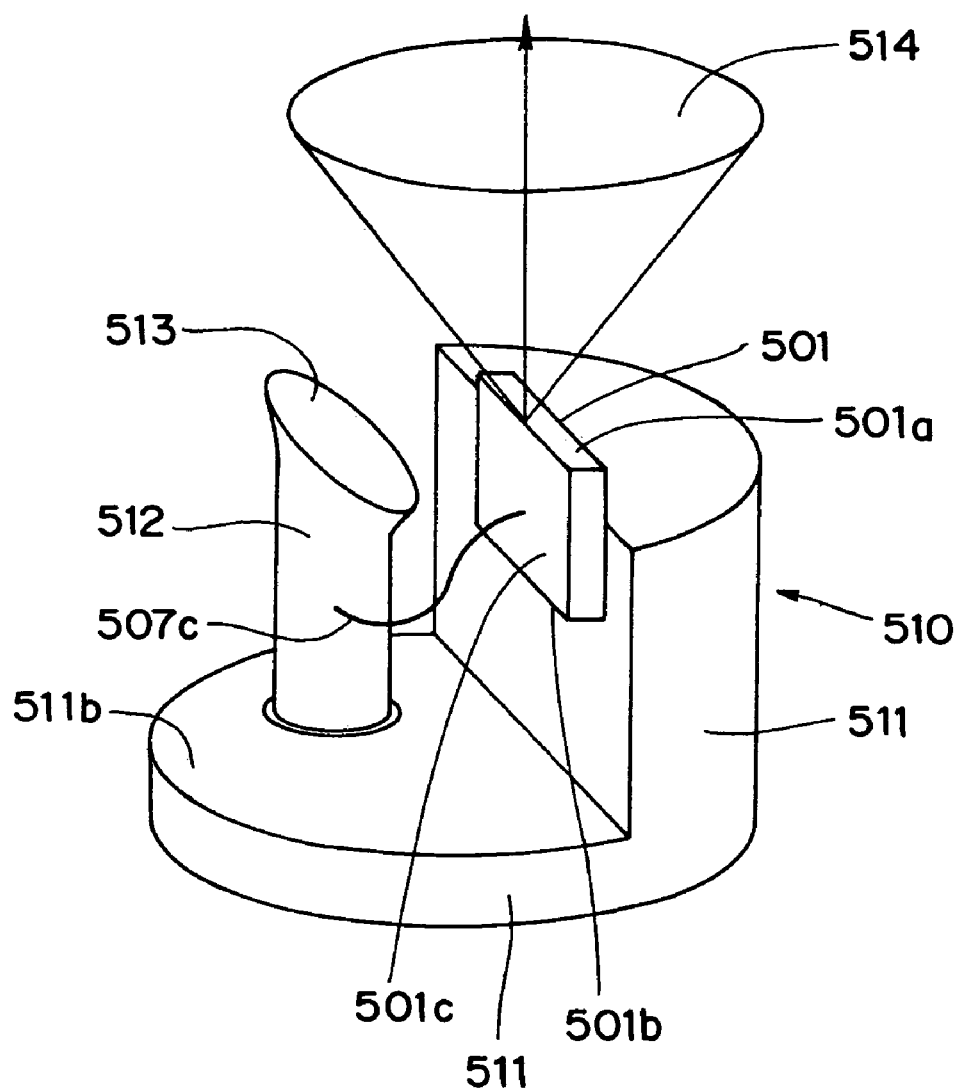
FIG. 32 is a perspective view of a laser mount of the above optical transmission system.

FIG. 31 is a sectional view showing an optical transmission module 500 used for an optical transmission system of a fifteenth embodiment of the present invention. FIG. 32 is a perspective view showing a light source. In this fifteenth embodiment, the InGaAs based semiconductor laser element (laser chip) 501 of the emission wavelength of 890 nm described in connection with the sixth, seventh or eleventh embodiment is employed as the light source, and a silicon (Si) pin photodiode is employed as a photodetector 502. By providing the same optical transmission modules 500 on both sides (e.g., a terminal and a server) that exchange communications, an optical transmission system for transmitting and receiving an optical signal between the optical transmission modules 500 is constituted, and the detail will be described later.

In FIG. 31, a circuit board 506 has patterns of both positive and negative electrodes for driving the semiconductor laser, and a recess portion 506a of a depth of 300 μm which is provided in a position in which the laser chip is mounted, as illustrated. A laser mount (mounting member) on which the laser chip 501 is mounted is fixed to this recess portion 506a with solder. A flat portion 513 of a positive electrode 512 of the laser mount 510 is electrically connected to a laser driving positive electrode portion (not shown) on the circuit board 506 via a wire 507a. The recess portion 506a has a depth such that the emission of laser light is not disturbed. Also, the recess portion 506 is structured such that surface roughness is prevented from influencing the angle of radiation.

The photodetector 502 is also mounted on the circuit board 506, and an electrical signal is taken out via a wire 507b. Besides this, an IC circuit 508 for laser driving/reception signal processing use is mounted on the circuit board 506.

A proper amount of liquid silicon resin 509 is dripped by a proper quantity to the portion where the laser mount 510 is disposed, fixed to the recess portion 506a with solder. A filler for scattering light is mixed in the silicon resin 509. The silicon resin 509 stays inside the recess portion 506a due to surface tension to cover the laser mount 510 and fixes the same to the recess portion 506a. Although the recess portion 506a is provided to mount the laser mount 510 on the circuit board 506 in this fifteenth embodiment, the recess portion 506a is not always required to be provided since the silicon resin 509 stays on the laser chip peripheral surface and its neighborhood due to the surface tension, as described above.

Subsequently, the thus obtained assembly is heated at 80° C. for about five minutes until the silicon resin is hardened into a jelly form. Next, the assembly is covered with a transparent epoxy resin mold 503. A lens portion 504 for controlling the angle of radiation is formed above the laser chip 501, and a lens portion 505 for condensing the signal light is formed above the photodetector 502 in the form of integrated mold lenses.

Next, the laser mount 510 will be described with reference to FIG. 32. As shown in FIG. 32, the laser element 501 is die-bonded to an L-figured heat sink 511 using an In paste. The laser chip 501 is the InGaAs based semiconductor laser element described in connection with the sixth, seventh or eleventh embodiment, and a laser chip lower surface 501b is coated with a high reflectance film. On the other hand, a laser chip upper surface 501a is coated with a low reflectance film. These reflection films also function as protectors for the end surfaces of the laser chip as well.

A positive electrode 512 is fixed to a base portion 511b of the heat sink 511 via an insulator so as not to have continuity to the heat sink 511. The positive electrode 512 and an electrode region 501c, of the laser chip 501, on the Schottky junction portion are connected to each other via a gold wire 507c. The laser mount 510 is soldered to a negative electrode (not shown) of the circuit board 506 in FIG. 31, and an upper flat portion 513 of the positive electrode 512 and the positive electrode portion (not shown) of the circuit board 506 are connected to each other via a wire 507a. With the wiring, the optical transmission module 500 capable of obtaining a laser beam 514 by oscillation is completed.

The optical transmission module 500 of this fifteenth embodiment employs the aforementioned semiconductor laser element that requires only one-time crystal growth process and can be manufactured at low cost. Accordingly, the optical transmission module 500 is able to remarkably suppress the unit price of the module than in the conventional case requiring crystal regrowth processes.

It is to be noted that not only the semiconductor laser element of the sixth, seventh or eleventh embodiment described hereinabove but also the semiconductor laser element of the eighth, twelfth or thirteenth embodiment can also be used as the light source (laser chip) of the optical transmission module 500. In the latter case, because the laser chip 501 is mounted on the heat sink 511 in the junction down manner, the patterns of both the positive and negative electrodes on the circuit board 506 should be changed such that connection of the positive electrode and the negative electrode is reverse to that of the aforementioned embodiment.

It becomes possible to effectively radiate heat during laser oscillation by using the semiconductor laser element of the eighth, twelfth or thirteenth embodiment, and therefore, an optical transmission module having more excellent reliability can be provided.

Figure 33:
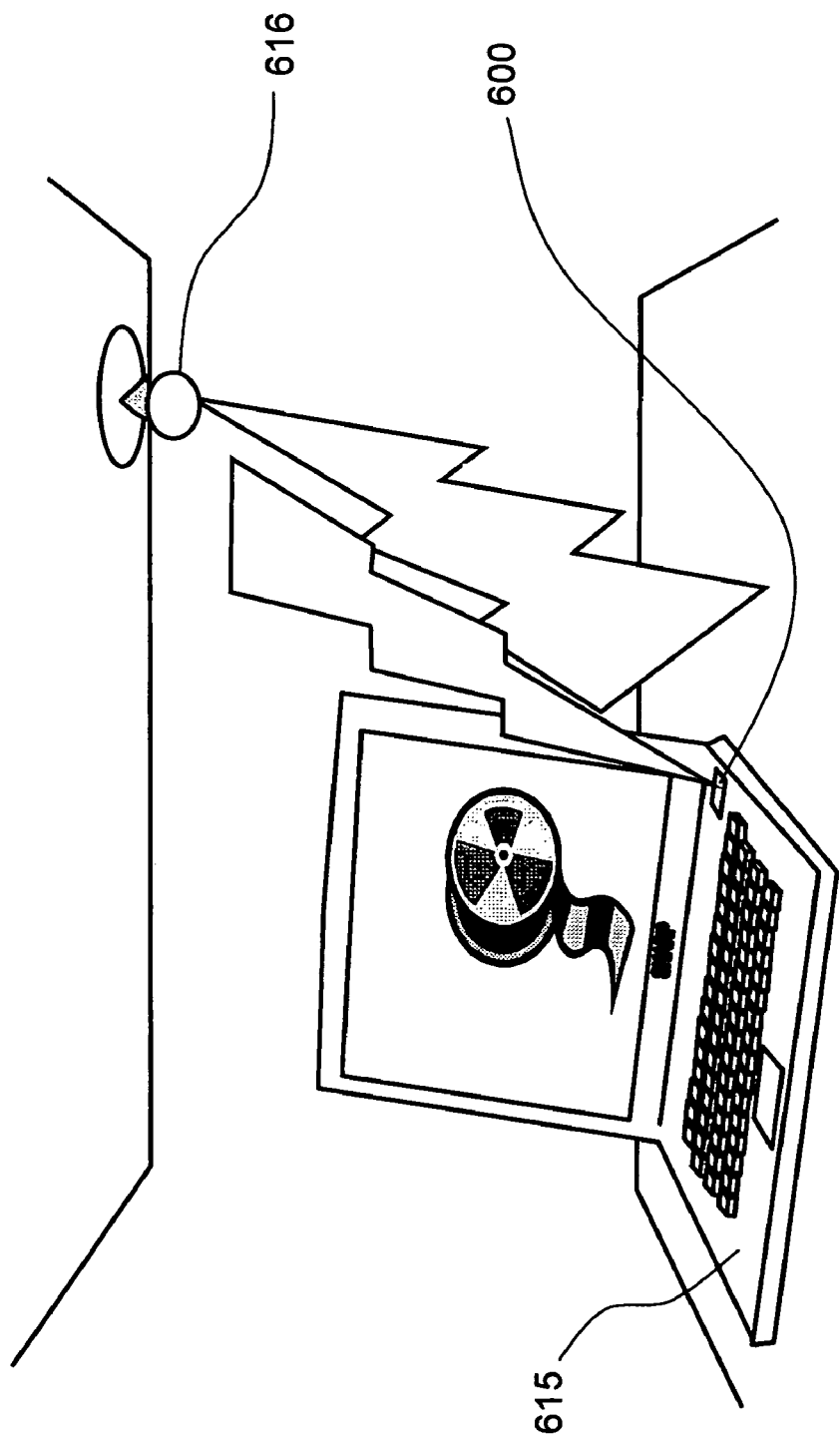
FIG. 33 is a schematic view showing an exemplary arrangement of the optical transmission system of the present invention.
Figure 34:
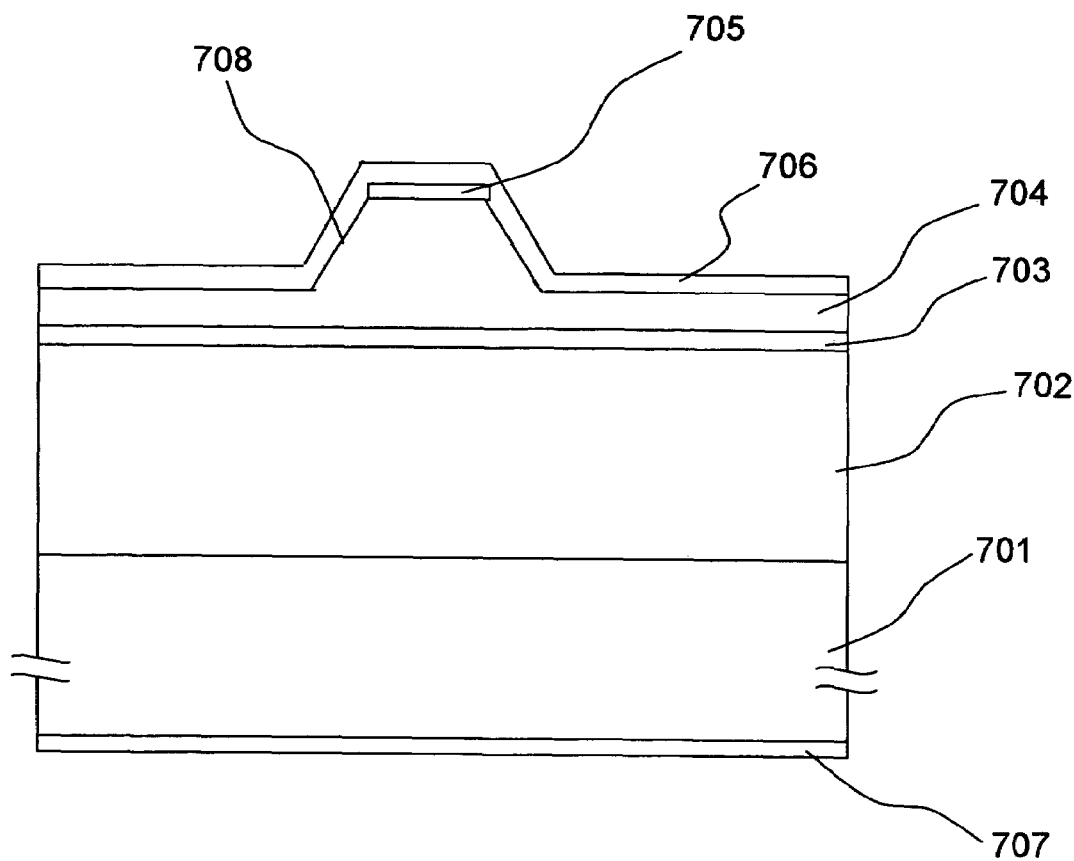
FIG. 34 is a schematic sectional view of a conventional semiconductor laser element.

As described above, by providing the same optical transmission modules 500 on both parties that exchange communications, the optical transmission system for transmitting and receiving the optical signal between the optical transmission modules 500 of both the parties is constituted. FIG. 33 shows an exemplary structure of an optical transmission system that employs the optical transmission modules 500. This optical transmission system is provided with the optical transmission module 500 in a base station 616 installed on the ceiling of a room and is also provided with the same optical transmission module (denoted by reference numeral 600 for distinction) in a personal computer 615. An optical signal containing information transmitted from the light source of the optical transmission module 600 on the personal computer 615 side is received by the photodetector of the optical transmission module 500 located on the base station 616 side. Moreover, an optical signal transmitted from the light source of the optical transmission module 500 on the base station 616 side is received by the photodetector of the optical transmission module 600 on the personal computer 615 side. Data communications is achieved by light (infrared rays) in this way.

The semiconductor laser device, the optical disk apparatus and the optical transmission system of the present invention are not limited only to the aforementioned illustrated examples. For example, it is a matter of course that the present invention can be modified in a variety of ways with regard to, for example, the layer thickness and the number of the well layers and the barrier layers within a range not departing from the scope of the present invention.

For example, although the Pt/Ti/Pt/Au is used as the p-side electrode in some embodiments and Ti/Pt/Au is used in the other embodiments, these materials may be interchanged.

Moreover, although the first-conductivity-type is the n-type and the second-conductivity-type is the p-type in each of the aforementioned embodiments, it is acceptable to set the first-conductivity-type as the p-type and set the second-conductivity-type as the n-type.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser element comprising:
   a semiconductor substrate of first conductivity type;
   a lower cladding layer of first conductivity type, an active layer, a first upper cladding layer of second conductivity type, and a second upper cladding layer of second conductivity type, which are stacked in this order on the semiconductor substrate;
   a third upper cladding layer of second conductivity type and a contact layer of second conductivity type, which are formed directly or via a semiconductor layer of second conductivity type on the second upper cladding layer and constitute a stripe-shaped ridge structure; and
   an electrode layer, wherein
   a second-conductivity-type doping concentration of the second upper cladding layer is lower than second-conductivity-type doping concentrations of the first upper cladding layer and the third upper cladding layer and is not higher than $1 \times 10^{17}$ cm$^{-3}$;
   a sum total of a layer thickness of the first upper cladding layer and a layer thickness of the second upper cladding layer is 0.3 m-1.5 µm, inclusive, and
   the electrode layer forms an ohmic junction with the contact layer, and the electrode layer forms a Schottky junction with at least part of the second upper cladding layer located beside the ridge structure when the electrode layer is directly formed on the second upper cladding layer, and when the electrode layer is formed on the second upper cladding layer via the semiconductor layer of second conductivity type, the electrode layer forms a Schottky junction with at least part of the semiconductor layer of second conductivity type located beside the ridge structure.

2. The semiconductor laser element as claimed in claim 1, wherein
   the semiconductor layer of second conductivity type is constructed of a material over which the third upper cladding layer and the contact layer are selectively etchable,
   the semiconductor layer of second conductivity type has a second-conductivity-type doping concentration lower than second-conductivity-type doping concentrations of the first upper cladding layer and the third upper cladding layer, and
   the electrode layer forms the Schottky junction with the semiconductor layer of second conductivity type.

3. The semiconductor laser element as claimed in claim 1, wherein
   the ridge structure has a cross section of a forward mesa shape, and
   the electrode layer continuously covers a top and side surfaces of the ridge structure and an upper surface of either the second upper cladding layer or the semiconductor layer of second conductivity type.

4. The semiconductor laser element as claimed in claim 3, wherein
   a metal wire for obtaining electrical connection to an external circuit is bonded to only a portion of the electrode layer at which the electrode layer forms the Schottky junction with the second upper cladding layer or the semiconductor layer of second conductivity type.

5. The semiconductor laser element as claimed in claim 1, wherein
   the semiconductor substrate of first conductivity type is made of n-type doped GaAs, and second-conductivity-type dopants for the first upper cladding layer, the second upper cladding layer, the third upper cladding layer, the contact layer and the semiconductor layer comprise carbon or magnesium.

6. The semiconductor laser element as claimed in claim 1, wherein
   a crystalline material that constitutes the substrate comprises GaAs, and
   crystalline materials that constitute the first upper cladding layer, the second upper cladding layer and the third upper cladding layer, respectively, comprise AlGaAs.

7. The semiconductor laser element as claimed in claim 1, wherein
   crystalline materials that constitute the first upper cladding layer and the second upper cladding layer, respectively, comprise $Al_xGa_{1-x}As$, and a mole fraction x of Al in $Al_xGa_{1-x}As$ is $0.4 \leq x \leq 0.55$.

8. The semiconductor laser element as claimed in claim 1, wherein
   the thickness of the second upper cladding layer is 0.1 µm-0.4 µm, inclusive.

9. The semiconductor laser element as claimed in claim 1, wherein
the second-conductivity-type doping concentration of the second upper cladding layer is $1 \times 10^{16}$ cm$^{-3}$-$1 \times 10^{17}$ cm$^{-3}$, inclusive.

10. The semiconductor laser element as claimed in claim 1, wherein
the thickness of the first upper cladding layer is 0.2 μm-1.1 μm, inclusive.

11. The semiconductor laser element as claimed in claim 1, wherein
the second-conductivity-type doping concentration of the first upper cladding layer is not lower than $1 \times 10^{17}$ cm$^{-3}$.

12. The semiconductor laser element as claimed in claim 2, wherein
a crystalline material that constitutes the semiconductor layer of second conductivity type contains P.

13. The semiconductor laser element as claimed in claim 2, wherein
a crystalline material that constitutes the semiconductor layer of second conductivity type is $In_{1-x}Ga_xAs_{1-y}P_y$, and its P mole fraction y is $0.4 \leq y \leq 0.7$.

14. The semiconductor laser element as claimed in claim 2, wherein
a crystalline material that constitutes the semiconductor layer of second conductivity type is InGaAsP, which has a thickness of not smaller than 50 Å and a second-conductivity-type doping concentration of $1 \times 10^{16}$ cm$^{-3}$-$1 \times 10^{17}$ cm$^{-3}$, inclusive.

15. The semiconductor laser element as claimed in claim 1, wherein
the electrode layer has a Pt layer as a lowermost layer, and the Pt layer has a thickness of 30 Å-400 Å, inclusive.

16. The semiconductor laser element as claimed in claim 1, wherein
an insulator is provided in a stripe shape along each of opposite sides of the ridge structure in a position surrounded by a side surface of the ridge structure, an upper surface of either the second upper cladding layer or the semiconductor layer of second conductivity type, and the electrode layer.

17. The semiconductor laser element as claimed in claim 1, wherein
a stripe-shaped structure whose uppermost portion is higher than an uppermost portion of the ridge structure is provided on each of opposite sides of the ridge structure.

18. The semiconductor laser element as claimed in claim 17, wherein
the uppermost portion side of the stripe-shaped structure defines a bonding surface.

19. The semiconductor laser element as claimed in claim 17, wherein
the stripe-shaped structure has a third upper cladding layer, a contact layer, and a current cutoff layer whose second-conductivity-type doping concentration is not higher than $1 \times 10^{17}$ cm$^{-3}$, which layers are stacked in this order on the second upper cladding layer;
the electrode layer covers the stripe-shaped structure, and
the electrode layer forms a Schottky junction with the current cutoff layer of the stripe-shaped structure.

20. The semiconductor laser element as claimed in claim 17, wherein
the stripe-shaped structure comprises a conductor formed on the electrode layer.

21. The semiconductor laser element as claimed in claim 20, wherein
the conductor is gold or an alloy that contains gold.

22. The semiconductor laser element as claimed in claim 17, wherein
the stripe-shaped structure has a stack of semiconductor layers identical to that of the ridge structure, and an insulator formed on a periphery of the stack of semiconductor layers, and
the electrode layer is formed so as to cover the insulator.

23. The semiconductor laser element as claimed in claim 22, wherein
the insulator is silicon oxide or silicon nitride.

24. An optical disk apparatus having a semiconductor laser element as a light emitting device, said semiconductor laser element comprising:
a semiconductor substrate of first conductivity type;
a lower cladding layer of first conductivity type, an active layer, a first upper cladding layer of second conductivity type, and a second upper cladding layer of second conductivity type, which are stacked in this order on the semiconductor substrate;
a third upper cladding layer of second conductivity type and a contact layer of second conductivity type, which are formed directly or via a semiconductor layer of second conductivity type on the second upper cladding layer and constitute a stripe-shaped ridge structure; and
an electrode layer, wherein
a second-conductivity-type doping concentration of the second upper cladding layer is lower than second-conductivity-type doping concentrations of the first upper cladding layer and the third upper cladding layer and is not higher than $1 \times 10^{17}$ cm$^{-3}$;
a sum total of a layer thickness of the first upper cladding layer and a layer thickness of the second upper cladding layer is 0.3 μm-1.5 μm, inclusive, and
the electrode layer forms an ohmic junction with the contact layer, and the electrode layer forms a Schottky junction with at least part of the second upper cladding layer located beside the ridge structure when the electrode layer is directly formed on the second upper cladding layer, and when the electrode layer is formed on the second upper cladding layer via the semiconductor layer of second conductivity type, the electrode layer forms a Schottky junction with at least part of the semiconductor layer of second conductivity type located beside the ridge structure.

25. An optical transmission system having a semiconductor laser element as a light source, said semiconductor laser element comprising:
a semiconductor substrate of first conductivity type;
a lower cladding layer of first conductivity type, an active layer, a first upper cladding layer of second conductivity type, and a second upper cladding layer of second conductivity type, which are stacked in this order on the semiconductor substrate;
a third upper cladding layer of second conductivity type and a contact layer of second conductivity type, which are formed directly or via a semiconductor layer of second conductivity type on the second upper cladding layer and constitute a stripe-shaped ridge structure; and
an electrode layer, wherein
a second-conductivity-type doping concentration of the second upper cladding layer is lower than second-conductivity-type doping concentrations of the first upper cladding layer and the third upper cladding layer and is not higher than $1 \times 10^{17}$ cm$^{-3}$;
a sum total of a layer thickness of the first upper cladding layer and a layer thickness of the second upper cladding layer is 0.3 μm-1.5 μm, inclusive, and the electrode layer forms an ohmic junction with the contact layer, and the electrode layer forms a Schottky junction with at least part of the second upper cladding layer located beside the ridge structure when the electrode layer is directly formed on the second upper cladding layer, and when the electrode layer is formed on the second upper cladding layer via the semiconductor layer of second conductivity type, the electrode layer forms a Schottky junction with at least part of the semiconductor layer of second conductivity type located beside the ridge structure.

26. A semiconductor laser element comprising:

a substrate of first conductivity type, an active layer formed on the substrate of first conductivity type and a stack of semiconductor layers of second conductivity type formed on the active layer, wherein the stack of semiconductor layers of second conductivity type comprises at least a low-concentration semiconductor layer having a doping concentration of not higher than $1 \times 10^{17}$ cm$^{-3}$ and a high-concentration semiconductor layer having a doping concentration of not lower than $1 \times 10^{18}$ cm$^{-3}$, an electrode is formed on the stack of semiconductor layers of second conductivity type, a low concentration-side compound layer is formed at an interface between the electrode and the low-concentration semiconductor layer, said low concentration-side compound layer being comprised of at least one of constituent elements of the electrode and at least one of constituent elements of the low-concentration semiconductor layer, and a high concentration-side compound layer is formed at an interface between the electrode and the high-concentration semiconductor layer, said high concentration-side compound layer being comprised of at least one of the constituent elements of the electrode and at least one of constituent elements of the high-concentration semiconductor layer.

27. The semiconductor laser element as claimed in claim 26, wherein
the stack of semiconductor layers of second conductivity type comprises at least a semiconductor layer of second conductivity type that has a doping concentration of at least $1 \times 10^{17}$ cm$^{-3}$ between the low-concentration semiconductor layer and the active layer.

28. The semiconductor laser element as claimed in claim 26, wherein
the high-concentration semiconductor layer is provided in an uppermost portion of a ridge structure, and
the low-concentration semiconductor layer is provided at least in a region other than the uppermost portion of the ridge structure.

29. The semiconductor laser element as claimed in claim 26, wherein
the high-concentration semiconductor layer is made of GaAs or InGaAs.

30. The semiconductor laser element as claimed in claim 26, wherein
the low-concentration semiconductor layer is made of AlGaAs.

31. The semiconductor laser element as claimed in claim 26, wherein
the low-concentration semiconductor layer contains at least In and P.

32. The semiconductor laser element as claimed in claim 31, wherein
the low-concentration semiconductor layer is made of any one of InGaP, InGaAsP, InGaAlP or InAlAsP.

33. The semiconductor laser element as claimed in claim 26, wherein
C or Mg or Be is used as a dopant for the stack of semiconductor layers of second conductivity type.

34. The semiconductor laser element as claimed in claim 26, wherein
the low concentration-side compound layer has a thickness of smaller than 0.2 μm.

35. The semiconductor laser element as claimed in claim 26, wherein
the electrode consists of a multilayer metal thin film, and a lowermost layer of the multilayer metal thin film is comprised of a platinum group element or a platinum group element compound.

36. The semiconductor laser element as claimed in claim 26, wherein
the low concentration-side compound layer contains a platinum group element.

37. The semiconductor laser element as claimed in claim 26, wherein
the electrode consists of a multilayer metal thin film, and a lowermost layer of the multilayer metal thin film is made of Ti.

38. The semiconductor laser element as claimed in claim 26, wherein
the low concentration-side compound layer contains at least Ti.

39. The semiconductor laser element as claimed in claim 28, wherein
a stripe-shaped structure whose uppermost portion is higher than the uppermost portion of the ridge structure is provided on each of opposite sides of the ridge structure.

40. The semiconductor laser element as claimed in claim 39, wherein
the uppermost portion side of the stripe-shaped structure defines a bonding surface.

41. The semiconductor laser element as claimed in claim 39, wherein
the low-concentration semiconductor layer is provided in the uppermost portion of the stripe-shaped structure.

42. The semiconductor laser element as claimed in claim 41, wherein
the low-concentration semiconductor layer provided in the uppermost portion of the stripe-shaped structure is made of InGaP or InGaAsP.

43. The semiconductor laser element as claimed in claim 39, wherein
the stripe-shaped structure is comprised of a conductor.

44. The semiconductor laser element as claimed in claim 43, wherein
the conductor is made of gold or an alloy that contains gold.

45. The semiconductor laser element as claimed in claim 39, wherein
an insulator is formed so as to cover the stripe-shaped structure, and
part of the electrode is formed on the insulator.

46. An optical disk apparatus having a semiconductor laser element as a light emitting device, said semiconductor laser element comprising:
a substrate of first conductivity type, an active layer formed on the substrate of first conductivity type and a stack of semiconductor layers of second conductivity type formed on the active layer, wherein the stack of semiconductor layers of second conductivity type comprises at least a low-concentration semiconductor layer having a doping concentration of not higher than $1\times10^{17}$ cm$^{-3}$ and a high-concentration semiconductor layer having a doping concentration of not lower than $1\times10^{18}$ cm$^{-3}$, an electrode is formed on the stack of semiconductor layers of second conductivity type, a low concentration-side compound layer is toned at an interface between the electrode and the low-concentration semiconductor layer, said low concentration-side compound layer being comprised of at least one of constituent elements of the electrode and at least one of constituent elements of the low-concentration semiconductor layer, and a high concentration-side compound layer is formed at an interface between the electrode and the high-concentration semiconductor layer, said high concentration-side compound layer being comprised of at least one of the constituent elements of the electrode and at least one of constituent elements of the high-concentration semiconductor layer.

47. An optical transmission system having a semiconductor laser element as a light source, said semiconductor laser element comprising:

a substrate of first conductivity type, an active layer formed on the substrate of first conductivity type and a stack of semiconductor layers of second conductivity type formed on the active layer, wherein the stack of semiconductor layers of second conductivity type comprises at least a low-concentration semiconductor layer having a doping concentration of not higher than $1\times10^{17}$ cm$^{-3}$ and a high-concentration semiconductor layer having a doping concentration of not lower than $1\times10^{18}$ cm$^{-3}$, an electrode is formed on the stack of semiconductor layers of second conductivity type, a low concentration-side compound layer is formed at an interface between the electrode and the low-concentration semiconductor layer, said low concentration-side compound layer being comprised of at least one of constituent elements of the electrode and at least one of constituent elements of the low-concentration semiconductor layer, and a high concentration-side compound layer is formed at an interface between the electrode and the high-concentration semiconductor layer, said high concentration-side compound layer being comprised of at least one of the constituent elements of the electrode and at least one of constituent elements of the high-concentration semiconductor layer.

* * * * *